United States Patent
Choi et al.

(10) Patent No.: US 12,550,445 B2
(45) Date of Patent: Feb. 10, 2026

(54) DISPLAY DEVICE INCLUDING A WIRING PAD AND METHOD FOR MANUFACTURING THE SAME

(71) Applicant: SAMSUNG DISPLAY CO., LTD., Yongin-si (KR)

(72) Inventors: Ji Woong Choi, Gwangmyeong-si (KR); Han Bum Kwon, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 609 days.

(21) Appl. No.: 18/055,403

(22) Filed: Nov. 14, 2022

(65) Prior Publication Data

US 2023/0207573 A1    Jun. 29, 2023

(30) Foreign Application Priority Data

Dec. 27, 2021    (KR) .................. 10-2021-0188463

(51) Int. Cl.
*H10D 86/60* (2025.01)
*H01L 23/00* (2006.01)
(Continued)

(52) U.S. Cl.
CPC ............. *H10D 86/60* (2025.01); *H01L 24/05* (2013.01); *H01L 24/13* (2013.01); *H01L 24/29* (2013.01);
(Continued)

(58) Field of Classification Search
CPC ...... H10D 86/60; H10D 86/441; H01L 24/05; H01L 24/13; H01L 24/29; H01L 24/73;
(Continued)

(56) References Cited

U.S. PATENT DOCUMENTS

| | | |
|---|---|---|
| 7,936,432 B2 | 5/2011 | Kim et al. |
| 10,403,689 B2 | 9/2019 | Park et al. |

(Continued)

FOREIGN PATENT DOCUMENTS

| | | |
|---|---|---|
| KR | 10-2011-0046887 | 5/2011 |
| KR | 10-1178909 | 9/2012 |

(Continued)

*Primary Examiner* — Douglas W Owens
(74) *Attorney, Agent, or Firm* — F. CHAU & ASSOCIATES, LLC

(57) ABSTRACT

A display includes a wiring pad and a dummy pad on a first substrate. A first planarization layer is disposed on the wiring pad and the dummy pad. A first pad electrode layer is connected to the wiring pad and a second pad electrode layer is connected to the dummy pad. The first and second pad electrode layers are disposed on the first planarization layer. A first insulating layer covers the first and second pad electrode layers. A first pad electrode upper layer is disposed on the first pad electrode layer. A second pad electrode upper layer is disposed on the second pad electrode layer. The wiring pad, the first pad electrode layer, and the first pad electrode upper layer are electrically connected. The dummy pad, the second pad electrode layer, and the second pad electrode upper layer are electrically connected.

15 Claims, 31 Drawing Sheets

(51) Int. Cl.
*H01L 25/16* (2023.01)
*H10D 86/40* (2025.01)

(52) U.S. Cl.
CPC ............ *H01L 24/73* (2013.01); *H01L 25/167* (2013.01); *H10D 86/441* (2025.01); *H01L 24/16* (2013.01); *H01L 24/32* (2013.01); *H01L 24/81* (2013.01); *H01L 24/83* (2013.01); *H01L 2224/05022* (2013.01); *H01L 2224/05073* (2013.01); *H01L 2224/05562* (2013.01); *H01L 2224/05573* (2013.01); *H01L 2224/13028* (2013.01); *H01L 2224/13144* (2013.01); *H01L 2224/13147* (2013.01); *H01L 2224/13155* (2013.01); *H01L 2224/13169* (2013.01); *H01L 2224/1357* (2013.01); *H01L 2224/1369* (2013.01); *H01L 2224/16225* (2013.01); *H01L 2224/2919* (2013.01); *H01L 2224/32058* (2013.01); *H01L 2224/32155* (2013.01); *H01L 2224/73153* (2013.01); *H01L 2224/73203* (2013.01); *H01L 2224/811* (2013.01); *H01L 2224/81201* (2013.01); *H01L 2224/81948* (2013.01); *H01L 2224/8388* (2013.01)

(58) Field of Classification Search
CPC ....... H01L 25/167; H01L 24/16; H01L 24/32; H01L 24/81; H01L 24/83; H01L 2224/05022; H01L 2224/05073; H01L 2224/05562; H01L 2224/05573; H01L 2224/13028; H01L 2224/13144; H01L 2224/13147; H01L 2224/13155; H01L 2224/13169; H01L 2224/1357; H01L 2224/1369; H01L 2224/16225; H01L 2224/2919; H01L 2224/32058; H01L 2224/32155; H01L 2224/73153; H01L 2224/73203; H01L 2224/811; H01L 2224/81201; H01L 2224/81948; H01L 2224/8388; H10H 20/0364; H10H 20/831; H10H 20/857

See application file for complete search history.

(56) References Cited

U.S. PATENT DOCUMENTS

| | | | |
|---|---|---|---|
| 11,543,722 B2* | 1/2023 | Obinata | G02F 1/134336 |
| 12,068,270 B2* | 8/2024 | Kim | H01L 23/14 |
| 2019/0355755 A1* | 11/2019 | Lee | G02F 1/1345 |
| 2021/0343659 A1* | 11/2021 | Kim | H01L 23/5389 |
| 2021/0399069 A1 | 12/2021 | Kim et al. | |

FOREIGN PATENT DOCUMENTS

| | | |
|---|---|---|
| KR | 10-1409286 | 6/2014 |
| KR | 20170080961 A | 7/2017 |
| KR | 10-2019-0041564 | 4/2019 |

* cited by examiner

DISPLAY DEVICE INCLUDING A WIRING PAD AND METHOD FOR MANUFACTURING THE SAME

CROSS-REFERENCE TO RELATED APPLICATION

This application claims priority under 35 U.S.C. § 119 to Korean Patent Application No. 10-2021-0188463, filed on Dec. 27, 2021 in the Korean Intellectual Property Office, the contents of which are herein incorporated by reference in its entirety.

TECHNICAL FIELD

The present disclosure relates to a display device and, more specifically, to a display device including a wiring pad and a method for manufacturing the same.

DISCUSSION OF THE RELATED ART

The importance of display devices has steadily increased with the development of multimedia technology. In response thereto, various types of display devices such as an organic light emitting diode (OLED) display, a liquid crystal display (LCD) and the like have been used.

A display device is a device for displaying an image. Modern display devices generally include a display panel, such as an organic light emitting diode display panel or a liquid crystal display panel. The light emitting display panel may include light emitting elements, e.g., light emitting diodes (LED), and examples of light emitting diodes include an organic light emitting diode (OLED) using an organic material as a light emitting material and an inorganic light emitting diode using an inorganic material as a light emitting material.

SUMMARY

A display device includes a wiring pad and a dummy pad disposed on a first substrate and spaced apart from each other. A first planarization layer is disposed on the wiring pad and the dummy pad. A first pad electrode base layer is connected to the wiring pad and a second pad electrode base layer is connected to the dummy pad. The first and second pad electrode base layers are disposed on the first planarization layer. A first insulating layer covers at least a portion of the first pad electrode base layer and the second pad electrode base layer. A first pad electrode upper layer is disposed on the first pad electrode base layer. A second pad electrode upper layer is disposed on the second pad electrode base layer. The wiring pad, the first pad electrode base layer, and the first pad electrode upper layer are electrically connected to one another. The dummy pad, the second pad electrode base layer, and the second pad electrode upper layer are electrically connected to one another.

The first planarization layer may include a first through hole exposing the wiring pad and a second through hole exposing the dummy pad. The first pad electrode base layer may be in contact with the wiring pad through the first through hole. The second pad electrode base layer may be in contact with the dummy pad through the second through hole.

The first insulating layer may include a first opening exposing at least a portion of the first pad electrode base layer and the second pad electrode base layer. The first pad electrode upper layer is in contact with the first pad electrode base layer through the first opening. The second pad electrode upper layer is in contact with the second pad electrode base layer through the first opening.

The wiring pad and the dummy pad may be spaced apart from each other in a first direction, may extend in a second direction intersecting the first direction, and may be disposed on a same layer as each other.

A width of the wiring pad in the first direction may be greater than a width of the dummy pad in the first direction.

The wiring pad, the first pad electrode base layer, and the first pad electrode upper layer may overlap each other and may extend in parallel to one another. The dummy pad, the second pad electrode base layer, and the second pad electrode upper layer may overlap each other and may extend in parallel to one another.

the display device may further include a second insulating layer disposed on the first pad electrode upper layer and the second pad electrode upper layer and including a pad opening exposing at least a portion of the first pad electrode upper layer and the second pad electrode upper layer.

At least a portion of the second insulating layer may be disposed directly on the first planarization layer, between the first pad electrode upper layer and the second pad electrode upper layer, and between the first pad electrode base layer and the second pad electrode base layer.

The display device may further include an external device disposed on the first substrate and including a plurality of circuit wires, a non-conductive layer disposed between the external device and the first substrate and bonding the external device to the first substrate, and a plurality of conductive balls disposed between the first pad electrode upper layer and the circuit wires, between the second pad electrode upper layer and the circuit wires.

The plurality of conductive balls may electrically connect the circuit wires to the first pad electrode upper layer and may electrically connect the circuit wires to the second pad electrode upper layer.

A display device includes a first substrate including a display area and a pad area. A wiring pad and a dummy pad are disposed on the pad area on the first substrate and are spaced apart from each other. A first planarization layer is disposed on the wiring pad and the dummy pad and is disposed on the display area and the pad area. A first electrode and a second electrode are disposed on the display area on the first planarization layer and are spaced apart from each other. A first pad electrode base layer and a second pad electrode base layer are disposed on the wiring pad and the dummy pad. A first insulating layer covers at least a portion of the first electrode, the second electrode, the first pad electrode base layer, and the second pad electrode base layer. A plurality of light emitting elements is disposed on the first insulating layer in the display area and have both ends thereof disposed on the first electrode and the second electrode, respectively. A second insulating layer is disposed on the plurality of light emitting elements in the display area. A first connection electrode and a second connection electrode are disposed on the first electrode and the second electrode, respectively. The first connection electrode is in contact with one end of the light emitting element, and the second connection electrode is in contact with the other end of the light emitting element. A first pad electrode upper layer is disposed on the first pad electrode base layer, and a second pad electrode upper layer is disposed on the second pad electrode base layer. The wiring pad, the first pad electrode base layer, and the first pad electrode upper layer are electrically connected to one another, The dummy pad, the second pad electrode base layer, and the second pad electrode upper layer are electrically connected to one another.

The first electrode and the second electrode may each include a same material as the first pad electrode base layer and the second pad electrode base layer. The first electrode, the second electrode, the first pad electrode base layer, and the second pad electrode base layer may each include aluminum.

The first connection electrode and the second connection electrode may include a same material as the first pad electrode upper layer and the second pad electrode upper layer. The first connection electrode, the second connection electrode, the first pad electrode upper layer, and the second pad electrode upper layer may each include ITO, IZO, and/or ITZO.

The display device may further include an external device disposed on the first substrate and including a plurality of circuit wires, a non-conductive layer disposed between the external device and the first substrate and bonding the external device to the first substrate, and a plurality of conductive balls disposed between the first pad electrode upper layer and the second pad electrode upper layer and the circuit wires.

The plurality of conductive balls may electrically connect the circuit wires to the first pad electrode upper layer and may electrically connect the circuit wires to the second pad electrode upper layer.

A method for manufacturing a display device includes forming a wiring pad and a dummy pad spaced apart from each other on a first substrate. A first planarization layer is formed on the wiring pad and the dummy pad. A first pad electrode base layer and a second pad electrode base layer are formed on the first planarization layer and are spaced apart from each other. The first pad electrode base layer is connected to the wiring pad and the second pad electrode base layer is connected to the dummy pad. A first insulating layer is formed covering at least a portion of the first pad electrode base layer and the second pad electrode base layer. A first pad electrode upper layer is formed on the first pad electrode base layer and a second pad electrode upper layer is formed on the second pad electrode base layer. A conductive ball ink including a solvent and a plurality of conductive balls dispersed in the solvent is prepared. The conductive ball ink is sprayed onto the first pad electrode upper layer and the second pad electrode upper layer. An electric field is generated between the first pad electrode upper layer and the second pad electrode upper layer to seat the conductive balls between the first pad electrode upper layer and the second pad electrode upper layer. An external device including a plurality of circuit wires is aligned on the first substrate and a non-conductive layer is formed covering the plurality of circuit wires. The external device is bonded to the first substrate.

The electric field may be generated by applying an alternating current electrical signal to the first pad electrode upper layer and the second pad electrode upper layer.

The bonding of the external device to the first substrate may include aligning the circuit wires of the external device with the first pad electrode upper layer and the second pad electrode upper layer of the first substrate, respectively, and bonding the external device to the first substrate by applying a pressure and heat from an upper portion of the external device.

The conductive balls may electrically connect the circuit wires to the first pad electrode upper layer and may electrically connect the circuit wires to the second pad electrode upper layer by the pressure.

The method may further include, after seating the conductive balls, performing a heat treatment process of removing the solvent.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The present invention will now be described more fully hereinafter with reference to the accompanying drawings, in which embodiments of the invention are shown. This invention may, however, be embodied in different forms and should not necessarily be construed as limited to the embodiments set forth herein. Rather, these embodiments are provided so that this disclosure will be thorough and complete, and will fully convey the scope of the invention to those skilled in the art.

It will also be understood that when a layer is referred to as being "on" another layer or substrate, it can be directly on the other layer or substrate, or intervening layers may also be present. The same reference numbers may indicate the same components throughout the specification and drawings.

It will be understood that, although the terms "first," "second," etc. may be used herein to describe various elements, these elements should not necessarily be limited by these terms. These terms are used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments will be described in detail with reference to the accompanying drawings.

Figure 1:
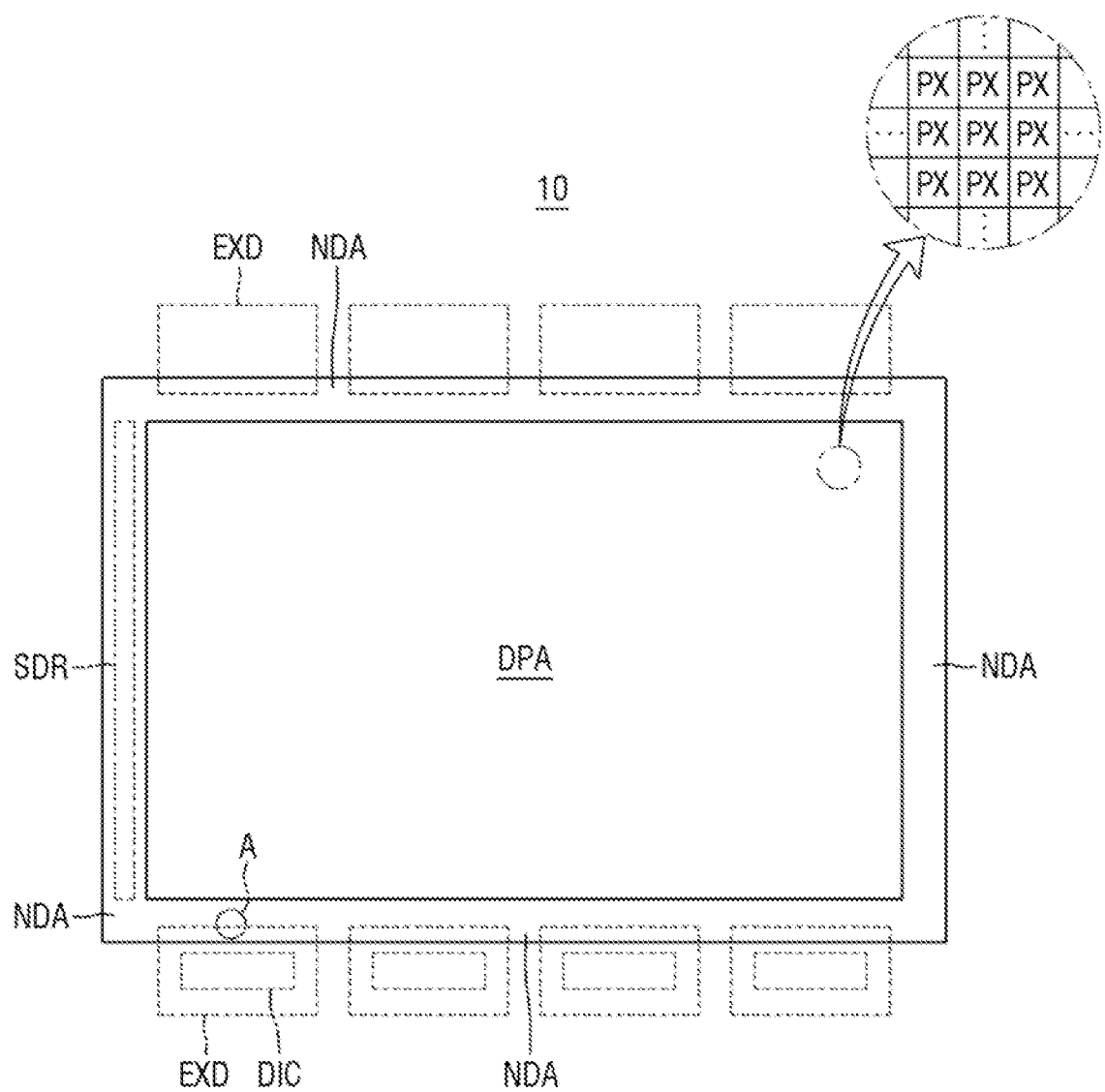
FIG. 1 is a schematic plan view of a display device according to an embodiment.

FIG. 1 is a schematic plan view of a display device according to an embodiment.

Referring to FIG. 1, a display device 10 displays a moving image or a still image. The display device 10 may refer to any electronic device providing a display screen. Examples of the display device 10 may include a television, a laptop computer, a computer monitor, an electronic billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a portable game console, a digital camera, a camcorder and the like, which provide a display screen.

The display device 10 includes a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel is applied as a display panel will be exemplified, but the present disclosure is not necessarily limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape, or a circular shape. The shape of a display area DPA of the display device 10 may also be similar to the overall shape of the display device 10. In FIG. 1, the display device 10 and the display area DPA having a rectangular shape elongated in the horizontal direction are illustrated.

The display device 10 may include the display area DPA and a non-display area NDA. The display area DPA is an area where a screen can be displayed (e.g., including regular pixels), and the non-display area NDA is an area where a screen is not displayed (e.g., not including regular pixels). The display area DPA may also be referred to as an active region, and the non-display area NDA may also be referred to as a non-active region. The display area DPA may substantially occupy the center of the display device 10.

The display area DPA may include a plurality of pixels PX. The plurality of pixels PX may be arranged in a matrix. The shape of each pixel PX may be a rectangular or square in a plan view. However, the present disclosure is not necessarily limited thereto, and it may be a rhombic shape in which each side is inclined with respect to one direction. The pixels PX may be alternately disposed in a stripe type or a PENTILE™ type. In addition, each of the pixels PX may include one or more light emitting elements 30 that emit light of a specific wavelength band to display a specific color.

The non-display area NDA may be proximate to and may directly contact the display area DPA. The non-display area NDA may at least surround the display area DPA. The display area DPA may have a rectangular shape, and the non-display area NDA may be disposed adjacent to four sides of the display area DPA. The non-display area NDA may form a bezel of the display device 10.

In the non-display area NDA, a driving circuit or a driving element for driving the display area DPA may be disposed. In an embodiment, pad portions disposed on a display substrate of the display device 10 may be provided in the non-display area NDA disposed adjacent to a first long side (lower side in FIG. 1) of the display device 10 and the non-display area NDA disposed adjacent to a second long side (upper side in FIG. 1) of the display device 10. External devices EXD may be mounted on pad electrodes of the pad portions. The external devices EXD may include, e.g., a connection film, a printed circuit board, a driver integrated circuit (DIC), a connector, a wiring connection film and the like. A scan driver SDR may be formed directly on the display substrate of the display device 10 may be provided in the non-display area NDA and disposed adjacent to a first short side (left side in FIG. 1) of the display device 10.

Figure 2:
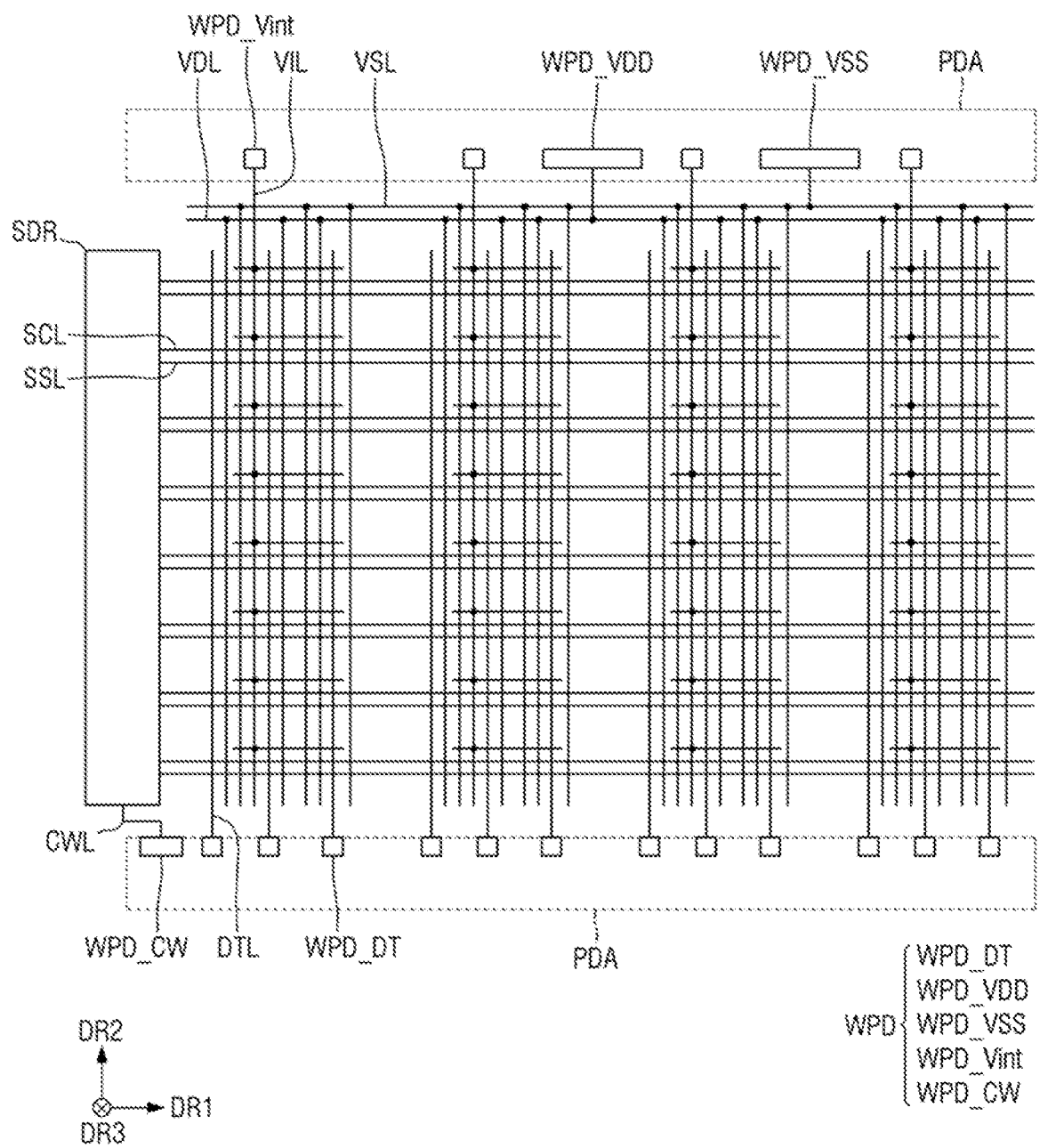
FIG. 2 is a schematic layout diagram showing wires included in a display device according to an embodiment.

FIG. 2 is a schematic layout diagram showing wires included in a display device according to an embodiment.

Referring to FIG. 2, the display device 10 may include a plurality of wires. The plurality of wires may include a scan line SCL, a sensing line SSL, a data line DTL, an initialization voltage line VIL, a first voltage line VDL, a second voltage line VSL, and the like. Other wires may be further provided in the display device 10.

The scan line SCL and the sensing line SSL may extend in a first direction DR1. The scan line SCL and the sensing line SSL may be connected to the scan driver SDR. The scan driver SDR may include a driving circuit. The scan driver SDR may be arranged on one side of the display area DPA in the first direction DR1, but is not necessarily limited thereto. The scan driver SDR may be connected to a signal connection line CWL, and at least one end of the signal connection line CWL may form a pad WPD_CW in the non-display area NDA to be connected to the external device.

The term "connected" as used herein may mean not only that one member is connected to another member through a physical contact, but also that one member is connected to another member through yet another member. This may also be understood as one part and the other part as integral elements are connected into an integrated element via another element. Furthermore, if one element is connected to another element, this may be construed as a meaning including an electrical connection via another element in addition to a direct connection in physical contact.

The data line DTL and the initialization voltage line VIL may extend in a second direction DR2 intersecting the first direction DR1. The initialization voltage line VIL may further include, in addition to a portion extending in the second direction DR2, a portion branched in the first direction DR1 therefrom. The first voltage line VDL and the second voltage line VSL may also include a portion extending in the second direction DR2 and a portion connected thereto to extend in the first direction DR1. The first voltage line VDL and the second voltage line VSL may have a mesh structure, but are not necessarily limited thereto. Each pixel PX of the display device 10 may be connected to at least one data line DTL, the initialization voltage line VIL, the first voltage line VDL, and the second voltage line VSL.

The data line DTL, the initialization voltage line VIL, the first voltage line VDL, and the second voltage line VSL may be electrically connected to at least one wiring pad WPD. Each wiring pad WPD may be disposed in the non-display area NDA. In an embodiment, a wiring pad WPD_DT (hereinafter, referred to as "data pad") of the data line DTL may be disposed in a pad area PDA located on one side of the display area DPA in the second direction DR2. Further, a wiring pad WPD_Vint (hereinafter, referred to as "initialization voltage pad") of the initialization voltage line VIL, a wiring pad WPD_VDD (hereinafter, referred to as "first power pad") of the first voltage line VDL, and a wiring pad WPD_VSS (hereinafter, referred to as "second power pad") of the second voltage line VSL may be disposed in a pad area PDA located on the other side of the display area DPA in the second direction DR2. For example, the data pad WPD_DT, the initialization voltage pad WPD_Vint, the first power pad WPD_VDD, and the second power pad WPD_VSS may all be disposed in the same area, e.g., in the non-display area NDA located above the display area DPA. The external devices EXD may be mounted on the wiring pads WPD. The external devices EXD may be mounted on the wiring pads WPD by applying an anisotropic conductive film, ultrasonic bonding or the like.

Each pixel PX or sub-pixel PXn (wherein "n" is an integer of 1 to 3) of the display device 10 includes a pixel driving circuit. The above-described wires may pass through each pixel PX or the periphery thereof to apply a driving signal to each pixel driving circuit. The pixel driving circuit may include transistors and capacitors. The number of transistors and capacitors of each pixel driving circuit may be variously modified. According to an embodiment, in each sub-pixel SPXn of the display device 10, the pixel driving circuit may have a 3T1C structure including three transistors and one capacitor. Hereinafter, the pixel driving circuit of the 3T1C structure will be described as an example, but the present disclosure is not necessarily limited thereto, and various other modified pixel PX structures such as a 2T1C structure, a 7T1C structure, and a 6T1C structure may be applied.

Figure 3A:
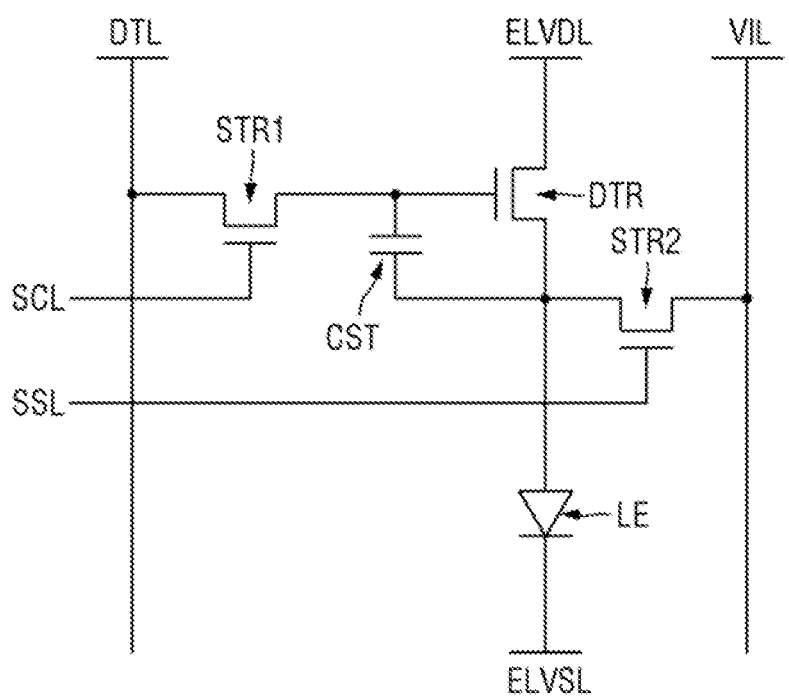
FIG. 3A is an equivalent circuit diagram of a sub-pixel according to an embodiment.
Figure 3B:
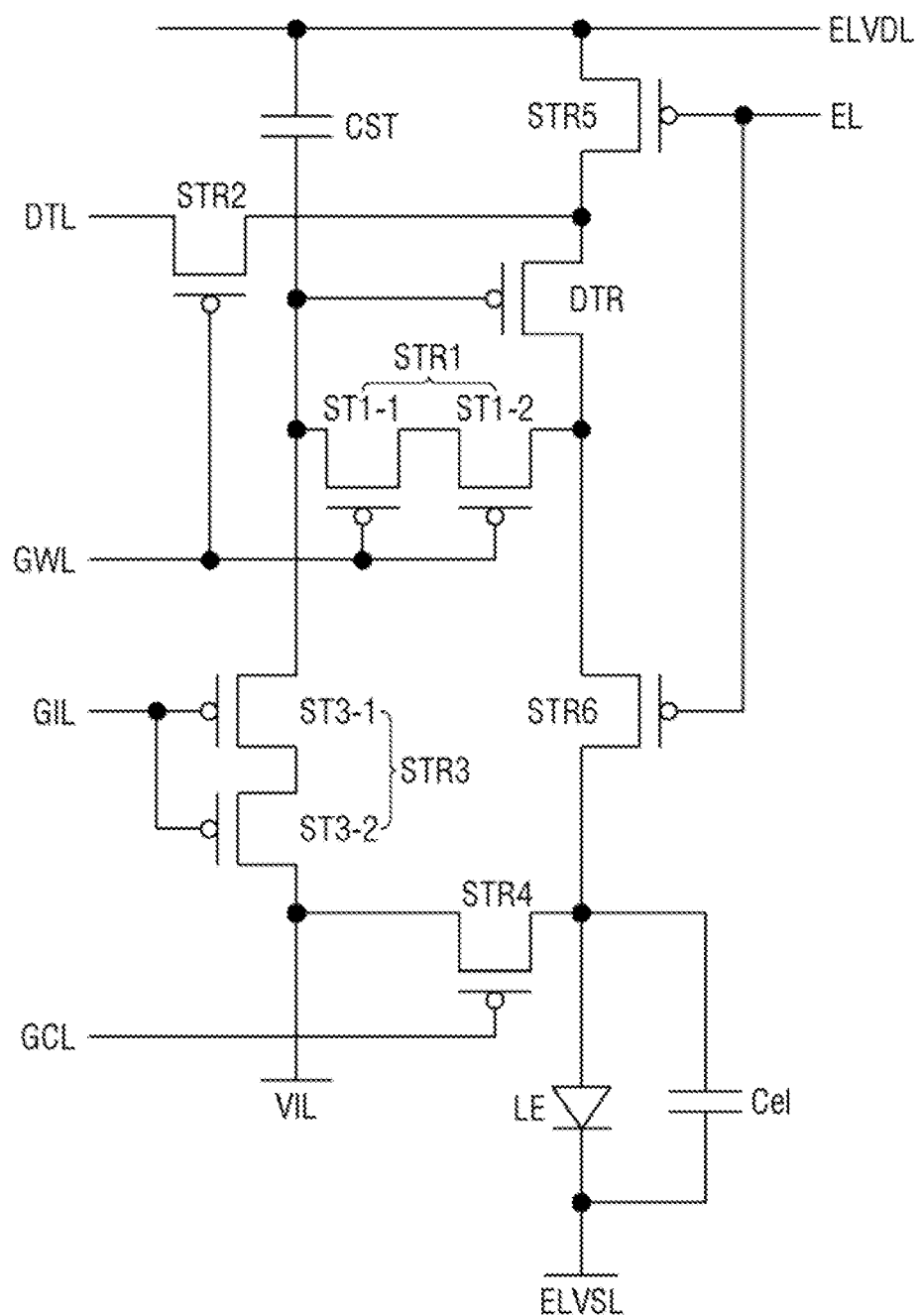
FIG. 3B is an equivalent circuit diagram of a sub-pixel according to an embodiment.

FIG. 3A is an equivalent circuit diagram of a sub-pixel according to an embodiment. FIG. 3B is an equivalent circuit diagram of a sub-pixel according to an embodiment.

Referring to FIG. 3A, each sub-pixel SPXn of the display device 10, according to an embodiment, includes, in addition to a light emitting diode LE, three transistors DTR, STR1, and STR2 and one storage capacitor CST.

The light emitting diode LE emits light according to a current supplied through the driving transistor DTR. The light emitting diode LE may be implemented as an inorganic light emitting diode, an organic light emitting diode, a micro light emitting diode, or a nano light emitting diode.

A first electrode (i.e., anode electrode) of the light emitting diode LE is connected to a source electrode of the driving transistor DTR, and a second electrode (i.e., cathode electrode) of the light emitting element EMD is connected to a second power line ELVSL to which a low potential voltage (second power voltage) lower than a high potential voltage (first power voltage) of the first power line ELVDL is supplied.

The driving transistor DTR adjusts a current flowing from the first power line ELVDL, to which the first power voltage is applied, to the light emitting diode LE according to a voltage difference between a gate electrode and the source electrode. The gate electrode of the driving transistor DTR may be connected to the first electrode of a first transistor ST1, the source electrode thereof may be connected to the first electrode of the light emitting diode LE, and the drain electrode thereof may be connected to the first power supply line ELVDL to which the first power voltage is applied.

A first transistor STR1 is turned on by the scan signal of a scan line SCL to connect a data line DTL to the gate electrode of the driving transistor DTR. The gate electrode of the first transistor STR1 may be connected to the scan line SL, the first electrode thereof may be connected to the gate electrode of the driving transistor DTR, and the second electrode thereof may be connected to the data line DTL.

A second transistor STR2 is turned on by the sensing signal of a sensing signal line SSL to connect an initialization voltage line VIL to the source electrode of the driving transistor DTR. The gate electrode of the second transistor ST2 may be connected to the sensing signal line SSL, the first electrode thereof may be connected to the initialization voltage line VIL, and the second electrode thereof may be connected to the source electrode of the driving transistor DTR.

In an embodiment, the first electrode of each of the first and second transistors STR1 and STR2 may be a source electrode and the second electrode thereof may be a drain electrode, but the present disclosure is not necessarily limited thereto, and may be vice versa.

The capacitor CST is formed between the gate electrode and the source electrode of the driving transistor DTR. The storage capacitor CST stores a difference voltage between a gate voltage and a power voltage of the driving transistor DTR.

The driving transistor DTR, the first transistor STR1, and the second transistor STR2 may be formed as thin film transistors. Further, in the description of FIG. 3A, it is noted that the driving transistor DTR, the first switching transistor STR1, and the second switching transistor STR2 are N-type metal oxide semiconductor field effect transistors (MOSFETs), but the present disclosure is not necessarily limited thereto. For example, the driving transistor DTR, the first switching transistor STR1, and the second switching transistor STR2 may be P-type MOSFETs, or some of the driving transistor DTR, the first switching transistor STR1, and the second switching transistor STR2 may be N-type MOSFETs, while others may be P-type MOSFETs.

Referring to FIG. 3B, the first electrode of the light emitting diode LE, according to an embodiment, may be connected to the first electrode of a fourth transistor STR4 and the second electrode of a sixth transistor STR6, and the second electrode thereof may be connected to the second power line ELVSL. A parasitic capacitance Cel may be formed between the first electrode and the second electrode of the light emitting diode LE.

Each sub-pixel SPXn includes the driving transistor DTR, switch elements, and the capacitor CST. The switch elements include first to sixth transistors STR1, STR2, STR3, STR4, STR5, and STR6.

The driving transistor DTR includes a gate electrode, a first electrode, and a second electrode. The driving transistor DTR controls a drain-source current Ids (hereinafter, referred to as "driving current") flowing between the first electrode and the second electrode according to a data voltage applied to the gate electrode.

The capacitor CST is formed between the second electrode of the driving transistor DTR and a second power line ELVSL. One electrode of the capacitor CST may be connected to the second electrode of the driving transistor DTR, and the other electrode thereof may be connected to the second power line ELVSL.

When the first electrode of each of the driving transistor DTR and the first to sixth transistors STR1 to STR6 is a source electrode, the second electrode thereof may be a drain electrode. Alternatively, when the first electrode of each of the driving transistor DTR and the first to sixth transistors STR1 to STR6 is a drain electrode, the second electrode thereof may be a source electrode.

An active layer of each of the driving transistor DTR and the first to sixth transistors STR1 to STR6 may include polysilicon, amorphous silicon, and/or an oxide semiconductor. When a semiconductor layer of each of the driving transistor DTR and the first to sixth transistors STR1 to STR6 is formed of polysilicon, a process for forming the semiconductor layer may be a low temperature polysilicon (LTPS) process.

Further, in FIG. 3B, the driving transistor DTR and the first to sixth transistors STR1 to STR6 have been described as being formed of a p-type metal oxide semiconductor field effect transistor (MOSFET), but without necessarily being limited thereto, they may be formed of an n-type MOSFET.

Furthermore, a first power voltage of the first power line ELVDL, a second power voltage of the second power line ELVSL, and a third power voltage of a third power line VIL may be set in consideration of the characteristics of the driving transistor DTR, the characteristics of the light emitting diode LE, and the like.

Figure 4:
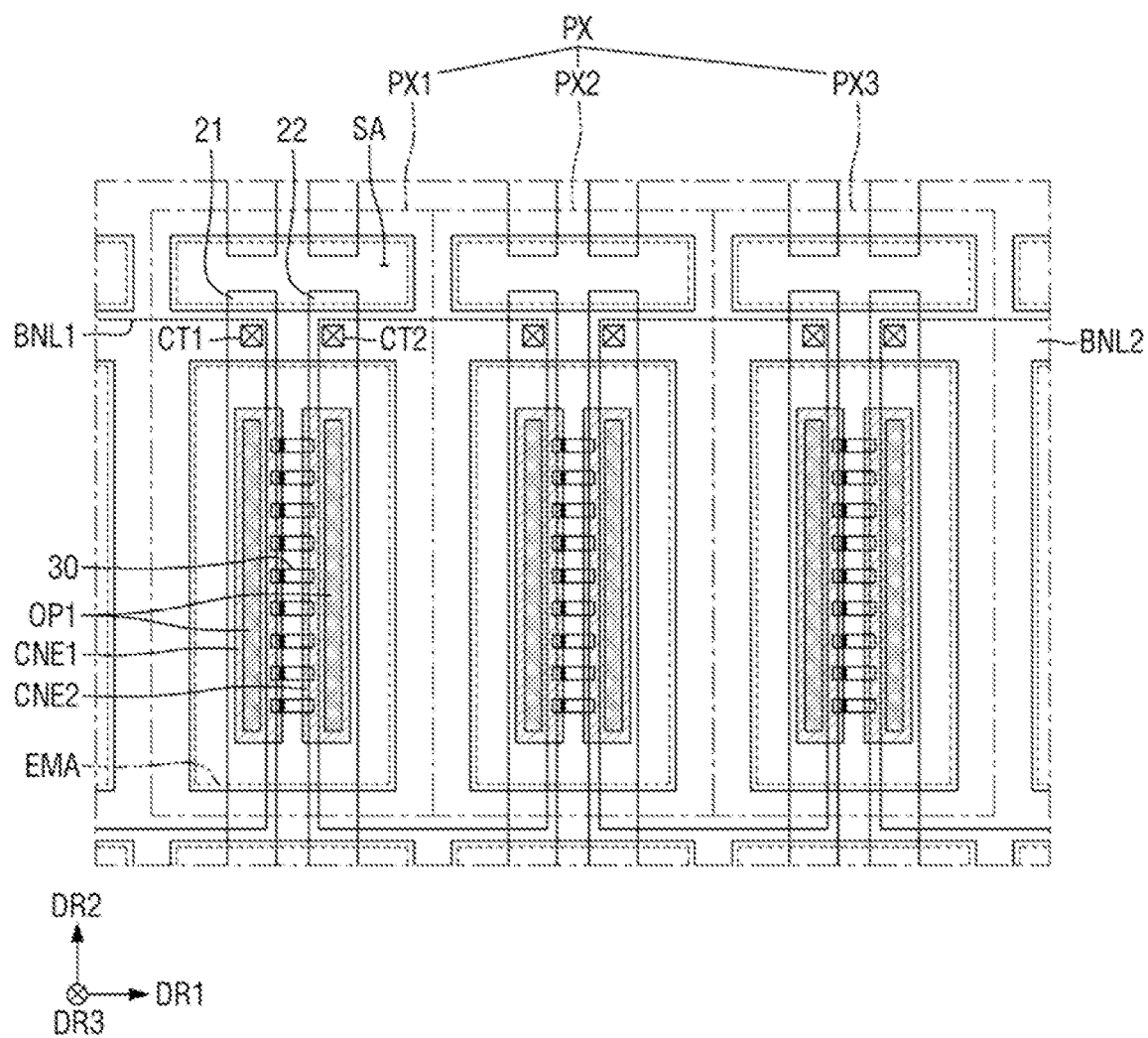
FIG. 4 is a plan view illustrating one pixel of a display device according to an embodiment.

FIG. 4 is a plan view illustrating one pixel of a display device according to an embodiment.

Referring to FIG. 4, each of the plurality of pixels PX may include a plurality of sub-pixels SPXn (wherein "n" is an integer of 1 to 3). For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the present disclosure is not necessarily limited thereto, and the sub-pixels SPXn may emit light of the same color. In addition, although FIG. 4 illustrates that the pixel PX includes three sub-pixels SPXn, the present disclosure is not necessarily limited thereto, and the pixel PX may include a larger number of sub-pixels SPXn.

Each sub-pixel SPXn of the display device 10 may include an emission area EMA and a non-emission area. In the emission area EMA, the light emitting element 30 emits light of a specific wavelength band. In the non-emission area, the light emitting element 30 is not disposed and light emitted from the light emitting element 30 does not reach, so that no light is emitted. The emission area may include an area in which the light emitting element 30 is disposed, and an area adjacent to the light emitting element 30 to emit light emitted from the light emitting element 30.

Without necessarily being limited thereto, the emission area may also include an area in which the light emitted from the light emitting element 30 is reflected or refracted by another member and emitted. The plurality of light emitting elements 30 may be disposed in each sub-pixel SPXn, and the emission area may include an area where the light emitting elements 30 are disposed and an area adjacent thereto.

In addition, each sub-pixel SPXn may include a sub-region SA disposed in the non-emission area. The sub-region SA may be disposed on one side of the emission area EMA in the second direction DR2. The sub-region SA may be disposed between the emission areas EMA of the sub-pixels SPXn adjacent in the second direction DR2. The plurality of emission areas EMA and sub-regions SA may be arranged in the display area DPA of the display device 10. For example, the plurality of emission areas EMA and sub-regions SA may be repeatedly arranged in the first direction DR1, respectively, while being alternately arranged in the second direction DR2. In addition, the separation distance between the sub-regions SA in the first direction DR1 may be smaller than the separation distance between the emission areas EMA in the first direction DR1. A second bank BNL2 may be disposed between the sub-region SA and the emission area EMA, and the gap therebetween may vary according to the width of the second bank BNL2. Although light is not emitted from the sub-region SA because of no light emitting element 30 being disposed therein, a portion of electrodes 21 and 22 provided in each sub-pixel SPXn may be disposed in the sub-region SA. The electrodes 21 and 22 provided in each sub-pixel SPXn may be disposed separately from each other in the sub-region SA.

Figure 5:
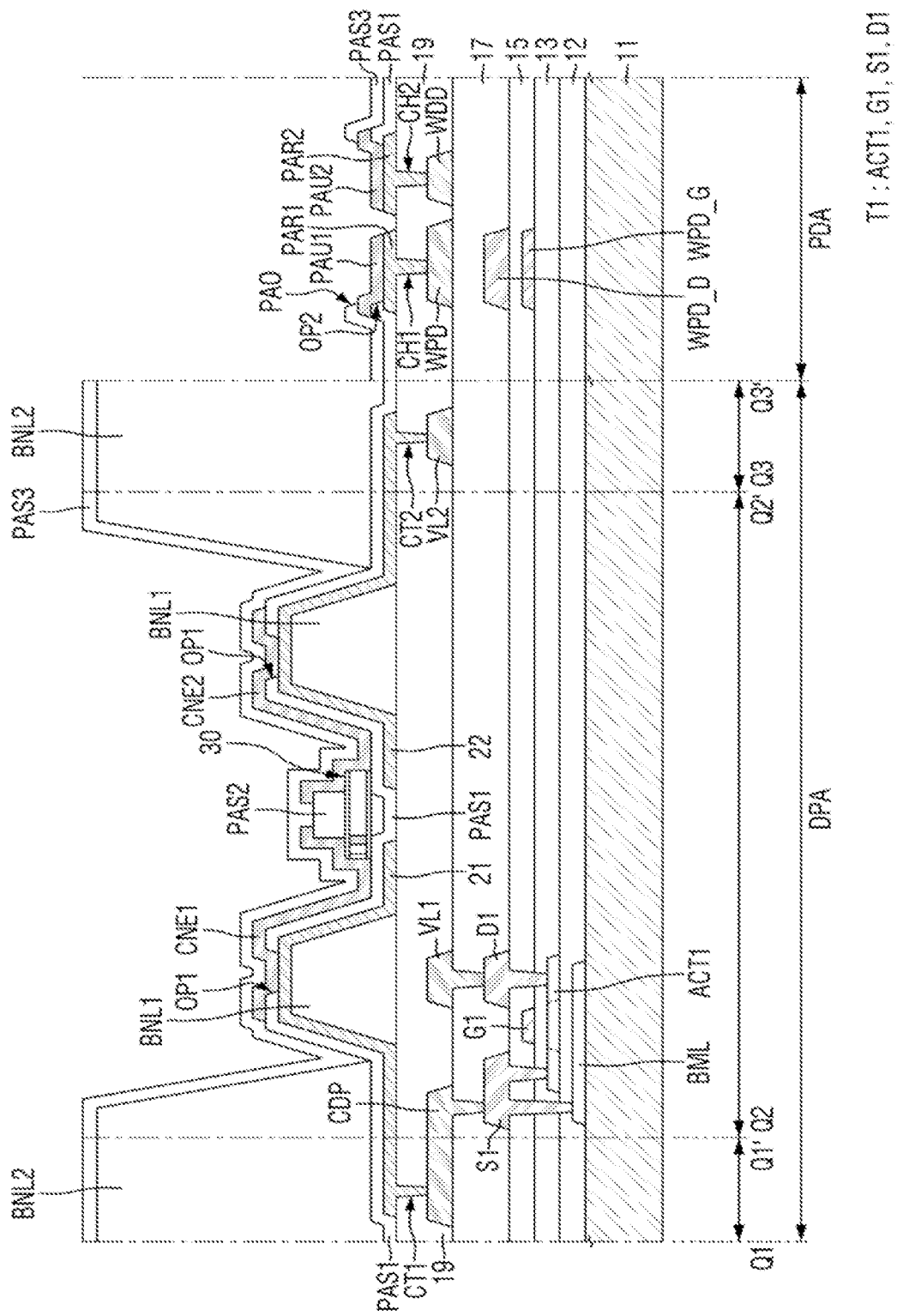
FIG. 5 is a schematic cross-sectional view of a display area and a pad area of a display device according to an embodiment.
Figure 6:
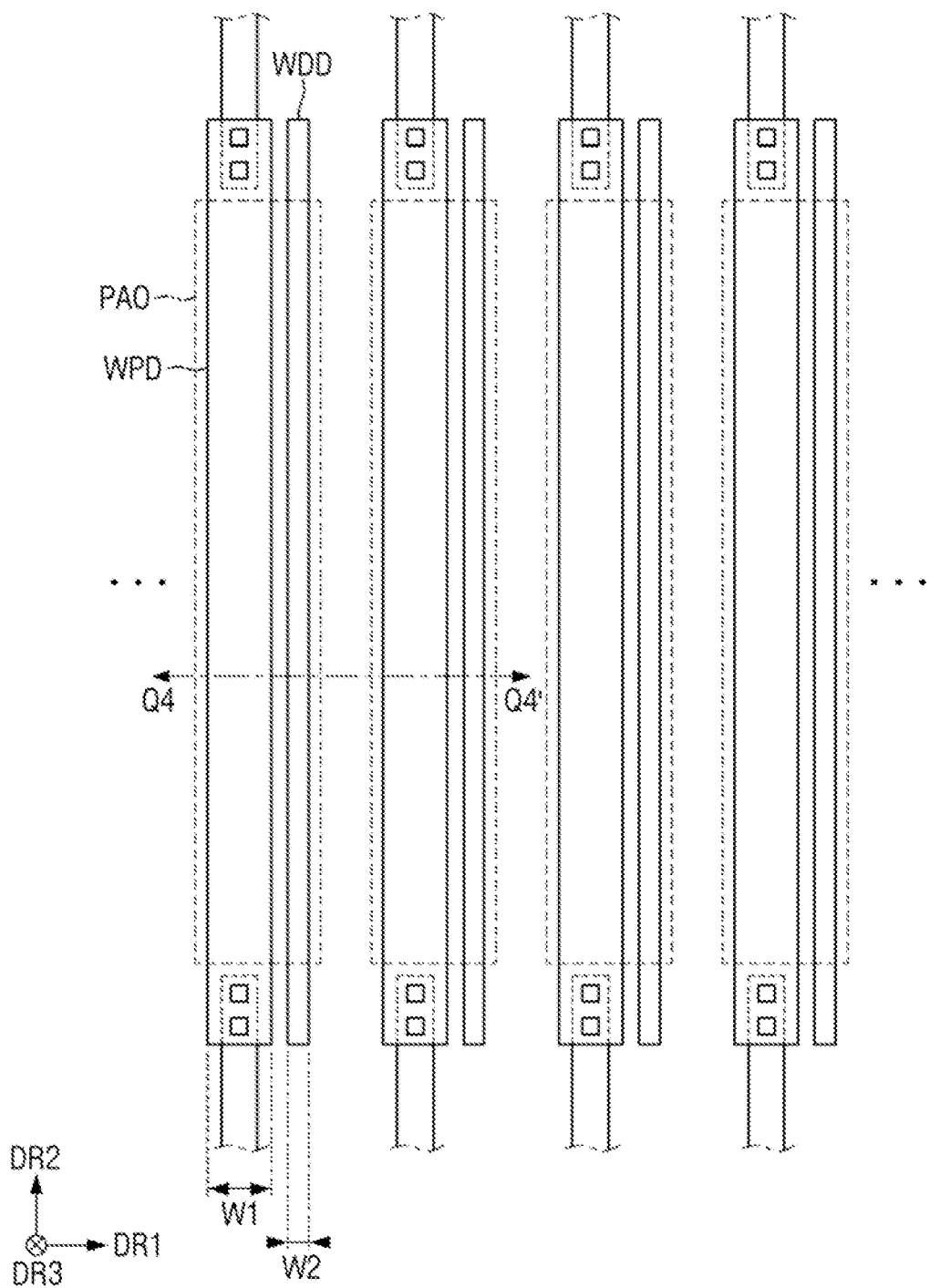
FIG. 6 is a schematic plan view of a pad area of a display device according to an embodiment.
Figure 7:
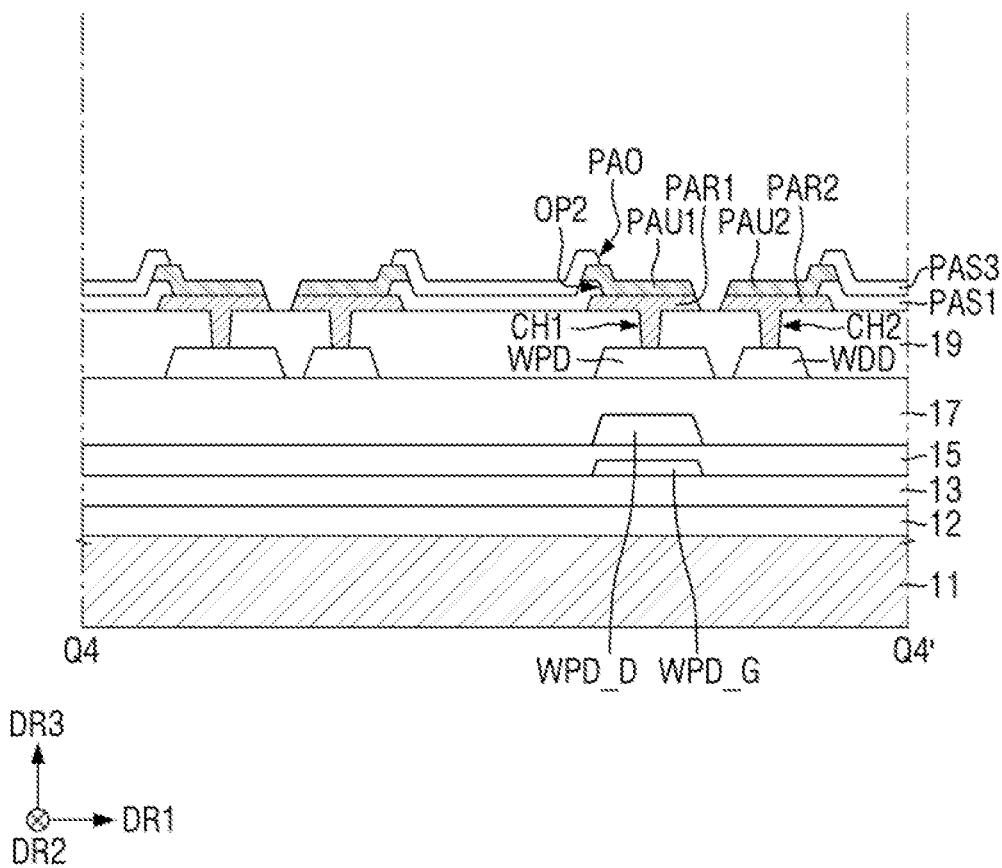
FIG. 7 is a cross-sectional view taken along line Q4-Q4' of FIG. 6.
Figure 8:
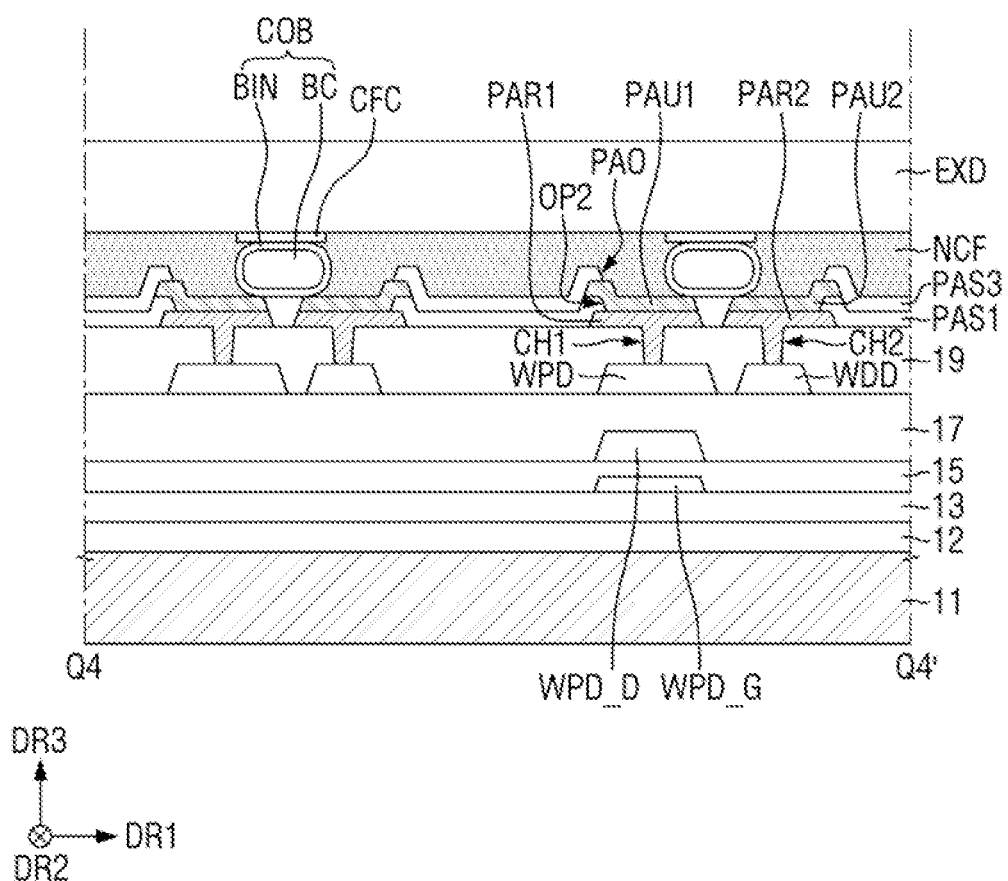
FIG. 8 is a cross-sectional view schematically illustrating a pad area of a display device according to an embodiment.

FIG. 5 is a schematic cross-sectional view of a display area and a pad area of a display device according to an embodiment. FIG. 6 is a schematic plan view of a pad area of a display device according to an embodiment. FIG. 7 is a cross-sectional view taken along line Q4-Q4' of FIG. 6. FIG. 8 is a cross-sectional view schematically illustrating a pad area of a display device according to an embodiment.

FIG. 5 illustrates a schematic cross-section view of the pad electrodes of the pad area PDA along with the disposition of the electrodes 21 and 22, the light emitting element 30, and connection electrodes CNE1 and CNE2 disposed in the emission area EMA in one sub-pixel SPXn of the display area DPA. In addition, although only one first transistor T1 is illustrated in FIG. 5, the present disclosure is not necessarily limited thereto, and three transistors T1, T2, and T3 and one storage capacitor Cst as described above may be disposed in each sub-pixel SPXn. FIG. 5 is a view illustrating a relative disposition relationship of members disposed in the display area DPA and the pad area PDA, but the structure of the display device 10 is not necessarily limited thereto.

Referring to FIG. 5 in conjunction with FIG. 4, the display device 10 may include a first substrate 11, and a semiconductor layer a plurality of conductive layers, and a plurality of insulating layers disposed on the first substrate 11. The semiconductor layer, the conductive layers, and the insulating layers may each constitute a circuit layer and a light emitting element layer of the display device 10.

For example, the first substrate 11 may be an insulating substrate. The first substrate 11 may be made of an insulating material such as glass, quartz, or polymer resin. Further, the first substrate 11 may be a rigid substrate, but may also be a flexible substrate which can be bent, folded or rolled. The first substrate 11 may include the display area DPA, the non-display area NDA, and the pad area PDA.

A light blocking layer BML may be disposed on the first substrate 11. The light blocking layer BML overlaps an active layer ACT1 of the first transistor T1 in the display area DPA. The light blocking layer BML may include a material of blocking light to prevent light from reaching the active layer ACT1 of the first transistor T1. In addition, the light blocking layer BML may be electrically connected to a source electrode S1 of the first transistor T1 through a contact hole to suppress a change in the voltage of the first transistor T1. For example, the light blocking layer BML is an opaque metal material that blocks light transmission, and may be formed of a Ti/Cu double layer in which a titanium layer and a copper layer are stacked. However, the present disclosure is not necessarily limited thereto, and the light blocking layer BML may be omitted.

A buffer layer 12 may be entirely disposed on the first substrate 11 including the light blocking layer BML. For example, the buffer layer 12 may be disposed over the display area DPA and the pad area PDA of the first substrate 11. The buffer layer 12 may be formed on the first substrate 11 to protect the first transistors T1 of the pixel PX from moisture permeating through the first substrate 11 susceptible to moisture permeation, and may perform a surface planarization function. The buffer layer 12 may be formed of a plurality of inorganic layers that are alternately stacked. For example, the buffer layer 12 may be formed of a multilayer in which inorganic layers including silicon oxide (SiOx), silicon nitride (SiNx) and/or silicon oxynitride (SiON) are alternately stacked.

The semiconductor layer is disposed on the buffer layer 12. The semiconductor layer may include the active layer ACT1 of the first transistor T1 disposed in the display area DPA. These may partially overlap a gate electrode G1 and the like of a first gate conductive layer, which will be described later.

The semiconductor layer may include polycrystalline silicon, monocrystalline silicon, oxide semiconductor, and the like. When the semiconductor layer includes an oxide semiconductor, each active layer ACT1 may include a plurality of conductive regions and a channel region therebetween. The oxide semiconductor may be an oxide semiconductor containing indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc tin oxide (IGZTO) or the like.

In an embodiment, the semiconductor layer may include polycrystalline silicon. The polycrystalline silicon may be formed by crystallizing amorphous silicon and, in this case, the conductive region of the active layer ACT1 may be a region doped with impurities.

A first gate insulating layer 13 is disposed on the semiconductor layer and the buffer layer 12 over the display area DPA and the pad area PDA. The first gate insulating layer 13 may function as a gate insulating layer of each transistor. The first gate insulating layer 13 may be formed of an inorganic layer including an inorganic material, such as silicon oxide (SiOx), silicon nitride (SiNx) or silicon oxynitride (SiON), or a stacked structure thereof.

The first gate conductive layer is disposed on the first gate insulating layer 13. The first gate conductive layer may include a gate electrode G1 of the first transistor T1 disposed in the display area DPA and a gate pad portion WPD_G disposed in the pad area PDA. The gate electrode G1 may overlap the channel region of the active layer ACT1 in the thickness direction.

The first gate conductive layer may further include the first capacitive electrode of the storage capacitor Cst disposed in the display area DPA, and the scan line SCL and the sensing line SSL described above.

In an embodiment, the first gate conductive layer may include the gate pad portion WPD_G disposed in the pad area PDA. A plurality of wiring pads WPD may be disposed in the pad area PDA positioned at one side of the non-display area NDA of the display device 10. Through pad electrodes PAR1 and PAU1, the wiring pad WPD may be connected to an external device EXD mounted thereon. The gate pad portion WPD_G may be electrically connected to the wiring pad WPD. For example, the wiring pad WPD may be connected to the gate pad portion WPD_G through a contact hole. An electrical signal applied from the external device EXD to the wiring pad WPD may be transmitted to the first gate conductive layer through the gate pad portion WPD_G. Electrical signals applied to the display area DPA through the wiring pad WPD may be transmitted through a conductive layer disposed on a layer different from the wiring pad WPD, so that the display area DPA may be completely sealed from ambient air. However, the present disclosure is not necessarily limited thereto, and the gate pad portion WPD_G of the first gate conductive layer may also be omitted.

The first gate conductive layer may be formed as a single layer or multiple layers including molybdenum (Mo), aluminum (Al), chromium (Cr), gold (Au), titanium (Ti), nickel (Ni), neodymium (Nd), and/or copper (Cu) and/or an alloy thereof. However, the present disclosure is not necessarily limited thereto.

The first interlayer insulating layer 15 is disposed on the first gate conductive layer. The first interlayer insulating layer 15 may function as an insulating layer between the first gate conductive layer and other layers disposed thereon. Further, the first interlayer insulating layer 15 may cover the first gate conductive layer to protect the first gate conductive layer. The first interlayer insulating layer 15 may be formed of an inorganic layer including an inorganic material, such as silicon oxide (SiOx), silicon nitride (SiNx) or silicon oxynitride (SiON), or a stacked structure thereof.

The first data conductive layer is disposed on the first interlayer insulating layer 15. The first data conductive layer may include the first source electrode S1 and a first drain electrode D1 of the first transistor T1 disposed in the display area DPA, and the data pad portion WPD_D disposed in the pad area PDA.

Each of the source and drain electrodes S1 and D1 of the first transistor T1 may be connected to the doped region of the active layer ACT1 through a contact hole penetrating the first interlayer insulating layer 15 and the first gate insulating layer 13. Further, the first source electrode S1 of the first transistor T1 may be electrically connected to the light blocking layer BML through another contact hole.

The first data conductive layer may further include the second capacitive electrode of the storage capacitor Cst disposed in the display area DPA, the data line DTL described above, or the like.

In an embodiment, the first data conductive layer may include the data pad portion WPD_D disposed in the pad area PDA. Similarly to the gate pad portion WPD_G, the data pad portion WPD_D may also be electrically connected to the wiring pad WPD. For example, the wiring pad WPD may be connected to the data pad portion WPD_D through a contact hole, and an electrical signal applied from the external device EXD to the wiring pad WPD may be transmitted to the first data conductive layer through the data pad portion WPD_D. However, the present disclosure is not necessarily limited thereto, and the data pad portion WPD_D of the first data conductive layer may also be omitted.

The first data conductive layer may be formed as a single layer or multiple layers made include molybdenum (Mo), aluminum (Al), chromium (Cr), gold (Au), titanium (Ti), nickel (Ni), neodymium (Nd), and/or copper (Cu) and/or an alloy thereof. However, the present disclosure is not necessarily limited thereto.

The second interlayer insulating layer 17 is disposed on the first data conductive layer. The second interlayer insulating layer 17 may function as an insulating layer between the first data conductive layer and other layers disposed thereon. In addition, the second interlayer insulating layer 17 may cover the first data conductive layer and protect the first data conductive layer. The second interlayer insulating layer 17 may be formed of an inorganic layer including an inorganic material, such as silicon oxide (SiOx), silicon nitride (SiNx) or silicon oxynitride (SiON), or a stacked structure thereof.

The second data conductive layer is disposed on the second interlayer insulating layer 17. The second data conductive layer may include a first voltage line VL1, a second voltage line VL2, and a first conductive pattern CDP disposed in the display area DPA, and the wiring pad WPD and a dummy pad WDD disposed in the pad area PDA.

The first voltage line VL1 may be applied with a high potential voltage (or a first power voltage) supplied to the first transistor T1, and the second voltage line VL2 may be applied with a low potential voltage (or a second power voltage) supplied to the second electrode 22. Also, during the manufacturing process of the display device 10, the second voltage line VL2 may be applied with an alignment signal for aligning the light emitting element 30.

The first conductive pattern CDP may be connected to the source electrode S1 of the first transistor T1 through a contact hole formed in the second interlayer insulating layer 17. The first conductive pattern CDP may be electrically connected to the first drain electrode D1 and may also be in contact with the first electrode 21 to be described later. The first transistor T1 may transmit the first power voltage applied from the first voltage line VL1 to the first electrode 21 through the first conductive pattern CDP. Although it is illustrated in the drawing that the second data conductive layer includes one second voltage line VL2 and one first voltage line VL1, the present disclosure is not necessarily limited thereto. The second data conductive layer may include a larger number of first voltage lines VL1 and second voltage lines VL2.

The wiring pad WPD may be disposed in the pad area PDA and may be connected to the external device EXD mounted thereon. In an embodiment, the wiring pad WPD may be connected to the external device EXD through the first pad electrodes PAR1 and PAU1 disposed thereon. In addition, an alignment signal for aligning a conductive ball COB, which will be described later, may also be applied to the wiring pad WPD during the manufacturing process of the display device 10.

The dummy pad WDD may be disposed in the pad area PDA to be connected to second pad electrodes PAR2 and PAU2 disposed thereon. An alignment signal for aligning the conductive balls COB, which will be described later, may be applied to the dummy pad WDD. The dummy pad WDD might not be connected to any wire of the display area DPA of the display device 10 and may be connected to the second pad electrodes PAR2 and PAU2 of the pad area PDA. A detailed description of the wiring pad WPD and the dummy pad WDD will be described later.

The second data conductive layer may be formed as a single layer or multiple layers made include molybdenum (Mo), aluminum (Al), chromium (Cr), gold (Au), titanium (Ti), nickel (Ni), neodymium (Nd), and/or copper (Cu) and/or an alloy thereof. However, the present disclosure is not necessarily limited thereto.

The first planarization layer 19 is disposed on the second data conductive layer. The first planarization layer 19 may be entirely disposed in the display area DPA and the pad area PDA to perform a surface planarization function. The first planarization layer 19 may include an organic insulating material, for example, an organic material such as polyimide (PI). In an embodiment, the first planarization layer 19 may partially expose the wiring pad WPD and the dummy pad WDD of the pad area PDA. However, the present disclosure is not necessarily limited thereto, and the first planarization layer 19 might also not be disposed on the pad area PDA and may be omitted.

A plurality of first banks BNL1, a plurality of electrodes 21 and 22, a light emitting element 30, a plurality of connection electrodes CNE1 and CNE2, and the second bank BNL2 are disposed on the first planarization layer 19 of the display area DPA. Further, a plurality of insulating layers PAS1, PAS2, and PAS3 may be disposed on the first planarization layer 19. In the pad area PDA, the pad electrode base layers PAR1 and PAR2, the pad electrode upper layers PAU1 and PAU2, and the plurality of insulating layers PAS1 and PAS3 may be disposed on the first planarization layer 19. Hereinafter, the display element layer disposed in the display area DPA will be described first, and then the pad area PDA will be described.

The first banks BNL1 are disposed in the display area DPA of the first substrate 11. For example, the plurality of first banks BNL1 may be disposed on the first planarization layer 19. The first banks BNL1 may have a shape extending in the second direction DR2 within each sub-pixel SPXn, but might not extend to other sub-pixels SPXn neighboring in the second direction DR2. For example, the length of the first bank BNL1 extending in the second direction DR2 may be smaller than the length of the emission area EMA of each sub-pixel SPXn such that the length does not exceed the sub-region SA and other sub-pixels SPXn. In addition, the plurality of first banks BNL1 are spaced apart from each other in the first direction DR1. The first banks BNL1 may have a predetermined width in the first direction DR1 and a predetermined length in the second direction DR2. The first bank BNL1 may be disposed in the emission area EMA of each sub-pixel SPXn and may have an island pattern.

Although the drawing illustrates that the two first banks BNL1 are disposed in the emission area EMA of one sub-pixel SPXn, the present disclosure is not necessarily limited thereto. A larger number of first banks BNL1 may be further arranged according to the number of electrodes 21 and 22 to be described later. In addition, the shape of the first bank BNL1 is not necessarily limited thereto, and may also be disposed over each of the sub-pixels SPXn and therebetween.

The first bank BNL1 may have a structure in which at least a portion thereof protrudes from the top surface of the first planarization layer 19. The protruding portion of the first bank BNL1 may have an inclined side surface, and the light emitted from the light emitting element 30 may be reflected from the electrodes 21 and 22 disposed on the first bank BNL1 to be emitted in an upward direction of the first planarization layer 19. The first bank BNL1 may provide a region in which the light emitting element 30 is disposed, and may also function as a reflective partition wall that reflects light emitted from the light emitting element 30 upward. The side surface of the first bank BNL1 may be inclined in a linear shape, but is not necessarily limited thereto, and the outer surface of the first bank BNL1 may have a curved semi-circle or semi-ellipse shape. The first banks BNL1 may include an organic insulating material such as polyimide (PI), but are not necessarily limited thereto.

The plurality of electrodes 21 and 22 are disposed on the first bank BNL1 and the first planarization layer 19. The plurality of electrodes 21 and 22 may include a first electrode 21 and a second electrode 22. The first electrode 21 and the second electrode 22 may extend in the second direction DR2, and may be spaced apart from each other in the first direction DR1.

Each of the first electrode 21 and the second electrode 22 may extend in the second direction DR2 within the sub-pixel SPXn, but may be separated from the other electrodes 21 and 22 in the sub-region SA. For example, the sub-region SA may be disposed between the emission areas EMA of the sub-pixels SPXn adjacent in the second direction DR2, and the first electrode 21 and the second electrode 22 may be separated from the other first electrode 21 and second electrode 22 disposed in the sub-pixel SPXn adjacent in the second direction DR2 in the sub-region SA. However, the present disclosure is not necessarily limited thereto, and some of the electrodes 21 and 22 may extend beyond the adjacent sub-pixel SPXn in the second direction DR2 without being separated for each sub-pixel SPXn, or only one of the first electrode 21 and the second electrode 22 may be separated.

The first electrode 21 may be electrically connected to the first transistor T1 through a first contact hole CT1, and the second electrode 22 may be electrically connected to the second voltage line VL2 through a second contact hole CT2. For example, the first electrode 21 may be in contact with the first conductive pattern CDP through the first contact hole CT1 penetrating the first planarization layer 19. The second electrode 22 may also be in contact with the second voltage line VL2 through the second contact hole CT2 penetrating the first planarization layer 19. However, the present disclosure is not necessarily limited thereto.

In the drawing, one first electrode 21 and one second electrode 22 are disposed for each sub-pixel SPXn, but the present disclosure is not necessarily limited thereto, and a larger number of the first electrodes 21 and a larger number of the second electrodes 122 may be disposed in the sub-pixel SPXn. In addition, the first electrode 21 and the second electrode 22 disposed in each sub-pixel SPXn might not necessarily have a shape extending in one direction, and the first electrode 21 and the second electrode 22 may be arranged in various structures. For example, the first electrode 21 and the second electrode 22 may have a partially curved or bent shape, and one electrode may at least partially surround the other electrode.

The first electrode 21 and the second electrode 22 may be respectively disposed on the first banks BNL1. Each of the first electrode 21 and the second electrode 22 may have a larger width than that of the first bank BNL1. For example, each of the first electrode 21 and the second electrode 22 may completely cover the first bank BNL1. The first electrode 21 and the second electrode 22 may be disposed on the side surfaces of the first bank BNL1, respectively, and a distance between the first electrode 21 and the second electrode 22 may be smaller than a distance between the first banks BNL1. Further, at least a portion of the first electrode 21 and at least a portion of the second electrode 22 are directly disposed on the first planarization layer 19, so that they may be disposed on the same plane. However, the present disclosure is not necessarily limited thereto. In some cases, each of the electrodes 21 and 22 may have a width that is smaller than that of the first bank BNL1.

Each electrode 21, 22 may include a conductive material having high reflectivity. For example, each electrode 21, 22 may include a metal such as silver (Ag), copper (Cu), or aluminum (Al) as a material having high reflectivity, or may be an alloy including aluminum (Al), nickel (Ni), lanthanum (La), and the like. Each electrode 21, 22 may reflect, in the upward direction of each sub-pixel SPXn, light emitted from the light emitting element 30 and traveling to the side surface of the first bank BNL1.

However, the present disclosure is not necessarily limited thereto, and each of the electrodes 21 and 22 may further include a transparent conductive material. For example, each electrode 21, 22 may include a material such as indium tin oxide (ITO), indium zinc oxide (IZO), and indium tin zinc oxide (ITZO). In some embodiments, each of the electrodes 21 and 22 may have a structure in which at least one transparent conductive material and at least one metal layer having high reflectivity are stacked, or may be formed as one layer including them. For example, each electrode 21, 22 may have a stacked structure such as ITO/silver (Ag)/ITO, ITO/Ag/IZO, or ITO/Ag/ITZO/IZO.

The plurality of electrodes 21 and 22 may be electrically connected to the light emitting elements 30 and may be applied with a predetermined voltage to allow the light emitting elements 30 to emit light. For example, the plurality of electrodes 21 and 22 may be electrically connected to the light emitting elements 30 through the connection electrodes CNE1 and CNE2 to be described later, and the electrical signals applied to the electrodes 21 and 22 may be transferred to the light emitting elements 30 through the connection electrodes CNE1 and CNE2.

One of the first electrode 21 and the second electrode 22 may be electrically connected to an anode electrode of the light emitting element 30, and the other one thereof may be electrically connected to a cathode electrode of the light emitting element 30. However, the present disclosure is not necessarily limited thereto, and an opposite case may also be possible.

Further, each of the electrodes 21 and 22 may be used to form an electric field in the sub-pixel SPXn to align the light emitting elements 30. The light emitting elements 30 may be disposed between the first electrode 21 and the second electrode 22 by an electric field formed on the first electrode 21 and the second electrode 22. The light emitting elements 30 of the display device 10 may be sprayed onto the electrodes 21 and 22 through an inkjet printing process. When ink including the light emitting elements 30 is sprayed onto the electrodes 21 and 22, an alignment signal is applied to the electrodes 21 and 22 to generate an electric field. The light emitting elements 30 dispersed in the inks may be aligned on the electrodes 21 and 22 by receiving the dielectrophoretic force by the electric field generated on the electrodes 21 and 22.

The first insulating layer PAS1 is disposed on the first planarization layer 19. The first insulating layer PAS1 may cover the first banks BNL1 and the first and second electrodes 21 and 22. In addition, the first insulating layer PAS1 may also partially cover the first and second pad electrode base layers PAR1 and PAR2 in the pad area PDA. The first insulating layer PAS1 may protect the first electrode 21 and the second electrode 22 while insulating them from each other. Further, it may be possible to prevent the light emitting element 30 disposed on the first insulating layer PAS1 from being damaged by direct contact with other members.

The first insulating layer PAS1 may include first openings OP1 partially exposing the first electrode 21 and the second electrode 22. Each of the first openings OP1 may partially expose a portion of each of the electrodes 21 and 22 disposed on the top surface of the first bank BNL1. Some of the connection electrodes CNE1 and CNE2 may be in contact with each of the electrodes 21 and 22 exposed through the first opening OP1.

The first insulating layer PAS1 may have a step such that a portion of the top surface thereof is recessed between the first electrode 21 and the second electrode 22. For example, as the first insulating layer PAS1 covers the first electrode 21 and the second electrode 22, the top surface thereof may be stepped according to the shape of the electrodes 21 and 22 disposed therebelow. However, the present disclosure is not necessarily limited thereto.

The second bank BNL2 may be disposed on the first insulating layer PAS1. The second bank BNL2 may include portions extending in the first direction DR1 and the second direction DR2 in a plan view to be arranged in a grid pattern over the entire surface of the display area DPA. The second bank BNL2 may be disposed along the boundaries between the sub-pixels SPXn to delimit the neighboring sub-pixels SPXn. In addition, the second bank BNL2 may at least partially surround the outer portion of the display area DPA, but might not be disposed in the pad area PDA.

Further, the second bank BNL2 may at least partially surround the emission area EMA and the sub-region SA disposed for each sub-pixel SPXn to delimit them from each other. The first electrode 21 and the second electrode 22 may extend in the second direction DR2 to be disposed across a portion of the second bank BNL2 extending in the first direction DR1.

In an embodiment, the second bank BNL2 may have a height greater than that of the first bank BNL1. The second bank BNL2 may prevent ink from overflowing to the adjacent sub-pixels SPXn during the inkjet printing process of the manufacturing process of the display device 10, thereby separating inks in which different light emitting elements 30 are dispersed for the corresponding sub-pixels SPXn such that the inks are not mixed. Similarly to the first bank BNL1, the second bank BNL2 may include polyimide (PI), but is not necessarily limited thereto.

The light emitting element 30 may be disposed on the first insulating layer PAS1. The plurality of light emitting elements 30 may be spaced apart from each other along the second direction DR2 in which the electrodes 21 and 22 extend, and may be aligned substantially parallel to each other. The light emitting element 30 may have a shape extending in one direction, and the extension direction of the light emitting element 30 may be substantially perpendicular to the extension direction of the electrodes 21 and 22. However, the present disclosure is not necessarily limited thereto, and the light emitting element 30 may be disposed obliquely without being perpendicular to the extension direction of the electrodes 21 and 22.

The light emitting elements 30 disposed in each sub-pixel SPXn may include a light emitting layer ('36' in FIG. 9) including different materials to emit light of different wavelength bands. Accordingly, light of the first color, light of the second color, and light of the third color may be emitted from the first sub-pixel SPX1, the second sub-pixel SPX2, and the third sub-pixel SPX3 shown in FIG. 4, respectively. However, the present disclosure is not necessarily limited thereto, and the sub-pixels SPXn may include the light emitting elements 30 of the same type to emit light of substantially the same color.

Between the first banks BNL1, the light emitting element 30 may have both ends respectively disposed above the electrodes 21 and 22. The extension length of the light emitting element 30 may be longer than the distance between the first electrode 21 and the second electrode 22, and both ends of the light emitting element 30 may respectively overlap the first electrode 21 and the second electrode 22. For example, the light emitting element 30 may be disposed such that one end is placed above the first electrode 21 and the other end is placed above the second electrode 22.

The light emitting element 30 may have a plurality of layers disposed in a direction parallel to the top surface of the first substrate 11 or the first planarization layer 19. The light emitting element 30 may have one extension direction is parallel to the top surface of the first planarization layer 19, and the plurality of semiconductor layers included in the light emitting element 30 may be sequentially arranged along a direction parallel to the top surface of the first planarization layer 19. However, the present disclosure is not necessarily limited thereto, and when the light emitting element 30 has a different structure, the plurality of semiconductor layers may be disposed in a direction perpendicular to the top surface of the first planarization layer 19.

The both ends of the light emitting element 30 may be in contact with respective connection electrodes CNE1 and CNE2. For example, in the light emitting element 30, an insulating layer 38 in FIG. 9 might not be formed on an end surface of the light emitting element 30 on the side of one extension direction, a portion of the semiconductor layer may be exposed, and the exposed semiconductor layer may be in contact with the connection electrodes CNE1 and CNE2. However, the present disclosure is not necessarily limited thereto, and at least a portion of the insulating layer 38 may be removed from the light emitting element 30 to partially expose the side surfaces at both ends of the semiconductor layers. The exposed side surfaces of the semiconductor layer may be in direct contact with the connection electrodes CNE1 and CNE2.

The second insulating layer PAS2 may be partially disposed on the light emitting element 30. For example, the second insulating layer PAS2 may have a width that is smaller than the length of the light emitting element 30 and be disposed on the light emitting element 30 to expose both ends of the light emitting element 30 while surrounding the light emitting element 30. During the manufacturing process of the display device 10, the second insulating layer PAS2 may cover the light emitting element 30, the electrodes 21 and 22, and the first insulating layer PAS1 and then may be partially removed to expose both ends of the light emitting element 30. The second insulating layer PAS2 may extend in the second direction DR2 on the first insulating layer PAS1 in a plan view, thereby forming a linear or island-like pattern in each sub-pixel SPXn. The second insulating layer PAS2 may protect the light emitting element 30 while fixing the light emitting element 30 during the manufacturing process of the display device 10.

The plurality of connection electrodes CNE1 and CNE2 may be disposed on the second insulating layer PAS2. The plurality of connection electrodes CNE1 and CNE2 may have a shape extending in one direction and may be disposed on each of the electrodes 21 and 22. The connection electrodes CNE1 and CNE2 may include a first connection electrode CNE1 disposed on the first electrode 21 and a second connection electrode CNE2 disposed on the second electrode 22. The connection electrodes CNE1 and CNE2 may be spaced apart from each other or to face each other. For example, the first connection electrode CNE1 and the second connection electrode CNE2 may be disposed on the first electrode 21 and the second electrode 22, respectively, so as to be spaced apart from each other in the first direction DR1. Each of the connection electrodes CNE1 and CNE2 may form a stripe pattern in the emission area EMA of each sub-pixel SPXn.

The plurality of connection electrodes CNE1 and CNE2 may each be in contact with the light emitting element 30.

The first connection electrode CNE1 may be in contact with one end of the light emitting element 30, and the second connection electrode CNE2 may be in contact with the other end of the light emitting element 30. The semiconductor layer of the light emitting element 30 may be exposed on both end surfaces of the light emitting element 30 in an extension direction, and each of the connection electrodes CNE1 and CNE2 may be in contact with the semiconductor layer of the light emitting element 30 to be electrically connected thereto. One side of each of the connection electrodes CNE1 and CNE2 that is in contact with either end of the light emitting element 30 may be disposed on the second insulating layer PAS2. In addition, the first connection electrode CNE1 may be in contact with the first electrode 21 through the first opening OP1 exposing a portion of the top surface of the first electrode 21, and the second connection electrode CNE2 may be in contact with the second electrode 22 through the first opening OP1 exposing a portion of the top surface of the second electrode 22.

Each of the connection electrodes CNE1 and CNE2 may have a width measured in one direction that is less than a width measured in the one direction of each of the electrodes 21 and 22. The connection electrodes CNE1 and CNE2 may be disposed not only to contact one end and the other end of the light emitting element 30, respectively, but also cover a portion of the top surface of the first electrode 21 and a portion of the top surface of the second electrode 22, respectively. However, the present disclosure is not necessarily limited thereto, and the connection electrodes CNE1 and CNE2 may have a width that is greater than the width of the electrodes 21 and 22 covering both sides of the electrodes 21 and 22.

The connection electrodes CNE1 and CNE2 may include a transparent conductive material. For example, they may include ITO, IZO, ITZO, aluminum (Al), or the like. The light emitted from the light emitting element 30 may pass through the connection electrodes CNE1 and CNE2 and travel toward the electrodes 21 and 22. However, the present disclosure is not necessarily limited thereto.

In the drawing, two connection electrodes CNE1 and CNE2 are disposed in one sub-pixel SPXn, but the present disclosure is not necessarily limited thereto. The number of the connection electrodes CNE1 and CNE2 may vary depending on the number of the electrodes 21 and 22 disposed for each sub-pixel SPXn.

A third insulating layer PAS3 may be entirely disposed in the display area DPA of the first substrate 11. The third insulating layer PAS3 may protect the members disposed on the first substrate 11 against the external environment. However, the third insulating layer PAS3 may be omitted.

Each of the first insulating layer PAS1, the second insulating layer PAS2 and the third insulating layer PAS3 described above may include an inorganic insulating material or an organic insulating material. For example, the first insulating layer PAS1, the second insulating layer PAS2 and the third insulating layer PAS3 may include an inorganic insulating material such as silicon oxide (SiOx), silicon nitride (SiNx), silicon oxynitride (SiOxNy), aluminum oxide (Al2O3), aluminum nitride (AlN), and the like. Alternatively, they may include an organic insulating material such as acrylic resin, epoxy resin, phenolic resin, polyamide resin, polyimide resin, unsaturated polyester resin, polyphenylene resin, polyphenylenesulfide resin, benzocyclobutene, cardo resin, siloxane resin, silsesquioxane resin, polymethylmethacrylate, polycarbonate, polymethylmethacrylate-polycarbonate synthetic resin, and the like. However, the present disclosure is not necessarily limited thereto.

The display element layer disposed in the display area DPA may include the first electrode 21, the second electrode 22, the light emitting element 30, and the connection electrodes CNE1 and CNE2 to emit light in a specific wavelength band. The external devices EXD that transmit a driving signal for driving each sub-pixel SPXn may be mounted in the pad area PDA. The external device EXD may be, for example, an anisotropic conductive film. The external device EXD may be connected to the wiring pad WPD of the pad area PDA, and the external device EXD and the pad electrodes may be electrically connected to each other through conductive balls. The conductive balls need to be uniformly dispersed in the pad area PDA. When the conductive balls aggregate between the pad electrodes, the adjacent pad electrodes may be shorted to each other, so that a driving failure may occur.

Hereinafter, the wiring pad WPD, the dummy pad WDD, and the pad electrodes PAR1, PAR2, PAU1, and PAU2 disposed in the pad area PDA to prevent defects due to the aggregation of conductive balls according to an embodiment will be described.

Referring to FIGS. 6 and 7 in conjunction with FIG. 5, the wiring pad WPD and the dummy pad WDD are disposed on the second interlayer insulating layer 17 of the pad area PDA. The wiring pad WPD and the dummy pad WDD may be disposed on the same layer as the second data conductive layer. Each of the wiring pad WPD and the dummy pad WDD may extend in the second direction DR2 and may be spaced apart from each other in the first direction DR1. The wiring pad WPD and the dummy pad WDD may be disposed parallel to each other and may have the same length in the second direction DR2. However, the present disclosure is not necessarily limited thereto, and the length of the dummy pad WDD may also be shorter than the length of the wiring pad WPD.

The wiring pad WPD and the dummy pad WDD may form a pair and may be formed repeatedly in the first direction DR1. For example, the wiring pad WPD, the dummy pad WDD, the wiring pad WPD, and the dummy pad WDD may be alternately disposed in the first direction DR1. However, the present disclosure is not necessarily limited thereto, and two dummy pads WDD may also be disposed between the two wiring pads WPD.

Each of the wiring pad WPD and the dummy pad WDD may have a width in the first direction DR1. In an embodiment, a width W1 of the wiring pad WPD may be greater than a width W2 of the dummy pad WDD. The wiring pad WPD may be connected to a signal wire extending from the display area DPA, for example, the above-described data line, voltage lines, sensing line, or the like to directly transmit a signal. Accordingly, the wiring pad WPD may have a large width in consideration of resistance. The dummy pad WDD is a pad to which a signal is not transmitted to the display area DPA, and there is no need to consider resistance, and thus may have a width that is smaller than that of the wiring pad WPD in consideration of the area of the pad area PDA.

As described above, the wiring pad WPD is a pad to which a signal from the external device EXD is inputted and which transmits a signal to the display area DPA, and the dummy pad WDD does not transmit a signal to the display area DPA. Accordingly, the dummy pad WDD is not connected to any wire extending from the display area DPA other than the pad electrodes PAR2 and PAU2.

A first pad electrode base layer PAR1 and the first pad electrode upper layer PAU1 may be disposed on the wiring pad WPD. In an embodiment, the first pad electrode base layer PAR1 may be disposed on the wiring pad WPD, and the first pad electrode upper layer PAU1 may be disposed on the first pad electrode base layer PAR1.

The first pad electrode base layer PAR1 may be directly disposed on the first planarization layer 19 disposed on the wiring pad WPD. In an embodiment, the first pad electrode base layer PAR1 may overlap the wiring pad WPD, and may be connected to the wiring pad WPD through a first through hole CH1 penetrating the first planarization layer 19. The first pad electrode base layer PAR1 may have a width that is smaller than that of the wiring pad WPD and may be directly in contact with the wiring pad WPD.

The second pad electrode base layer PAR2 and the second pad electrode upper layer PAU2 may be disposed on the dummy pad WDD. In an embodiment, the second pad electrode base layer PAR2 may be disposed on the dummy pad WDD, and the second pad electrode upper layer PAU2 may be disposed on the second pad electrode base layer PAR2.

The second pad electrode base layer PAR2 may be directly disposed on the first planarization layer 19 disposed on the dummy pad WDD. The second pad electrode base layer PAR2 may be disposed on the same layer as the first pad electrode base layer PAR1 and may be spaced apart from each other in the first direction DR1. Each of the second pad electrode base layer PAR2 and the first pad electrode base layer PAR1 may extend in the second direction DR2 and may be disposed in parallel with each other.

In an embodiment, the second pad electrode base layer PAR2 may overlap the dummy pad WDD, and may be connected to the dummy pad WDD through a second through hole CH2 penetrating the first planarization layer 19. The second pad electrode base layer PAR2 may have a width that is greater than that of the dummy pad WDD and may be directly in contact with the dummy pad WDD.

According to an embodiment, the first pad electrode base layer PAR1 and the second pad electrode base layer PAR2 may be formed in the same process as the electrodes 21 and 22 of the display area DPA and may include the same material as the electrodes 21 and 22 of the display area DPA. The electrodes 21 and 22 may be formed in the display area DPA in a process after the first bank BNL1 is formed. The first bank BNL1 might not be disposed in the pad area PDA, and a subsequent process may also be performed while the wiring pad WPD and the dummy pad WDD are exposed during the manufacturing process of the display device 10. The first pad electrode base layer PAR1 and the second pad electrode base layer PAR2 may be formed in the same process as the electrodes 21 and 22 and disposed on the wiring pad WPD and the dummy pad WDD.

The wiring pad WPD and the dummy pad WDD may be disposed on the same layer as the second data conductive layer and may include the same material as the second data conductive layer, for example, a metal material such as copper (Cu). The electrodes 21 and 22 and the pad electrode base layers PAR1 and PAR2 may include a metal material having high reflectivity, for example, a metal such as aluminum (Al). The pad electrode base layers PAR1 and PAR2 may electrically connect the external device EXD to the wiring pad WPD and the dummy pad WDD together with the pad electrode upper layers PAU1 and PAU2.

The first insulating layer PAS1 may be disposed not only in the display area DPA but also in the pad area PDA. The first insulating layer PAS1 may be disposed on the first pad electrode base layer PAR1 and the second pad electrode base layer PAR2 and may cover them, and may include a pad opening OP2 exposing a portion of the top surface of each of the first pad electrode base layer PAR1 and the second pad electrode base layer PAR2. In addition, in an embodiment, the first insulating layer PAS1 may expose not only a portion of the top surface of each of the first pad electrode base layer PAR1 and the second pad electrode base layer PAR2, but also the top surface of the first planarization layer 19 disposed between the first pad electrode base layer PAR1 and the second pad electrode base layer PAR2.

The pad electrode upper layers PAU1 and PAU2 may be disposed on the first insulating layer PAS1. The pad electrode upper layers PAU1 and PAU2 may include the first pad electrode upper layer PAU1 disposed on the first pad electrode base layer PAR1 and the second pad electrode upper layer PAU2 disposed on the second pad electrode base layer PAR2.

The first pad electrode upper layer PAU1 may cover a portion of the pad opening OP2 of the first insulating layer PAS1, and may be directly in contact with at least a portion of the top surface of the first pad electrode base layer PAR1 exposed by the pad opening OP2. The first pad electrode upper layer PAU1 may have the same width as or greater than the width of the first pad electrode base layer PAR1. The first pad electrode upper layer PAU1 together with the first pad electrode base layer PAR1 may constitute a pad electrode of the wiring pad WPD, and may electrically connect the external device EXD to the wiring pad WPD. The external device EXD may be connected to the first pad electrode upper layer PAU1 through a conductive material such as a conductive ball.

The second pad electrode upper layer PAU2 may cover another portion of the pad opening OP2 of the first insulating layer PAS1, and may be directly in contact with at least a portion of the top surface of the second pad electrode base layer PAR2 exposed by the pad opening OP2. The second pad electrode upper layer PAU2 may have a width equal to or greater than the width of the second pad electrode base layer PAR2. The second pad electrode upper layer PAU2, together with the second pad electrode base layer PAR2, may constitute a pad electrode of the dummy pad WDD, and may electrically connect the external device EXD to the dummy pad WDD. The external device EXD may be connected to the second pad electrode upper layer PAU2 through a conductive material such as a conductive ball.

The first pad electrode upper layer PAU1 and the second pad electrode upper layer PAU2 may be spaced apart from each other in the first direction DR1, and may extend in the second direction DR2 to be disposed in parallel with each other. An interval between the first pad electrode upper layer PAU1 and the second pad electrode upper layer PAU2 spaced apart in the first direction DR1 may be the same as an interval between the first pad electrode base layer PAR1 and the second pad electrode base layer PAR2 spaced apart in the first direction DR1. However, the present disclosure is not necessarily limited thereto, and an interval between the first pad electrode upper layer PAU1 and the second pad electrode upper layer PAU2 spaced apart in the first direction DR1 may also be greater than an interval between the first pad electrode base layer PAR1 and the second pad electrode base layer PAR2 spaced apart in the first direction DR1.

According to an embodiment, the first pad electrode upper layer PAU1 and the second pad electrode upper layer PAU2 may be formed in the same process as the connection electrodes CNE1 and CNE2 of the display area DPA and may include the same material as that of the connection electrodes CNE1 and CNE2. The connection electrodes CNE1 and CNE2 may be formed in the display area DPA in a process after the first insulating layer PAS1 is formed. The first insulating layer PAS1 may be disposed over the display area DPA and the pad area PDA, and may cover at least a portion of the electrodes 21 and 22 and the pad electrode base layers PAR1 and PAR2. Since the first pad electrode upper layer PAU1 and the second pad electrode upper layer PAU2 may be formed in the same process together with the connection electrodes CNE1 and CNE2, the number of manufacturing process steps for forming the pad electrode may be reduced.

In an embodiment, the first pad electrode upper layer PAU1 and the second pad electrode upper layer PAU2 may include ITO, IZO, ITZO, aluminum (Al), or the like, in the same way as the connection electrodes CNE1 and CNE2. The display device 10 may simultaneously form some layers in the display area DPA and the pad area PDA by merging some processes during the manufacturing process. In particular, as the pad electrode of the pad area PDA is formed using layers disposed on the display element layer of the display area DPA, a complicated manufacturing process after the circuit layer may be simplified.

As described above, on the pad area PDA, the external device EXD may be electrically connected to the pad electrodes PAR1, PAR2, PAU1, and PAU2 of the pad area PDA through conductive balls.

Referring to FIG. 8, the external device EXD may be bonded and disposed on the pad area PDA of the first substrate 11. The external device EXD may be a flexible printed circuit board provided with a driving IC. The external device EXD may include a plurality of circuit wires CFC. The plurality of circuit wires CFC may correspond one-to-one to the wiring pads WPD of the pad area PDA. The plurality of circuit wires CFC may extend in the second direction DR2 like the wiring pad WPD and may be spaced apart from each other in the first direction DR1.

A plurality of conductive balls COB and a non-conductive layer NCF may be disposed between the first substrate 11 of the pad area PDA and the external device EXD. The conductive ball COB may be in contact with the circuit wire CFC of the external device EXD and each of the first and second pad electrode upper layers PAU1 and PAU2 of the pad area PDA to electrically connect them. The conductive balls COB may be dispersed in the non-conductive layer NCF, and may be distributed in large numbers in some portions and in small numbers in some portions. For example, in an area in which the conductive balls COB are distributed in large numbers, the conductive balls COB are aggregated, so that the first and second pad electrode upper layers PAU1 and PAU2 and the circuit wire CFC of the external device EXD might not be connected one-to-one but may be connected one-to-many, or many-to-one, or many-to-many. Conversely, in an area in which the conductive balls COB are distributed in small numbers, an area in which the conductive ball COB does not exist occurs, so that the first and second pad electrode upper layers PAU1 and PAU2 and the circuit wire CFC might not be electrically connected. Accordingly, the distribution of the conductive balls COB might not be uniform, so that a driving failure may occur.

In the present embodiment, the conductive balls COB are aligned on the first and second pad electrode upper layers PAU1 and PAU2 using a dielectrophoresis method as in the manufacturing method to be described later, so that the first and second pad electrode upper layers PAU1 and PAU2 and the circuit wire CFC may be well connected.

The above-described conductive ball COB may be a particle having a size of several hundred nanometers whose surface is insulated. The conductive ball COB may include a conductive layer BC and a capping layer BIN surrounding the conductive layer BC. The conductive layer BC of the conductive ball COB may be conductive particles such as nickel, gold, platinum, or copper. The capping layer BIN may be made of a polymer or the like such as styrene or acryl. The particle diameter of the conductive ball COB may be 1 μm to 10 μm, preferably 2 μm to 5 μm. However, the present disclosure is not necessarily limited thereto, and a plurality of conductive layers and a plurality of capping layers may also be alternately disposed in the conductive ball COB.

The conductive ball COB may be applied together with the non-conductive layer NCF on the external device EXD and aligned on the pad area PDA. In addition, when the external device EXD is pressurized with high heat, the capping layer BIN on the surface of the conductive ball COB bursts and the conductive layer BC inside is exposed, and thus conductivity is exhibited. Accordingly, the conductive ball COB may have both insulating and conductive properties.

The non-conductive layer NCF in which the conductive balls COB are dispersed may be disposed between the external device EXD and the first substrate 11. The non-conductive layer NCF is not electrically conductive, for example, an insulating adhesive, and may include a thermosetting resin and/or a thermoplastic resin. Examples of the thermosetting resin include bisphenol A type epoxy resin, bisphenol F type epoxy resin, novolak type epoxy resin, phenolic resin, urea resin, melamine resin, unsaturated polyester resin, resorcinol resin, or the like, but are not necessarily limited thereto. Examples of the thermoplastic resin include saturated polyester resin, vinyl resin, acrylic resin, polyolefin resin, polyvinyl acetate (PVA) resin, polycarbonate resin, cellulose resin, ketone resin, styrene resin, and the like, but are not necessarily limited thereto.

In an embodiment, a portion of the conductive ball COB may be directly in contact with the circuit wire CFC of the external device EXD, and the other portion of the conductive ball COB may be directly in contact with the first pad electrode upper layer PAU1 and the second pad electrode upper layer PAU2 of the pad area PDA. Accordingly, the circuit wire CFC of the external device EXD may be electrically connected to the first pad electrode upper layer PAU1 and the second pad electrode upper layer PAU2 by the conductive ball COB. The conductive ball COB may overlap the first pad electrode upper layer PAU1 and the second pad electrode upper layer PAU2 of the pad area PDA, and may also overlap the first pad electrode base layer PAR1 and the second pad electrode base layer PAR2 of the pad area PDA.

The non-conductive layer NCF may be in contact with the bottom surface of the external device EXD and the circuit wire CFC, and may be in contact with the first pad electrode upper layer PAU1, the second pad electrode upper layer PAU2, and the third insulating layer PAS3 of the pad area PDA. The non-conductive layer NCF may serve as an adhesive to adhere and fix the external device EXD to the pad area PDA of the first substrate 11.

In an embodiment, a signal applied through the circuit wire CFC of the external device EXD is transmitted to the first pad electrode upper layer PAU1 and the second pad electrode upper layer PAU2 by the conductive ball COB. In this case, the signal transmitted to the first pad electrode upper layer PAU1 may be transmitted to the wire of the display area DPA through the first pad electrode base layer PAR1 and the wiring pad WPD. The signal transmitted to the second pad electrode upper layer PAU2 is transmitted to the second pad electrode base layer PAR2 and the dummy pad WDD, but the dummy pad WDD is not connected to other wires, so that the signal is not transmitted. In the present embodiment, the dummy pad WDD may be disposed between the respective wire pads WPD to prevent signal interference between the wire pads WPD.

The display device 10, according to an embodiment, aligns the conductive ball COB on the pad electrode upper layers PAU1 and PAU2 using a dielectrophoresis method and thus enables the pad electrode upper layers PAU1 and PAU2 and the circuit wire CFC to be well connected. Accordingly, a short circuit due to the aggregation of the conductive ball COB between the adjacent circuit wires CFC or the adjacent pad electrode upper layers PAU1 and PAU2 may be prevented, and a driving failure may be prevented.

In addition, according to an embodiment, the display device 10 may be formed such that some layers disposed in the display area DPA and the pad area PDA are merged through the same process, and a complicated manufacturing process may be simplified. In particular, in the pad area PDA, the pad electrodes PAR1, PAR2, PAU1, and PAU2 including the same material as the connection electrodes CNE1 and CNE2 and formed at the same time as the connection electrodes CNE1 and CNE2 and the electrodes 21 and 22 of the display area DPA may be disposed, so that a separate pad electrode forming process for connection with the external device EXD may be omitted. The display device 10 may have a novel pad electrode structure by including the light emitting element 30, and a manufacturing process may be simplified.

Figure 9:
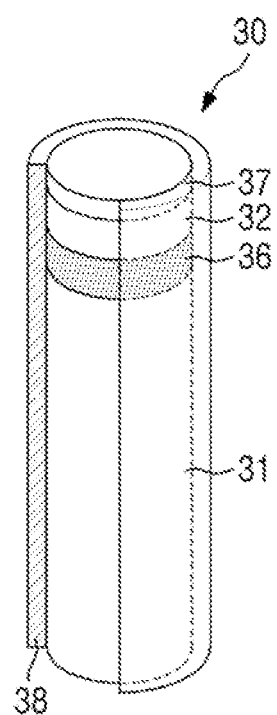
FIG. 9 is a schematic diagram of a light emitting element according to an embodiment.

FIG. 9 is a schematic diagram of a light emitting element according to an embodiment.

The light emitting element 30 may be a light emitting diode. For example, the light emitting element 30 may be an inorganic light emitting diode that has a micrometer or nanometer size, and is made of an inorganic material. The inorganic light emitting diode may be aligned between two electrodes having polarity when an electric field is formed in a specific direction between two electrodes opposing each other. The light emitting element 30 may be aligned between two electrodes by the electric field generated between the electrodes.

The light emitting element 30, according to an embodiment, may have a shape extending in one direction. The light emitting element 30 may have a shape of a cylinder, a rod, a wire, a tube, or the like. However, the shape of the light emitting element 30 is not necessarily limited thereto, and the light emitting element 30 may have a polygonal prism shape such as a regular cube, a rectangular parallelepiped and a hexagonal prism, or may have various shapes such as a shape extending in one direction and having an outer surface partially inclined. A plurality of semiconductors included in the light emitting element 30 to be described later may have a structure in which they are sequentially arranged or stacked along the one direction.

The light emitting element 30 may include a semiconductor layer doped with any conductivity type (e.g., p-type or n-type) impurities. The semiconductor layer may emit light of a specific wavelength band by receiving an electrical signal applied from an external power source.

Referring to FIG. 9, the light emitting element 30 may include a first semiconductor layer 31, a second semiconductor layer 32, a light emitting layer 36, an electrode layer 37, and an insulating film 38.

The first semiconductor layer 31 may be an n-type semiconductor. When the light emitting element 30 emits light of a blue wavelength band, the first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of n-type doped AlGaInN, GaN, AlGaN, InGaN, AlN and InN. The first semiconductor layer 31 may be doped with an n-type dopant, and the n-type dopant may be Si, Ge, Sn, Se, or the like. For example, the first semiconductor layer 31 may be n-GaN doped with n-type Si. The length of the first semiconductor layer 31 may have a range of 1.5 mm to 5 mm, but is not necessarily limited thereto.

The second semiconductor layer 32 is disposed on the light emitting layer 36 to be described later. The second semiconductor layer 32 may be a p-type semiconductor. When the light emitting element 30 emits light of a blue or green wavelength band, the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, it may be any one or more of p-type doped AlGaInN, GaN, AlGaN, InGaN, AlN and InN. The second semiconductor layer 32 may be doped with a p-type dopant, and the p-type dopant may be Mg, Zn, Ca, Ba, or the like. For example, the second semiconductor layer 32 may be p-GaN doped with p-type Mg. The length of the second semiconductor layer 32 may have a range of 0.05 mm to 0.10 mm, but is not necessarily limited thereto.

Although it is illustrated in the drawing that the first semiconductor layer 31 and the second semiconductor layer 32 are configured as one layer, the present disclosure is not necessarily limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 is disposed between the first semiconductor layer 31 and the second semiconductor layer 32. The light emitting layer 36 may include a material having a single or multiple quantum well structure. When the light emitting layer 36 includes a material having a multiple quantum well structure, a plurality of quantum layers and well layers may be alternately stacked. The light emitting layer 36 may emit light by coupling of electron-hole pairs according to an electrical signal applied through the first semiconductor layer 31 and the second semiconductor layer 32. When the light emitting layer 36 emits light of a blue wavelength band, a material such as AlGaN or AlGaInN may be included. In particular, when the light emitting layer 36 has a multiple quantum well structure in which quantum layers and well layers are alternately stacked, the quantum layer may include a material such as AlGaN or AlGaInN, and the well layer may include a material such as GaN or AlInN. For example, as described above, the light emitting layer 36 may include AlGaInN as a quantum layer and AlInN as a well layer, and the light emitting layer 36 may emit blue light having a central wavelength band of 450 nm to 495 nm.

However, the present disclosure is not necessarily limited thereto, and the light emitting layer 36 may have a structure in which semiconductor materials having large band gap energy and semiconductor materials having small band gap energy are alternately stacked, and may include other group III to V semiconductor materials according to the wavelength band of the emitted light. The light emitted by the light emitting layer 36 is not necessarily limited to the light of the blue wavelength band, but the light emitting layer 36 may also emit light of a red or green wavelength band in some cases. The length of the light emitting layer 36 may have a range of 0.05 mm to 0.10 mm, but is not necessarily limited thereto.

Light emitted from the light emitting layer 36 may be emitted to both side surfaces as well as the outer surface of the light emitting element 30 in a longitudinal direction. The directionality of light emitted from the light emitting layer 36 is not necessarily limited to one direction.

The electrode layer 37 may be an ohmic connection electrode. However, the present disclosure is not necessarily limited thereto, and it may be a Schottky connection electrode. The light emitting element 30 may include at least one electrode layer 37. Although FIG. 9 illustrates that the light emitting element 30 includes one electrode layer 37, the present disclosure is not necessarily limited thereto. In some cases, the light emitting element 30 may include a larger number of electrode layers 37. The following description of the light emitting element 30 may be equally applied even if the number of electrode layers 37 is different or other structures are further included.

In the display device 10, according to an embodiment, when the light emitting element 30 is electrically connected to an electrode or a connection electrode, the electrode layer 37 may reduce the resistance between the light emitting element 30 and the electrode or connection electrode. The electrode layer 37 may include a conductive metal. For example, the electrode layer 37 may include aluminum (Al), titanium (Ti), indium (In), gold (Au), silver (Ag), indium tin oxide (ITO), indium zinc oxide (IZO), and/or indium tin zinc oxide (ITZO). Further, the electrode layer 37 may include an n-type or p-type doped semiconductor material. The electrode layer 37 may include the same material or different materials, but is not necessarily limited thereto.

The insulating film 38 at least partially surrounds the outer surfaces of the plurality of semiconductor layers and electrode layers described above. For example, the insulating layer 38 may at least partially surround at least the outer surface of the light emitting layer 36, and may extend in one direction in which the light emitting element 30 extends. The insulating film 38 may protect the members. The insulating layer 38 may at least partially surround side surfaces of the members to expose both ends of the light emitting element 30 in the longitudinal direction.

Although it is illustrated in the drawing that the insulating film 38 extends in the longitudinal direction of the light emitting element 30 and covers the side surface of the light emitting element ED ranging from the first semiconductor layer 31 to the electrode layer 37, the present disclosure is not necessarily limited thereto. The insulating film 38 may include the light emitting layer 36 covering only the outer surfaces of some semiconductor layers, or may cover only a portion of the outer surface of the electrode layer 37 to partially expose the outer surface of each electrode layer 37. Further, in cross-sectional view, the insulating film 38 may have a top surface, which is rounded in a region adjacent to at least one end of the light emitting element 30.

The thickness of the insulating film 38 may have a range of 10 nm to 1.0 mm, but is not necessarily limited thereto. For example, the thickness of the insulating film 38 may be around 40 nm.

The insulating film 38 may include materials having insulating properties, for example, silicon oxide (SiOx), silicon nitride (SiNx), silicon oxynitride (SiOxNy), aluminum nitride (AlN), aluminum oxide (A2O3), and the like. Accordingly, it is possible to prevent an electrical short circuit that may occur when the light emitting layer 36 is in direct contact with the electrode through which the electrical signal is transmitted to the light emitting element 30. In addition, since the insulating film 38 protects the outer surface of the light emitting element 30 including the light emitting layer 36, it is possible to prevent degradation in luminous efficiency.

Further, the insulating film 38 may have an outer surface which is surface-treated. The light emitting elements 30 may be sprayed onto the electrode in a state of being dispersed in a predetermined ink to be aligned. Here, the surface of the insulating film 38 may be treated to have hydrophobic property or hydrophilic property in order to keep the light emitting elements ED in the dispersed state without being aggregated with other adjacent light emitting elements ED in the ink.

The light emitting element 30 may have a length of 1 µm to 10 µm or 2 µm to 6 µm, and, for example, 3 µm to 5 µm. Further, a diameter of the light emitting element 30 may have a range of 30 nm to 700 nm, and an aspect ratio of the light emitting element 30 may be 1.2 to 100. However, the present disclosure is not necessarily limited thereto, and the plurality of light emitting elements 30 included in the display device 10 may have different diameters according to a difference in composition of the light emitting layer 36. Preferably, the diameter of the light emitting element 30 may have a range of about 500 nm.

Hereinafter, a manufacturing process of the display device 10 will be described with reference to other drawings.

FIGS. 10 to 27 are cross-sectional views illustrating the steps of a manufacturing process of a display device according to an embodiment. In the following drawings, a process step of forming each layer of the display area DPA and the pad area PDA will be exemplarily described.

Figure 10:
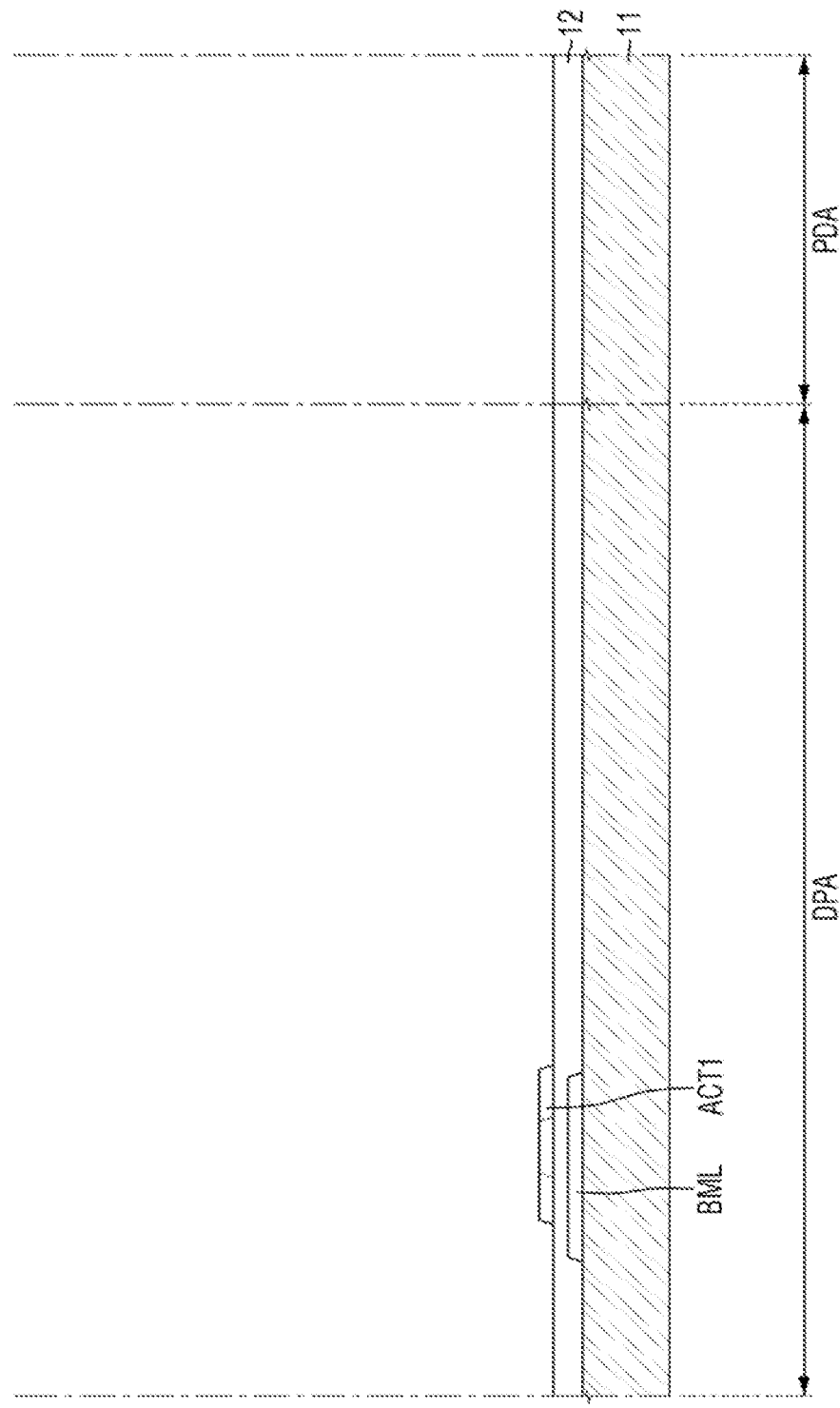
FIGS. 10 to 27 are cross-sectional views illustrating the steps of a manufacturing process of a display device according to an embodiment.

Referring to FIG. 10, first, the light blocking layer BML is formed on the first substrate 11, and the buffer layer 12 and a semiconductor layer disposed thereon are formed. The light blocking layer BML may be formed by a mask process. For example, the light blocking layer BML as illustrated in FIG. 10 may be formed by depositing a material layer for a light blocking layer entirely on the first substrate 11 and then patterning the material layer through a photolithography process.

The buffer layer 12 may be formed by depositing a material layer for a buffer layer entirely on the first substrate 11, and the semiconductor layer may include the active layer ACT1 of the first transistor T1, which may be formed by a mask process. For example, the active layer ACT1 as illustrated in FIG. 10 may be formed by depositing an oxide semiconductor entirely on the buffer layer 12 and then patterning the oxide semiconductor through a photolithography process. Hereinafter, since each layer may be formed by a process similar to the above-described process, and to the extent that a description of an element or step has been omitted, it may be assumed that the element or step is at least similar to a corresponding element or step that has been described elsewhere within the instant disclosure.

Figure 11:
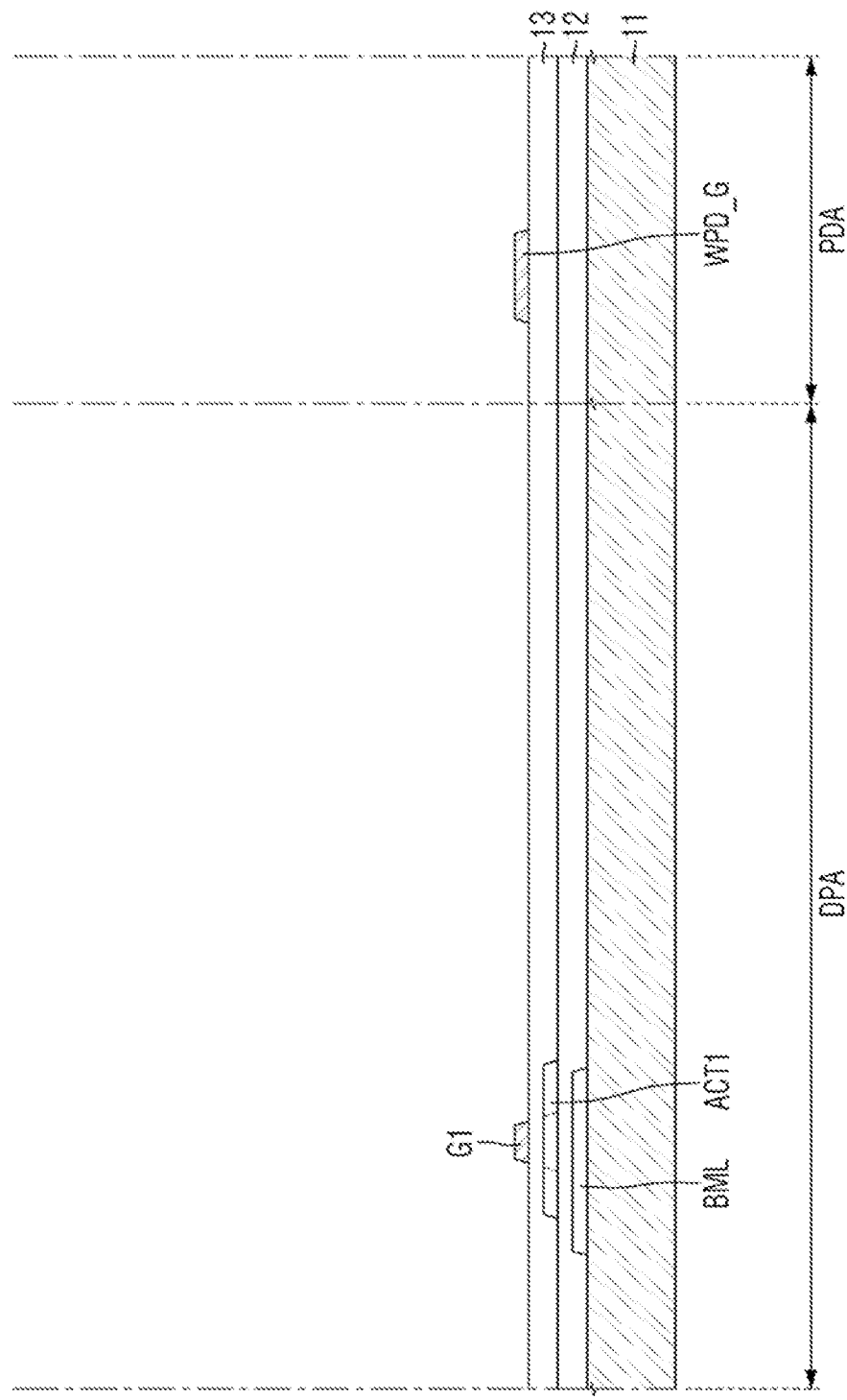

Next, referring to FIG. 11, the first gate insulating layer 13 and a gate conductive layer disposed thereon are formed on the buffer layer 12 on which the semiconductor layer is formed. The gate conductive layer may include the gate electrode G1 disposed in the display area DPA and the gate pad portion WPD_G disposed in the pad area PDA. The first gate insulating layer 13 may be formed by depositing a material layer for a gate insulating layer entirely on the first substrate 11, and the gate conductive layer may be formed by a mask process.

Figure 12:
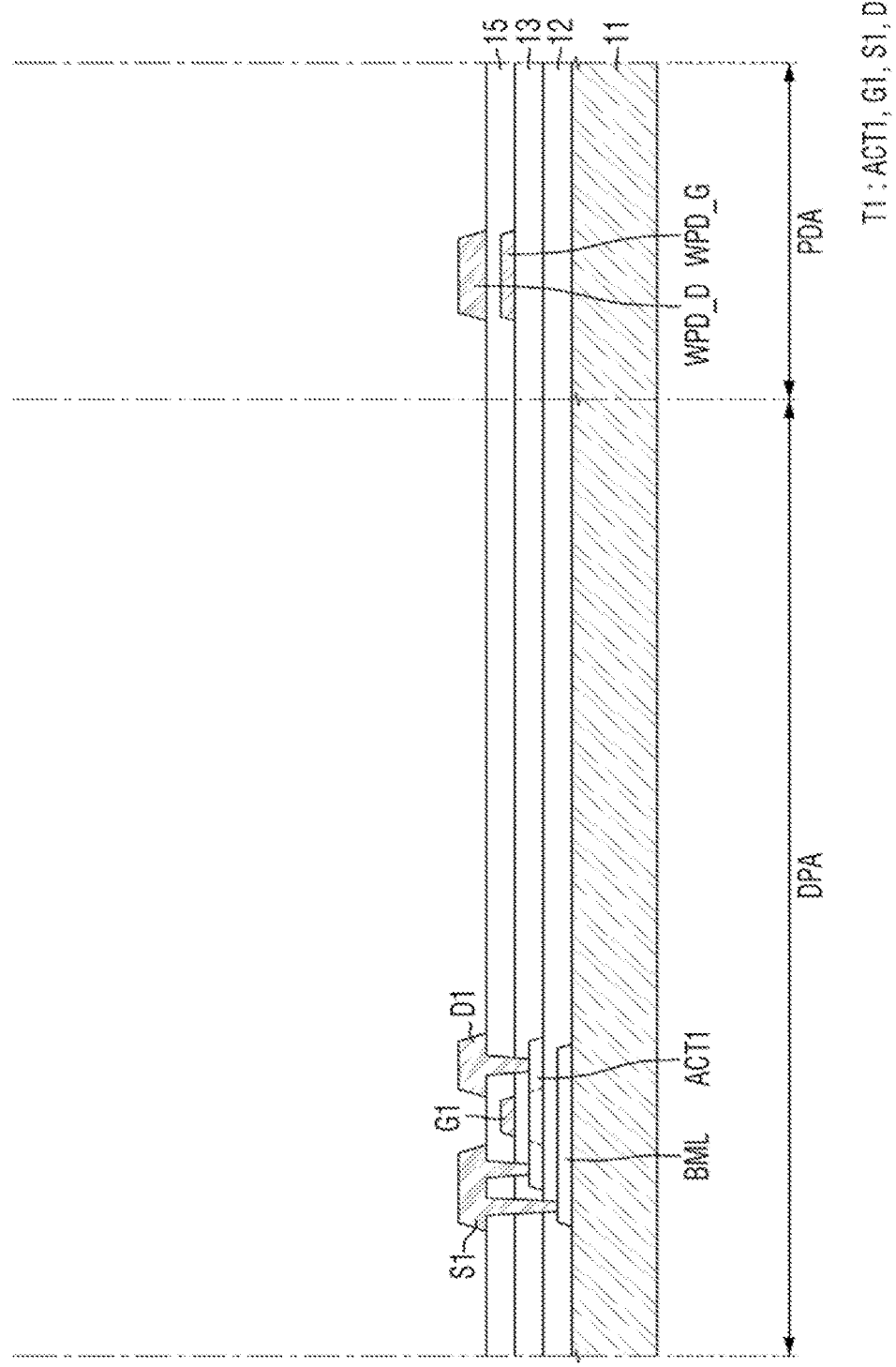

Next, referring to FIG. 12, the first interlayer insulating layer 15 is formed on the first gate insulating layer 13 on which the gate conductive layer is formed, and contact holes exposing the light blocking layer BML and a portion of the semiconductor layer are formed. The first interlayer insulating layer 15 may be formed by depositing a material layer for an interlayer insulating layer entirely, and the contact hole forming process may be formed by a mask process.

Next, a first data conductive layer is formed on the first interlayer insulating layer 15 in which the contact hole is formed. The first data conductive layer may be formed by a mask process. The first data conductive layer may include the source electrode S1 and the drain electrode D1 disposed in the display area DPA, and the data pad portion WPD_D disposed in the pad area PDA. Materials of the first data conductive layer disposed in the display area DPA may be deposited to the inside of the contact hole formed in the first interlayer insulating layer 15 to be connected to the light blocking layer BML or the active layer ACT1.

Figure 13:
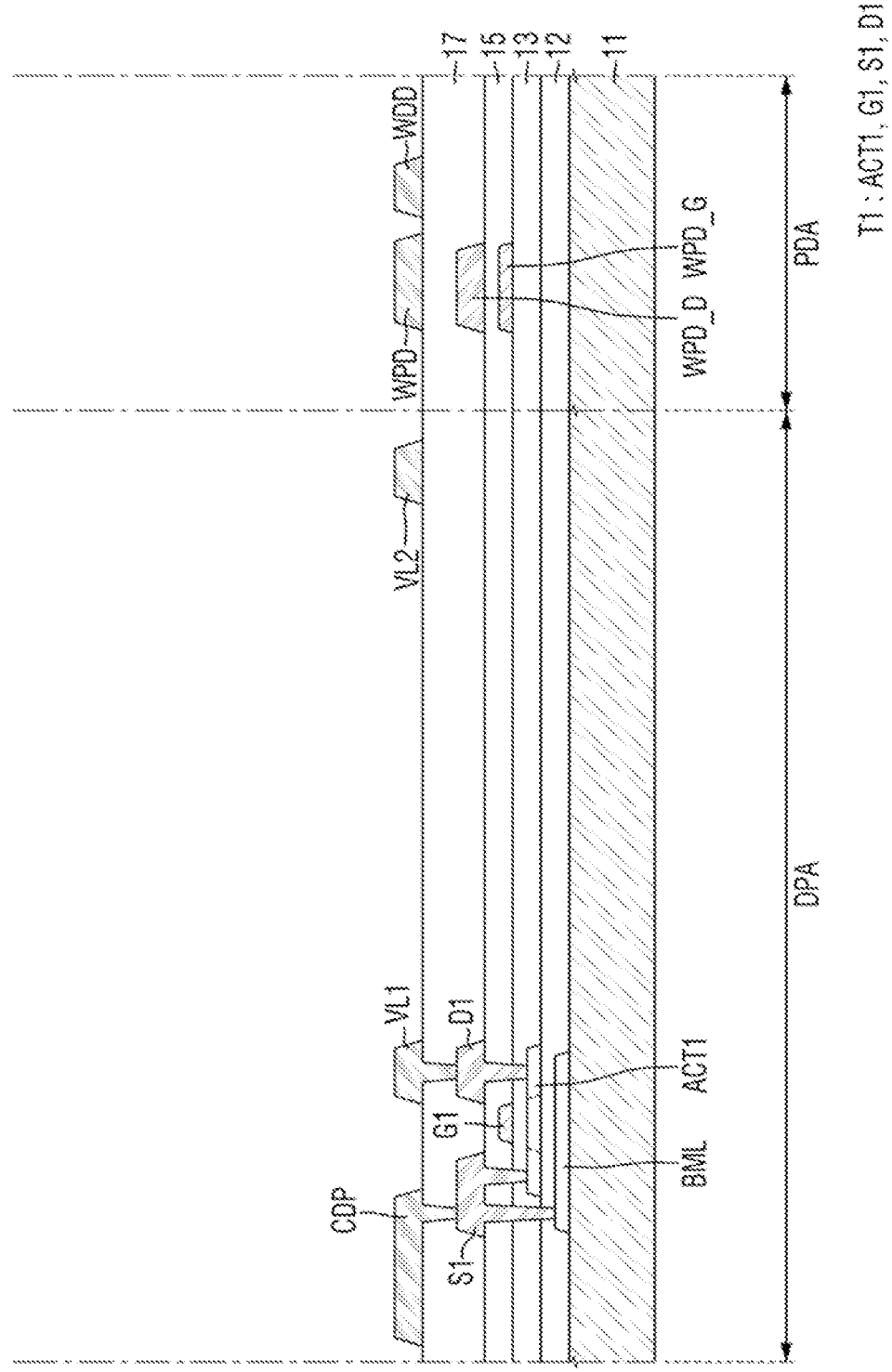

Next, referring to FIG. 13, a second interlayer insulating layer 17 is formed on the first interlayer insulating layer 15 on which the first data conductive layer is formed, and contact holes exposing a portion of the first data conductive layer are formed. The second interlayer insulating layer 17 and the contact holes thereof may be formed in the same manner as the first interlayer insulating layer 15.

Next, a second data conductive layer is formed on the second interlayer insulating layer 17 in which a contact hole is formed. The second data conductive layer may be formed by a mask process. The second data conductive layer may include the voltage lines VL1 and VL2 and the first conductive pattern CDP disposed in the display area DPA, and the wiring pad WPD and the dummy pad WDD disposed in the pad area PDA. Materials of the second data conductive layer disposed in the display area DPA may be deposited to the inside of the contact hole formed in the second interlayer insulating layer 17 to be connected to the first data conductive layer.

Figure 14:
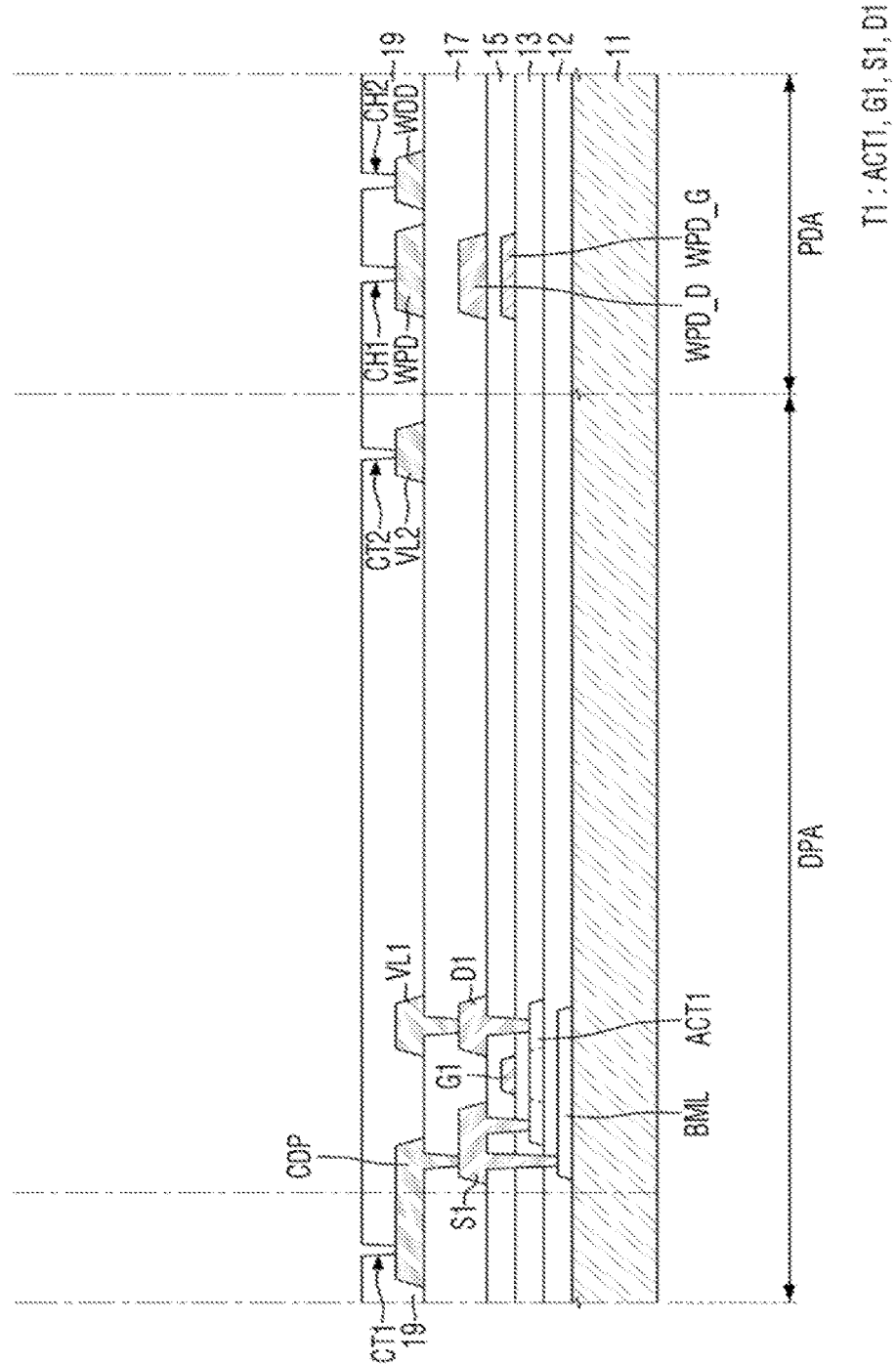

Next, referring to FIGS. 13 and 14, the first planarization layer 19 is formed on the second interlayer insulating layer 17 on which the second data conductive layer is formed. The first planarization layer 19 may include an organic material including a photosensitive material, and may be formed through exposure and development after applying the organic material layer. In the first planarization layer 19, the first contact hole CT1 exposing the first conductive pattern CDP and the second contact hole CT2 exposing the second voltage line VL2 may be formed in the display area DPA. In addition, in the first planarization layer 19, the first through hole CH1 exposing the wiring pad WPD and the second through hole CH2 exposing the dummy pad WDD may be formed in the pad area PDA.

Figure 15:
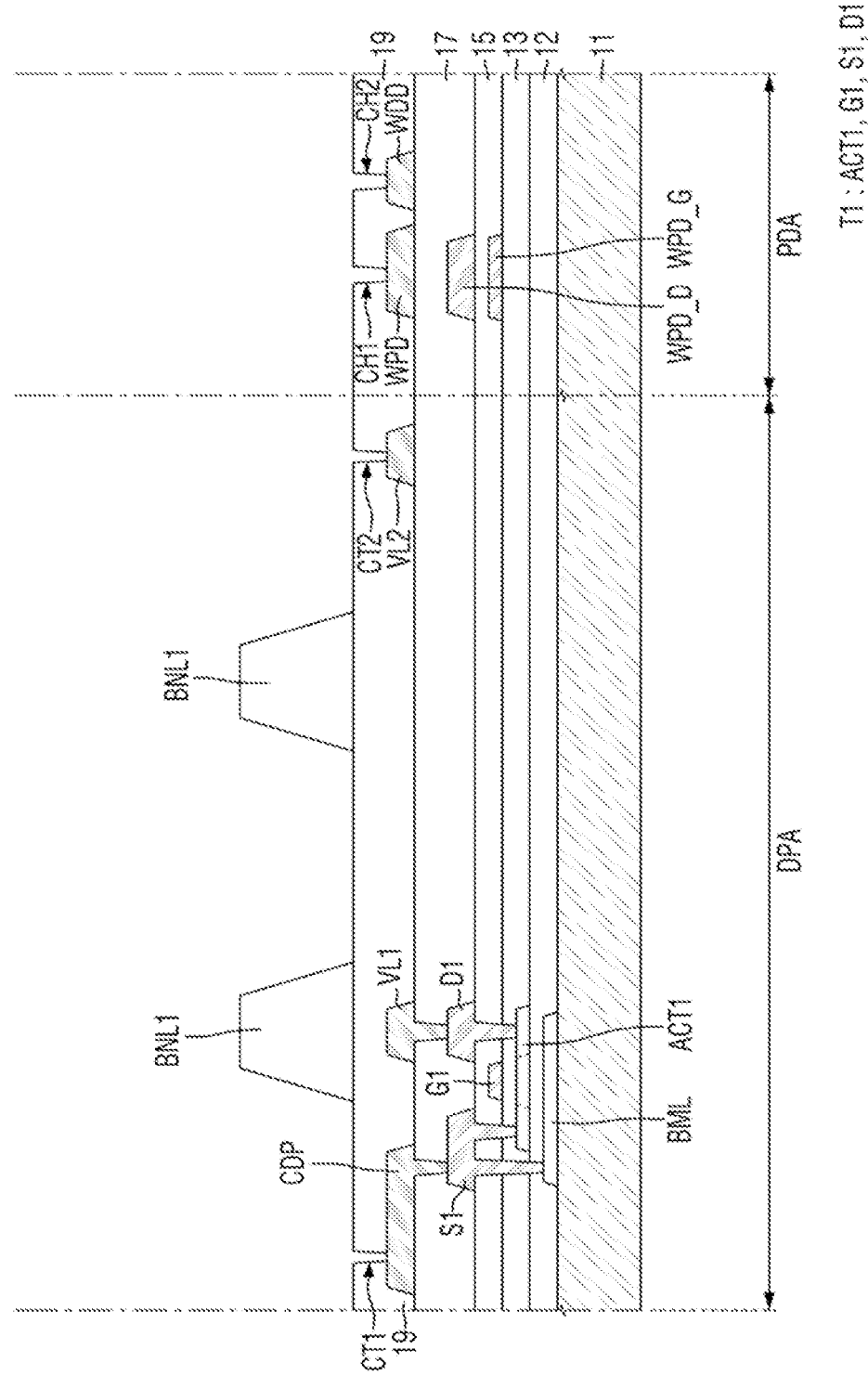

Next, referring to FIG. 15, the first banks BNL1 are formed on the first planarization layer 19 of the display area DPA. The first bank BNL1 may include an organic material including a photosensitive material, and may be formed through exposure and development after applying an organic material layer. The first bank BNL1 might not be formed in the pad area PDA.

Figure 16:
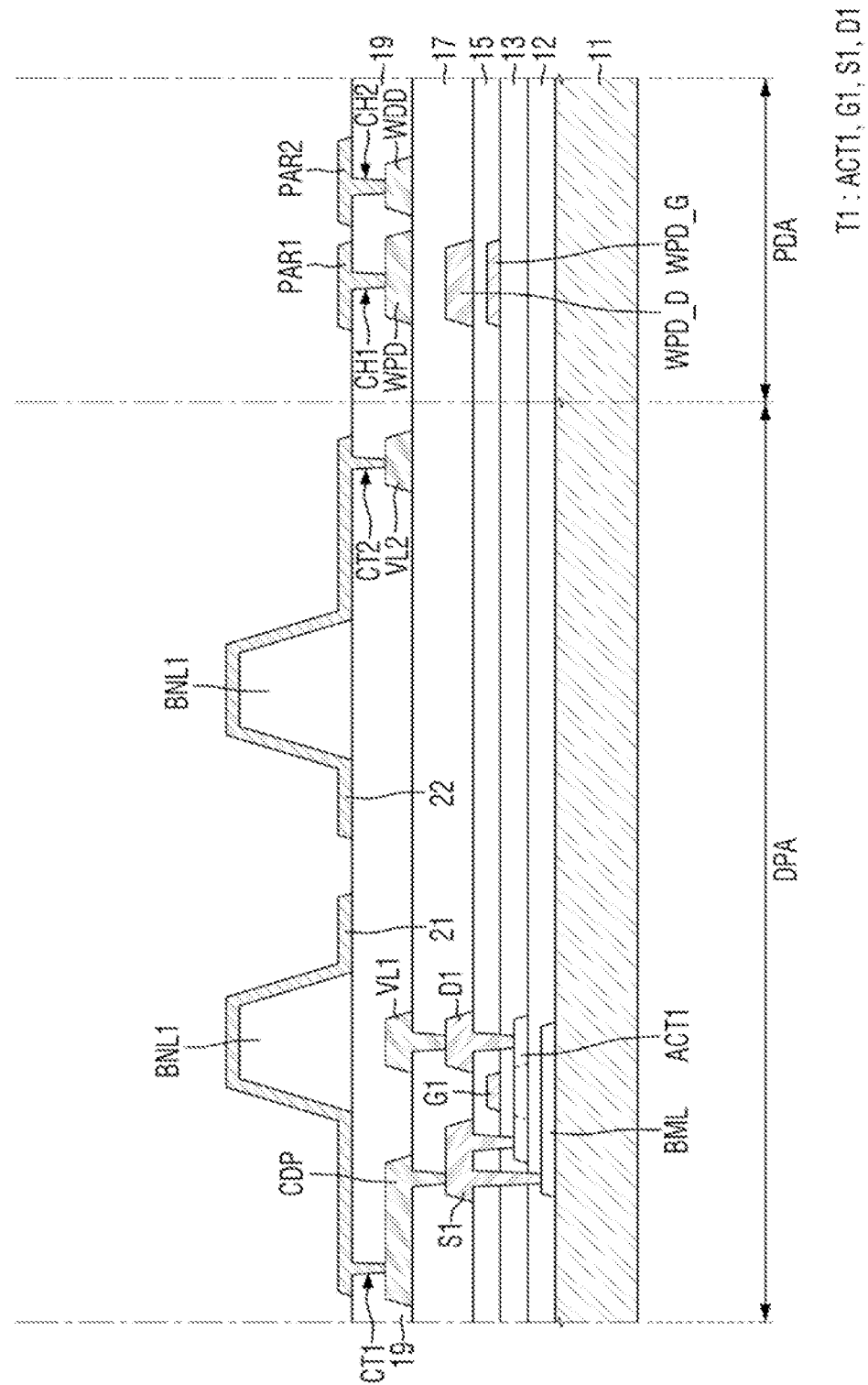

Next, referring to FIG. 16, the first electrode 21 and the second electrode 22 are formed on the display area DPA of the first planarization layer 19, and the first pad electrode base layer PAR1 and the second pad electrode base layer PAR2 are formed on the pad area PDA of the first planarization layer 19.

The first electrode 21, the second electrode 22, the first pad electrode base layer PAR1, and the second pad electrode base layer PAR2 may be formed by a mask process. The first electrode 21, the second electrode 22, the first pad electrode base layer PAR1, and the second pad electrode base layer PAR2 may be formed by depositing a material layer for an electrode entirely on the first substrate 11 in which the first planarization layer 19 and the first bank BNL1 are formed and then patterning the material layer. The material layer for an electrode may be deposited to the inside of the first contact hole CT1, the second contact hole CT2, the first through hole CH1, and the second through hole CH2. The first electrode 21 and the second electrode 22 may be connected to the first conductive pattern CDP and the second voltage line VL2 through the first contact hole CT1 and the second contact hole CT2, respectively. The first pad electrode base layer PAR1 and the second pad electrode base layer PAR2 may be connected to the wiring pad WPD and the dummy pad WDD through the first through hole CH1 and the second through hole CH2, respectively.

The first electrode 21 and the second electrode 22 of the display area DPA and the first pad electrode base layer PAR1 and the second pad electrode base layer PAR2 of the pad area PDA may be formed in the same process and may each contain the same material. The display device 10 may simultaneously form the first and second pad electrode base layers PAR1 and PAR2 of the pad area PDA in the process of forming the display element layer of the display area DPA, so that the mask process for forming the pad area PDA may be omitted.

Figure 17:
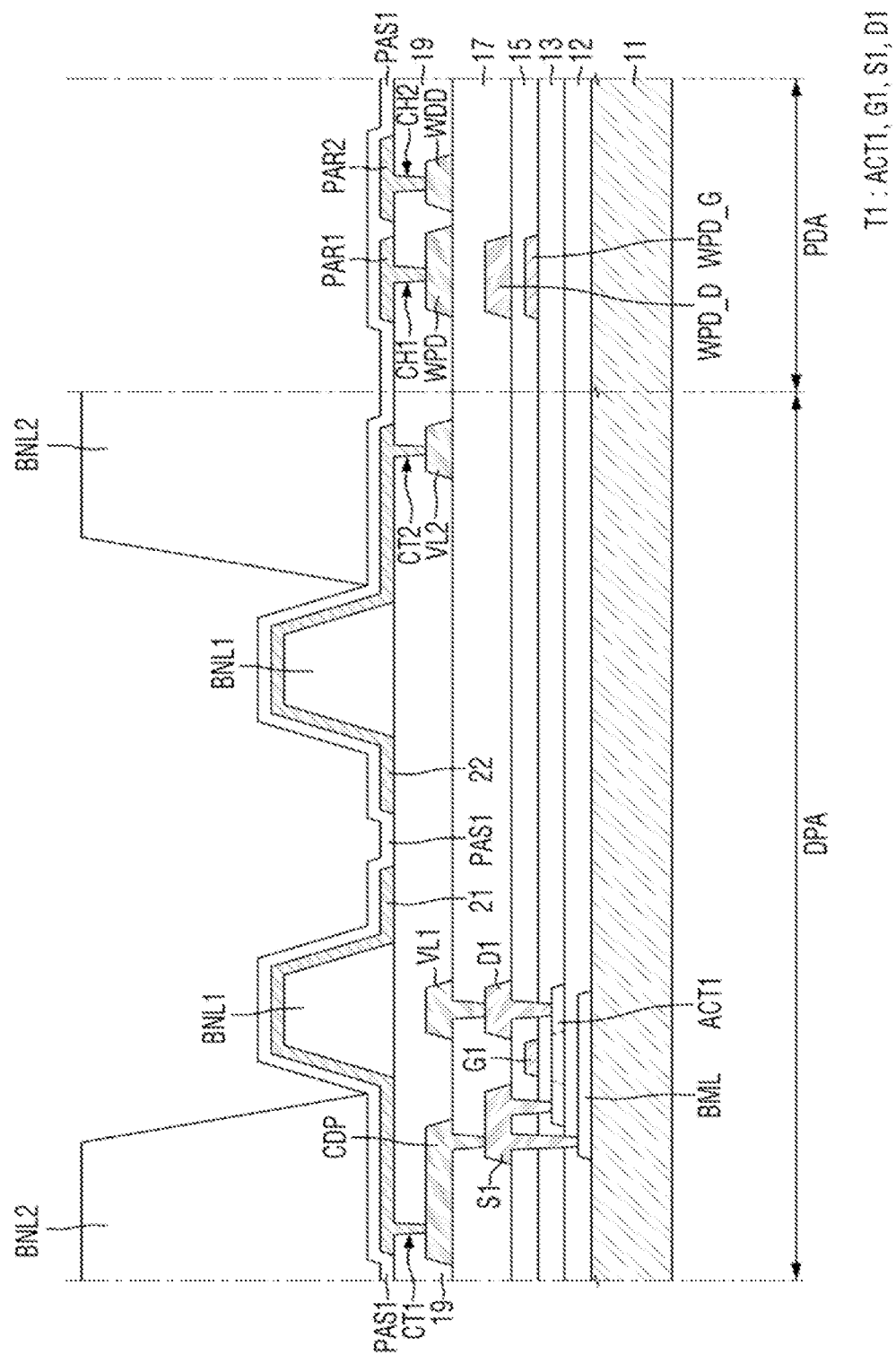

Next, referring to FIG. 17, the first insulating layer PAS1 is formed on the first and second electrodes 21 and 22 and the first and second pad electrode base layers PAR1 and PAR2, and the second bank BNL2 is formed on the first insulating layer PAS1 of the display area DPA. The first insulating layer PAS1 may be formed by depositing an insulating material layer entirely over the display area DPA and the pad area PDA. FIG. 17 illustrates that the openings OP1 OP2 are not formed in the first insulating layer PAS1. The openings OP1 and OP2 may be formed after forming the second insulating layer PAS2 in a subsequent process. The first insulating layer PAS1 covers the first and second pad electrode base layers PAR1 and PAR2 of the pad area PDA, and then at least the first and second pad electrode base layers PAR1 and PAR2 may be prevented from being damaged by materials for the mask process in the process of forming the second bank BNL2 or the second insulating layer PAS2.

The second bank BNL2 may be disposed on the first insulating layer PAS1 and may be formed in the same process as the first bank BNL1. The second bank BNL2 may have a greater height than the first bank BNL1.

Figure 18:
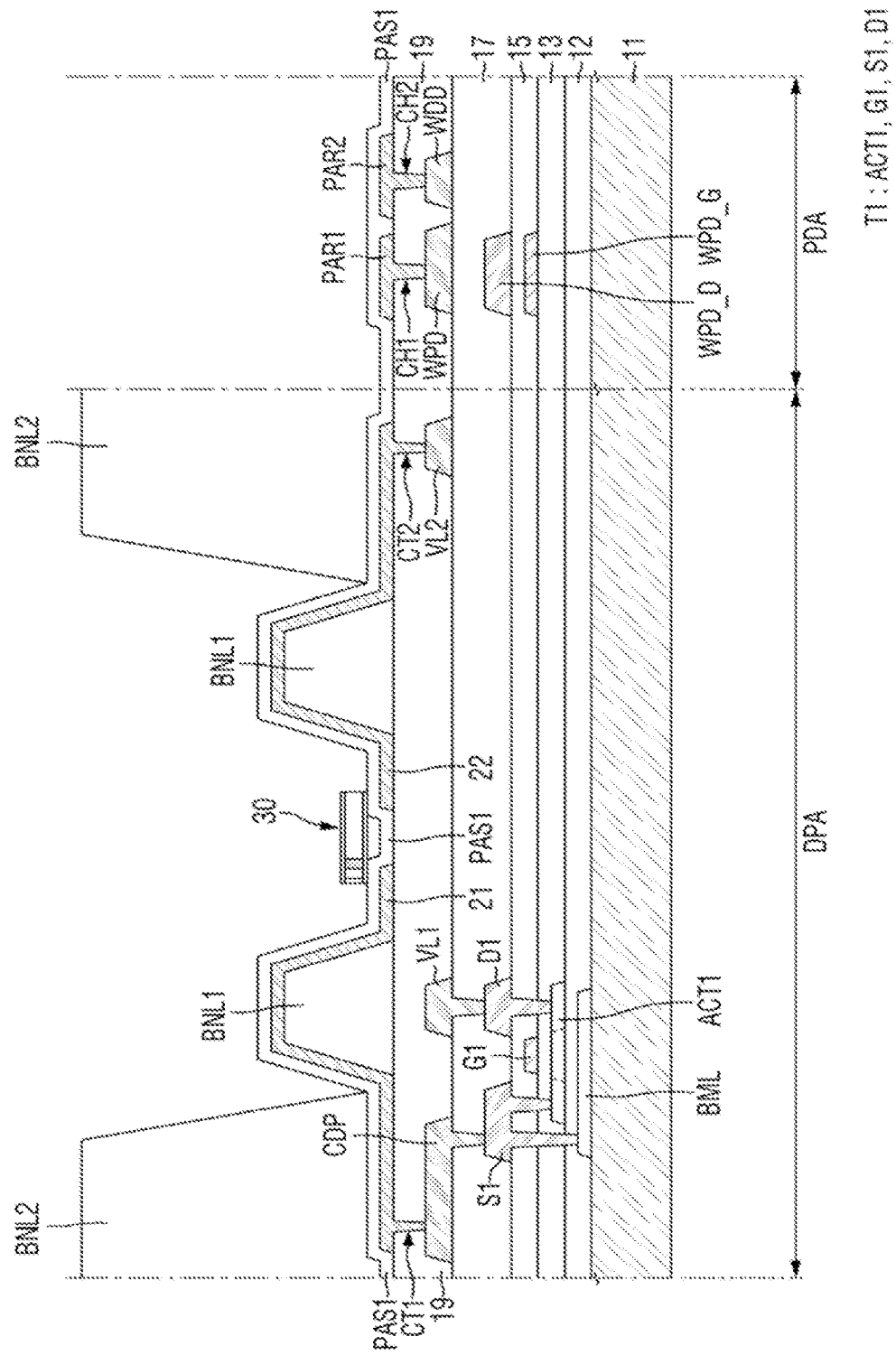

Next, referring to FIG. 18, the light emitting element 30 is disposed on the first insulating layer PAS1 of the display area DPA. According to an embodiment, the light emitting element 30 in a state of being dispersed in the ink may be disposed on the first and second electrodes 21 and 22 through an inkjet printing process that sprays the ink. The ink sprayed through the inkjet printing device may be settled in an area surrounded by the second bank BNL2. The second bank BNL2 may prevent the ink from overflowing into other neighboring sub-pixels PXn.

When the ink including the light emitting element 30 is sprayed, an electrical signal is applied to the first and second electrodes 21 and 22 to dispose the plurality of light emitting elements 30 on the first insulating layer PAS1. When an electrical signal is applied to the first and second electrodes 21 and 22, an electric field may be generated on the first and second electrodes 21 and 22. The light emitting element 30 dispersed in the ink may receive a dielectrophoretic force by the electric field, and the light emitting element 30 receiving the dielectrophoretic force may be seated on the first insulating layer PAS1 while changing the orientation direction and position thereof. Here, the length of the light emitting element 30 may be longer than the interval between the first electrode 21 and the second electrode 22, and both ends of the light emitting element 30 may be disposed on the first electrode 21 and the second electrode 22, respectively.

Figure 19:
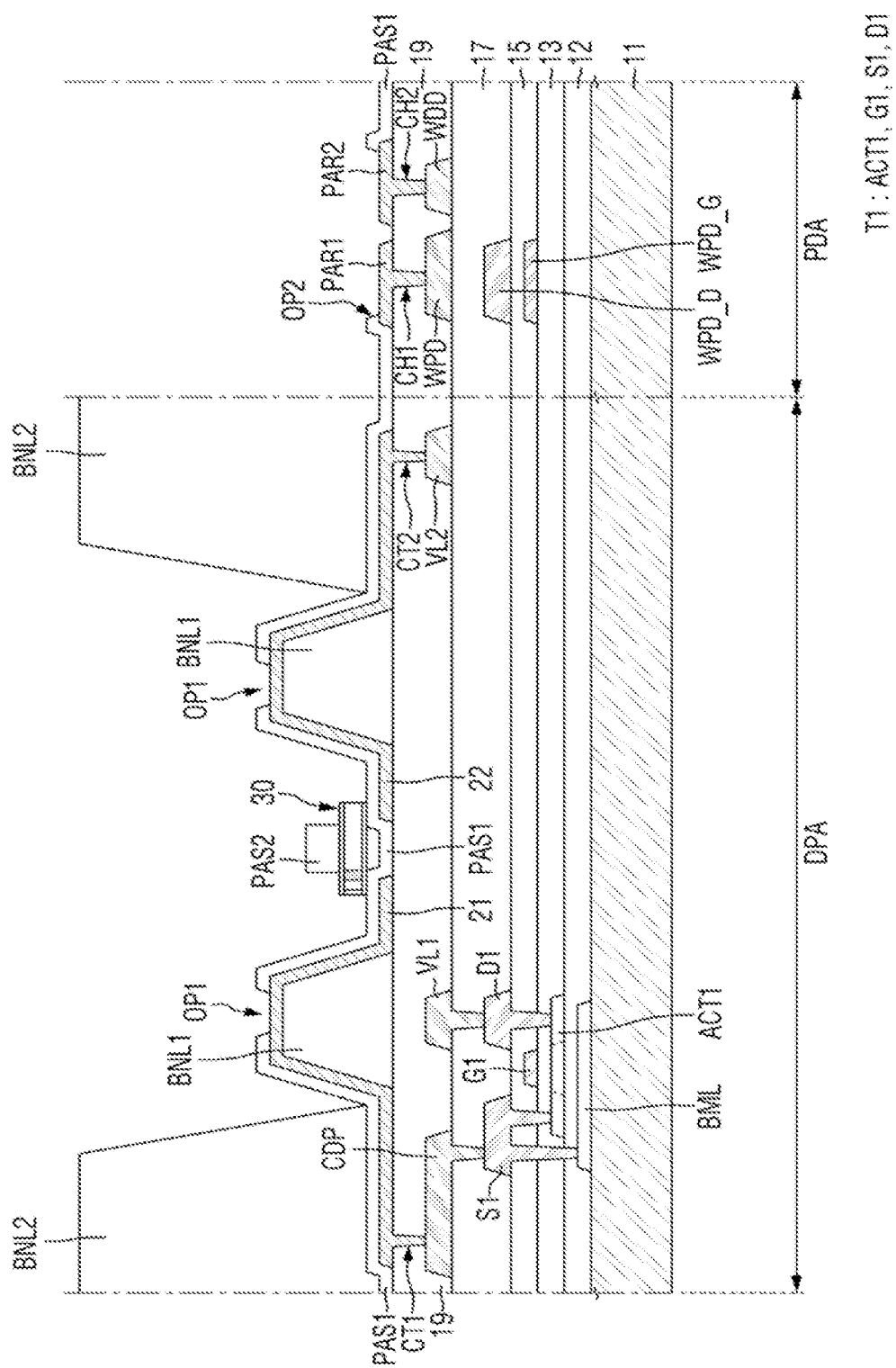

Next, referring to FIG. 19, the second insulating layer PAS2 that fixes the position of the light emitting element 30 is formed. Next, the first insulating layer PAS1 is partially patterned to form the first opening OP1 exposing the first and second electrodes 21 and 22 and form the second openings OP2 exposing a portion of the top surface of the first and second pad electrode base layers PAR1 and PAR2. The second insulating layer PAS2 may be formed by depositing an insulating material layer entirely on the first insulating layer PAS1 and then performing patterning so that both ends of the light emitting element 30 are exposed. Here, the insulating material layer might not be deposited or the material layer deposited on the pad area PDA may be completely removed so that the second insulating layer PAS2 is not formed on the pad area PDA. The first insulating layer PAS1 and the second insulating layer PAS2 may include different insulating materials, and the first insulating layer PAS1 might not be removed during the patterning process.

Figure 20:
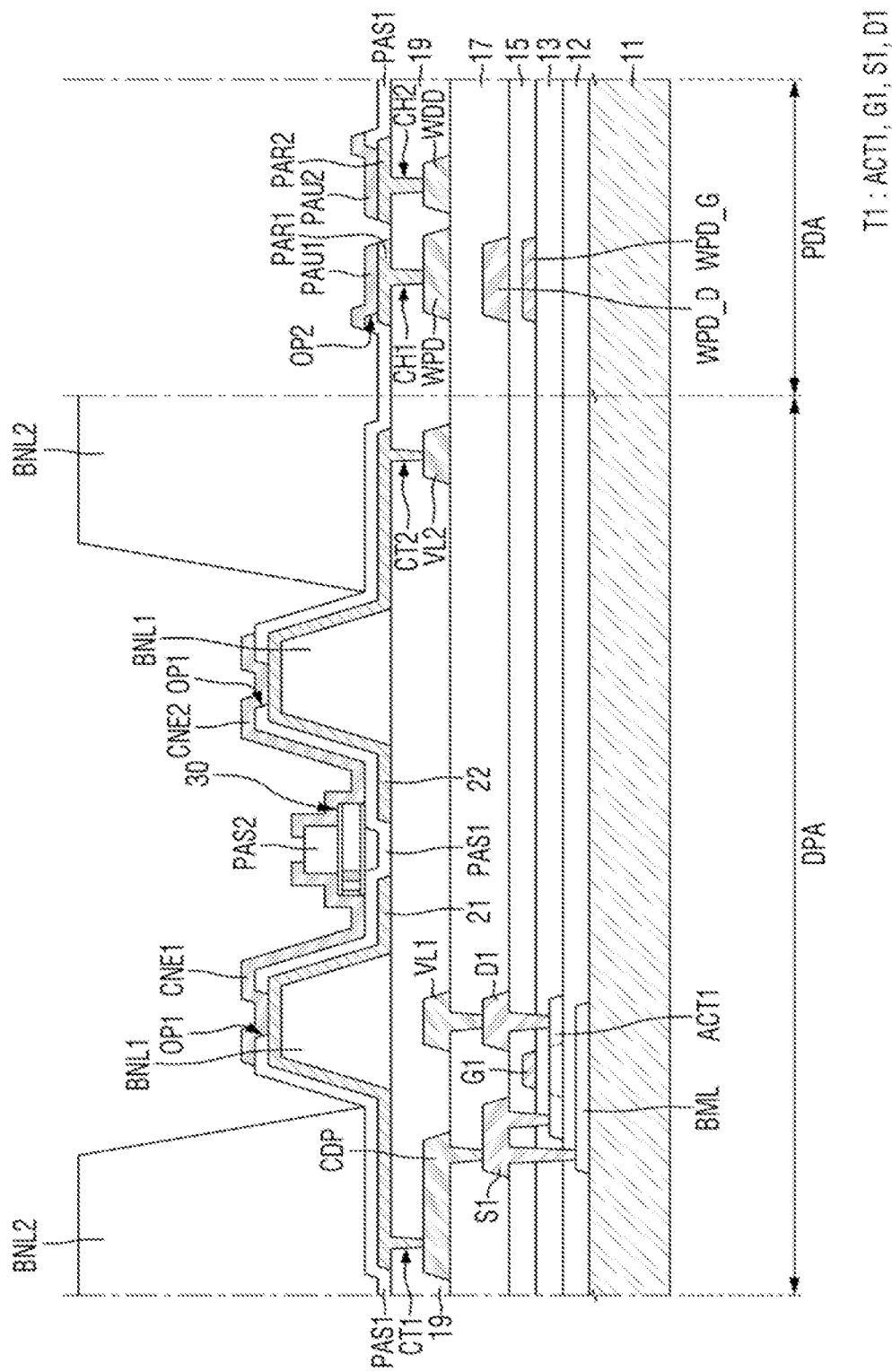

Next, referring to FIG. 20, first and second connection electrodes CNE1 and CNE2 are formed on the first insulating layer PAS1 and the second insulating layer PAS2, and the first and second pad electrode upper layers PAU1 and PAU2 are formed on the first and second pad electrode base layers PAR1 and PAR2. The first and second connection electrodes CNE1 and CNE2 and the first and second pad electrode upper layers PAU1 and PAU2 may be formed by depositing a material layer for a connection electrode entirely on the first insulating layer PAS1 and the second insulating layer PAS2 and then patterning the material layer. The material layer for a connection electrode may be deposited to the inside of the first opening OP1 and the second opening OP2 of the first insulating layer PAS1. Accordingly, the first connection electrode CNE1 may be connected to the first electrode 21, the second connection electrode CNE2 may be connected to the second electrode 22, the first pad electrode upper layer PAU1 may be connected to the first pad electrode base layer PAR1, and the second pad electrode upper layer PAU2 may be connected to the second pad electrode base layer PAR2.

The first and second connection electrodes CNE1 and CNE2 of the display area DPA and the first and second pad electrode upper layers PAU1 and PAU2 of the pad area PDA may be formed in the same process, and each may include the same material. The display device 10 may simultaneously form the first and second pad electrode upper layers PAU1 and PAU2 of the pad area PDA in the process of forming the display element layer of the display area DPA, so that the mask process for forming the pad area PDA may be omitted.

Figure 21:
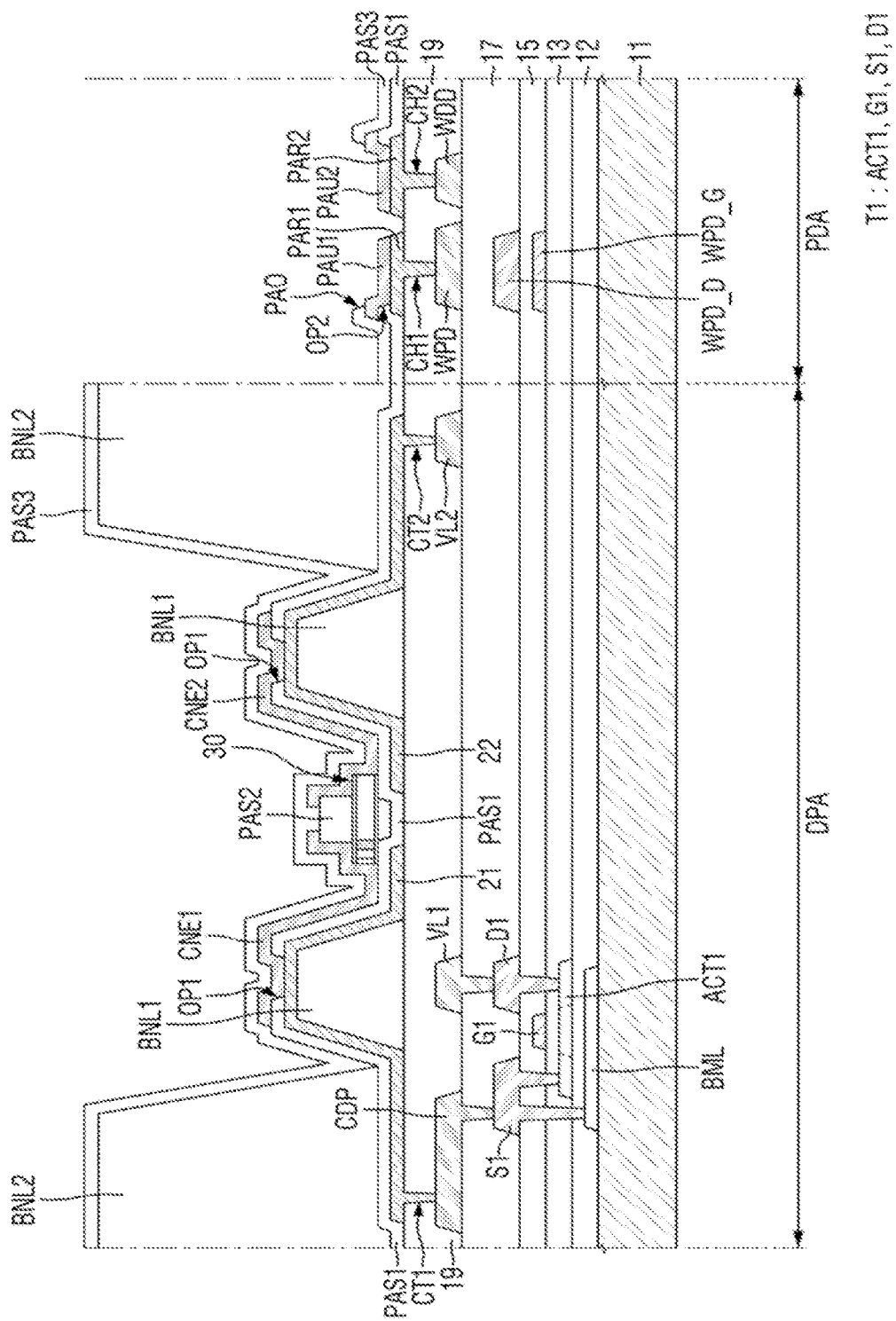

Next, referring to FIG. 21, the third insulating layer PAS3 is formed on the first and second connection electrodes CNE1 and CNE2 and the first and second pad electrode upper layers PAU1 and PAU2. The third insulating layer PAS3 may be formed by depositing an insulating material layer entirely on the display area DPA and the pad area PDA. Then, the third insulating layer PAS3 is partially patterned to form a pad opening PAO exposing the first and second pad electrode upper layers PAU1 and PAU2.

Figure 22:
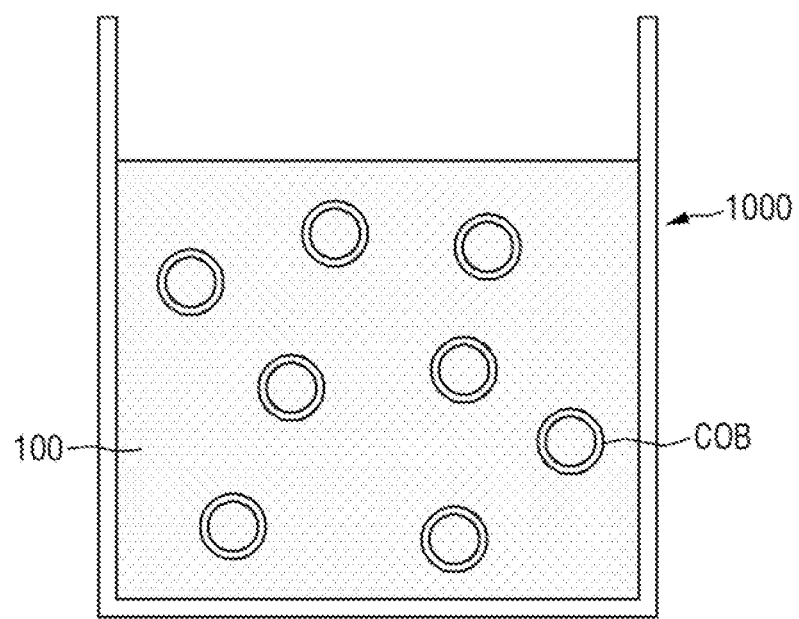

Next, referring to FIG. 22, a conductive ball ink 1000 including the conductive ball COB and a solvent 100 is prepared. The conductive ball ink 1000 may include the solvent 100 and conductive balls COB dispersed therein. The solvent 100 may be a solvent such as toluene, water, or alcohol, but is not necessarily limited thereto.

Figure 23:
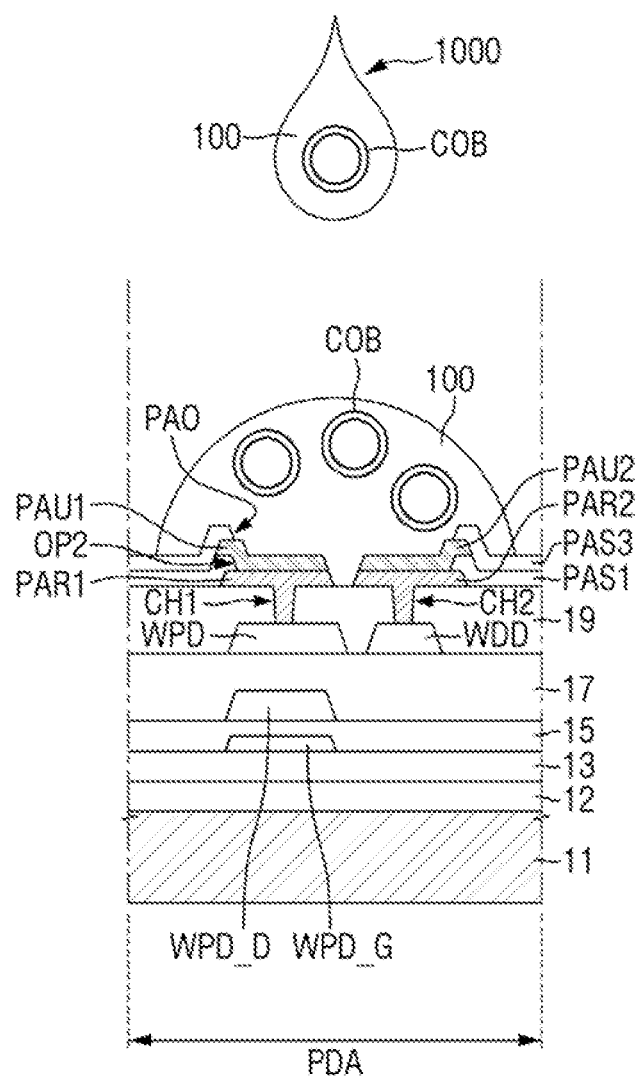

Next, referring to FIG. 23, the conductive ball ink 1000 including the solvent 100 is sprayed onto the pad area PDA of the first substrate 11. In an embodiment, the conductive ball ink 1000 may be sprayed through a solution process, and the solution process may use, for example, a printing process using an inkjet printing device. The sprayed ink 1000 may be seated on the pad area PDA of the first substrate 11. The conductive balls COB may be dispersed in the conductive ball ink 1000.

Figure 24:
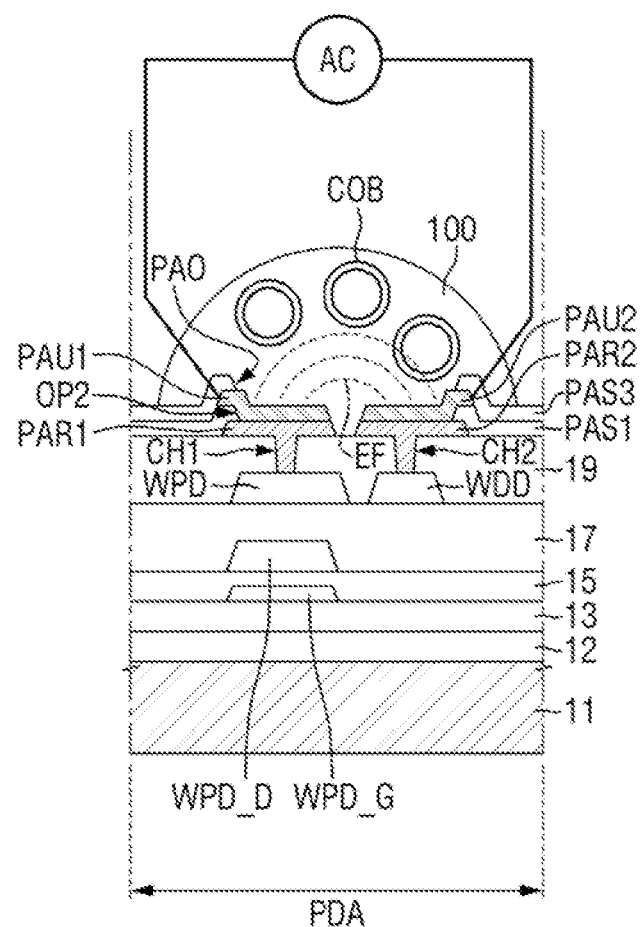

Then, referring to FIG. 24, when the conductive ball ink 1000 including the conductive balls COB is sprayed onto the target substrate SUB, an alignment signal is applied to the first and second pad electrode upper layers PAU1 and PAU2 to generate an electric field EL on the pad area PDA. The conductive balls COB dispersed in the solvent 100 may receive a dielectrophoretic force by the electric field EL, and may be disposed on the first and second pad electrode upper layers PAU1 and PAU2 while changing positions.

When the electric field EL is generated by applying an alternating current electrical signal to the first and second pad electrode upper layers PAU1 and PAU2 of the first substrate 11 in the pad area PDA, the conductive ball COB may receive a dielectrophoretic force. Dielectrophoresis may control the movement of particles without exhibiting electric charge. For example, when an alternating electric field is applied to the dielectric, an induced dipole is generated in the dielectric and a net force is induced in a direction in which the electric field density is high, so that the movement of the dielectric may be controlled. When the electric field EL generated on the pad area PDA of the first substrate 11 is generated on the top surface of the target substrate SUB, each of the conductive balls COB may move from an initially dispersed position toward the first and second pad electrode upper layers PAU1 and PAU2 by a dielectrophoretic force. The conductive ball COB may be disposed on the first and second pad electrode upper layers PAU1 and PAU2 while changing positions thereof by the electric field EL.

According to an embodiment, the solvent 100 has a relatively low dielectric constant, so that the conductive balls COB dispersed therein may have high dielectrophoretic reactivity by the electric field EL. The conductive ball COB has an induced dipole generated therein. When the conductive ball COB in which the induced dipole is generated is placed on the electric field EL, the conductive ball COB may receive a dielectrophoretic force to be disposed on the first and second pad electrode upper layers PAU1 and PAU2. Here, as the dielectric constant of the solvent 100 is lower, the conductive balls COB may receive a relatively larger dielectrophoretic force, and the conductive balls COB disposed on the first and second pad electrode upper layers PAU1 and PAU2 may be disposed more uniformly. Accordingly, the conductive balls COB are aggregated on the first and second pad electrode upper layers PAU1 and PAU2, so that the electrical connection between the first and second pad electrode upper layers PAU1 and PAU2 and the circuit wire CFC may be made better. In addition, since the conductive balls COB are gathered on the first and second upper pad electrode upper layers PAU1 and PAU2, a short circuit between the adjacent upper pad electrode upper layers may be further prevented, so that a driving failure may be prevented.

Figure 25:
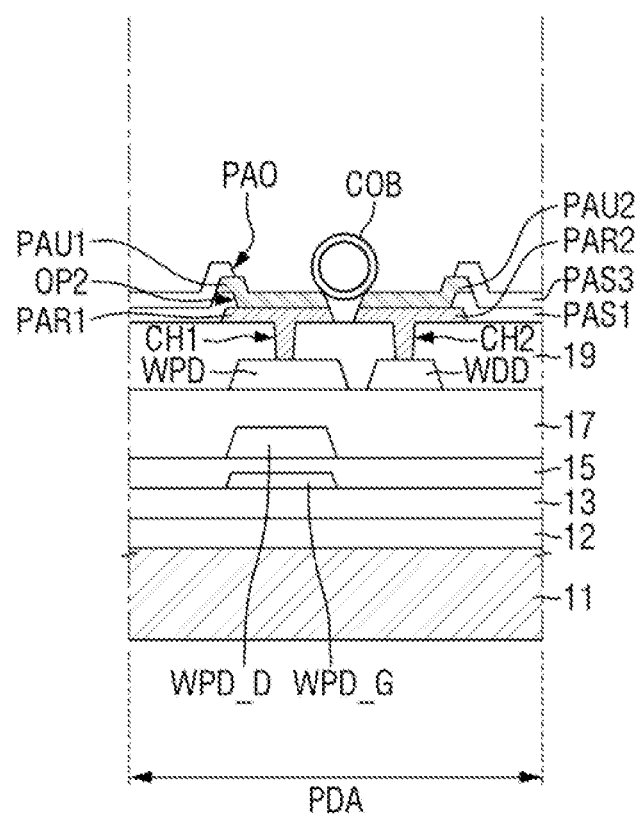

Next, referring to FIG. 25, when the conductive balls COB are seated on the first and second pad electrode upper layers PAU1 and PAU2, the solvent 100 is removed. The process of removing the solvent 100 may be performed through a known heat treatment process. In an embodiment, the heat treatment process may be performed in a temperature range of 200° C. to 400° C., or about 300° C.

Figure 26:
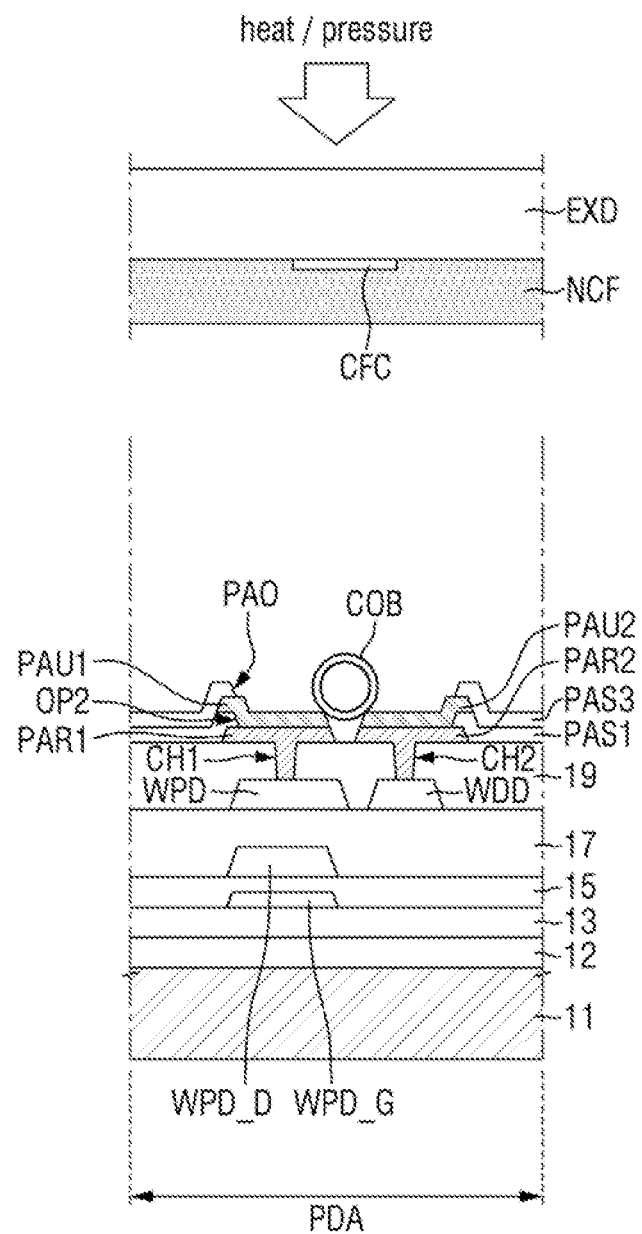

Next, referring to FIG. 26, the external device EXD including the plurality of circuit wires CFC is aligned on the pad area PDA of the first substrate 11. The non-conductive layer NCF covering the circuit wire CFC may be formed on one surface of the external device EXD. The external device EXD is aligned so that the first and second pad electrode upper layers PAU1 and PAU2 of the pad area PDA and the circuit wire CFC may be aligned with each other.

Then, the external device EXD and the pad area PDA of the first substrate 11 are bonded to each other by applying a pressure while applying heat from the upper portion of the external device EXD. In this case, the non-conductive layer NCF is thermally cured to bond the external device EXD to the first substrate 11, and the conductive ball COB has a capping layer ruptured by the pressure to expose an internal conductive layer.

Figure 27:
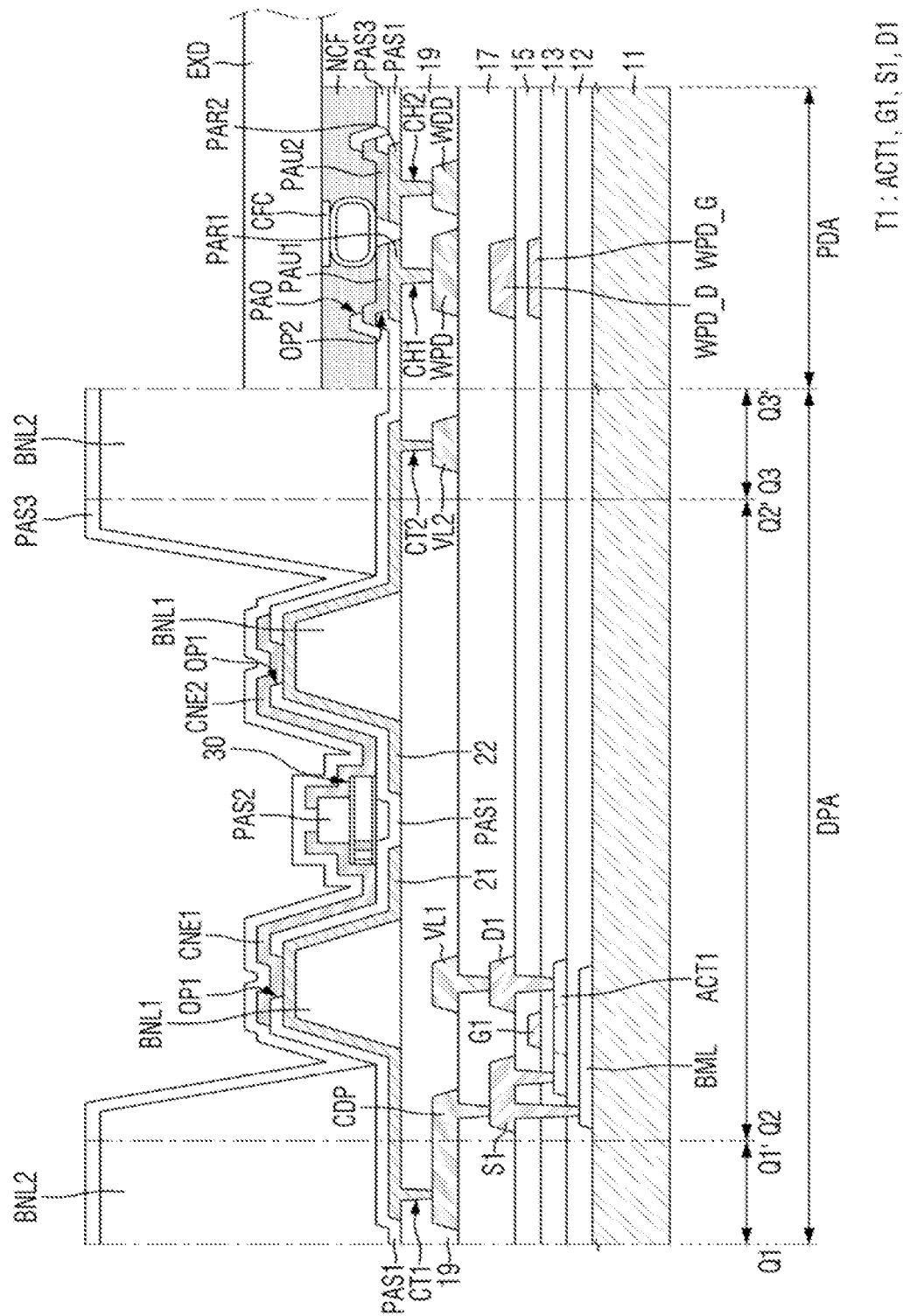

As illustrated in FIG. 27, the conductive ball COB may be in contact with the first and second pad electrode upper layers PAU1 and PAU2 of the pad area PDA, be in contact with the circuit wire CFC of the external device EXD, and thus electrically connect the first and second pad electrode upper layers PAU1 and PAU2 to the circuit wire CFC.

Through the above process, the display device 10 to which the external device EXD is bonded may be manufactured.

The display device 10, according to an embodiment, aligns the conductive ball COB on the pad electrode upper layers PAU1 and PAU2 using a dielectrophoresis method and thus enables the pad electrode upper layers PAU1 and PAU2 and the circuit wire CFC to be well connected. Accordingly, a short circuit due to the aggregation of the conductive ball COB between the adjacent circuit wires CFC or the adjacent pad electrode upper layers PAU1 and PAU2 may be prevented, and a driving failure may be prevented.

In addition, according to an embodiment, the display device 10 may be formed such that some layers disposed in the display area DPA and the pad area PDA are merged through the same process, and a complicated manufacturing process may be simplified. In particular, in the pad area PDA, the pad electrodes PAR1, PAR2, PAU1, and PAU2 including the same material as the connection electrodes CNE1 and CNE2 and formed at the same time as the connection electrodes CNE1 and CNE2 and the electrodes 21 and 22 of the display area DPA may be disposed, so that a separate pad electrode forming process for connection with the external device EXD may be omitted. The display device 10 may have a novel pad electrode structure by including the light emitting element 30, and a manufacturing process may be simplified.

Hereinafter, other embodiments of the display device 10 will be described with reference to other drawings.

Figure 28:
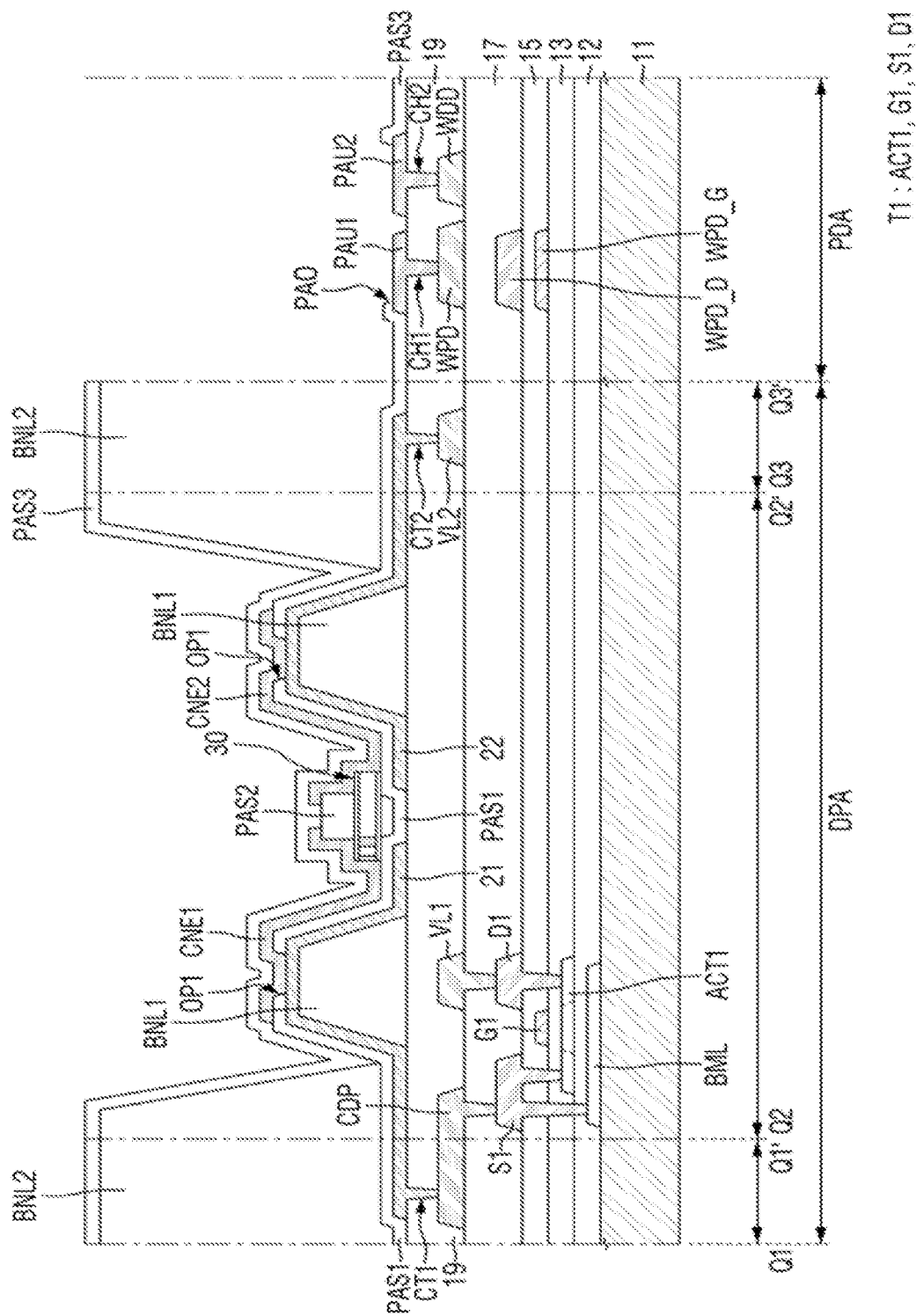
FIG. 28 is a cross-sectional view schematically illustrating a display area and a pad area of a display device according to an embodiment.

FIG. 28 is a cross-sectional view schematically illustrating a display area and a pad area of a display device according to an embodiment.

Referring to FIG. 28, the present embodiment differs from the embodiment of FIGS. 5 to 27 described above in that the first insulating layer PAS1 and the first and second pad electrode base layers PAR1 and PAR2 are omitted in the pad area PDA. Hereinafter, the same configuration as the above-described embodiment will be omitted and a different configuration will be described.

The second interlayer insulating layer 17 may be disposed on the pad area PDA of the first substrate 11, and the wiring pad WPD and the dummy pad WDD may be spaced apart from each other on the second interlayer insulating layer 17. The first planarization layer 19 is disposed on the wiring pad WPD and the dummy pad WDD, and the first through hole CH1 and the second through hole CH2 exposing the wiring pad WPD and the dummy pad WDD, respectively are formed.

The first pad electrode upper layer PAU1 and the second pad electrode upper layer PAU2 may be spaced apart from each other on the first planarization layer 19. The first pad electrode upper layer PAU1 may overlap the wiring pad WPD, and the second pad electrode upper layer PAU2 may overlap the dummy pad WDD. The first upper pad electrode upper layer PAU1 and the second pad electrode upper layer PAU2 may be disposed directly on the top surface of the first planarization layer 19 to be disposed on the same layer.

The third insulating layer PAS3 may be disposed on the first pad electrode upper layer PAU1 and the second pad electrode upper layer PAU2. The pad opening PAO exposing the first pad electrode upper layer PAU1 and the second pad electrode upper layer PAU2 may be formed in the third insulating layer PAS3.

In the present embodiment, the first and second pad electrode upper layers PAU1 and PAU2 are directly formed on the first planarization layer 19 of the pad area PDA, and are directly connected to the wiring pad WPD and the dummy pad WDD, so that the structure of the pad electrode of the pad area PDA may be simplified. Accordingly, the electrical signal applied from the external device EXD is directly applied to the wiring pad WPD through the first and second pad electrode upper layers PAU1 and PAU2, so that a signal delay may be prevented.

Figure 29:
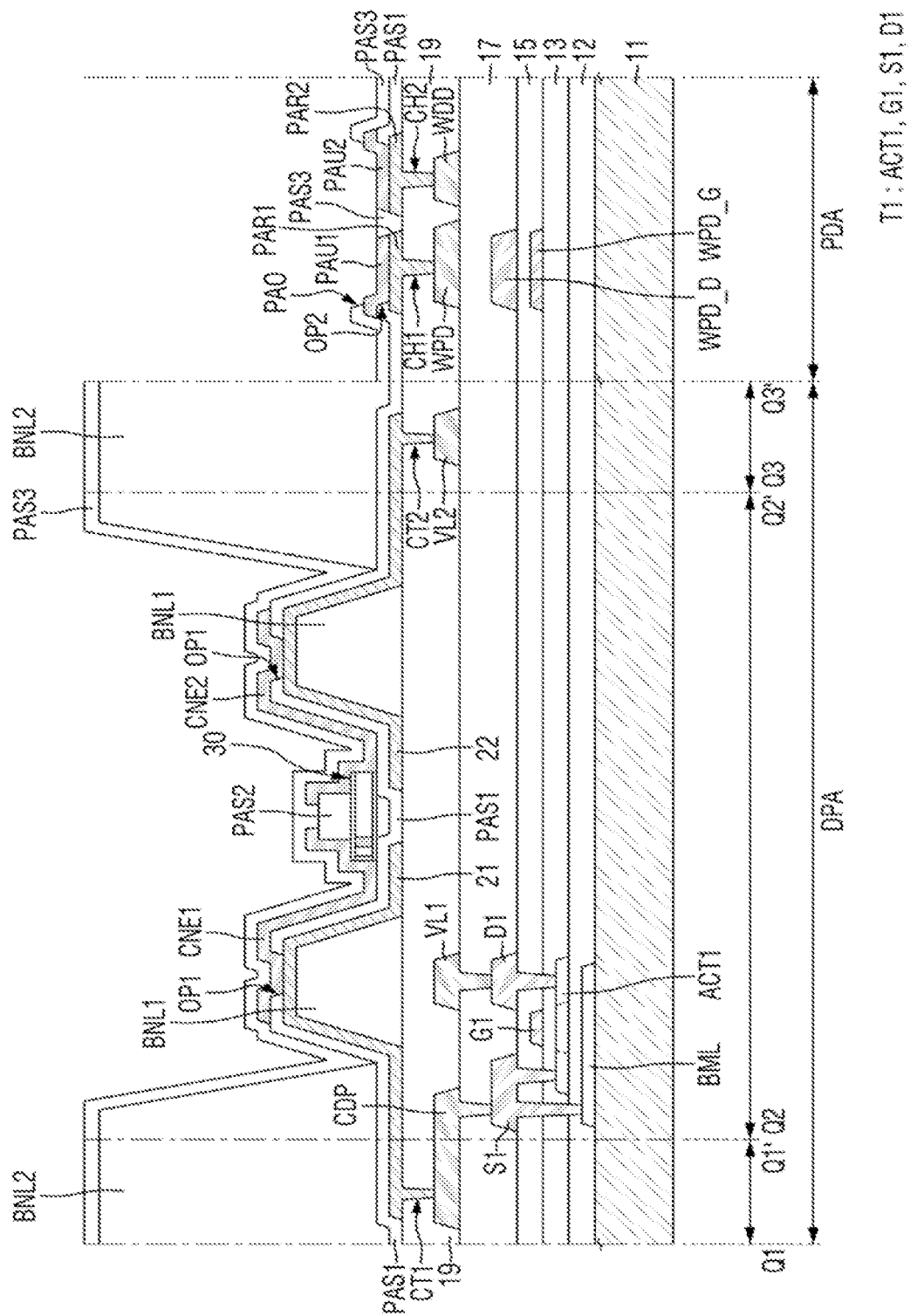
FIG. 29 is a cross-sectional view schematically illustrating a display area and a pad area of a display device according to an embodiment.

FIG. 29 is a cross-sectional view schematically illustrating a display area and a pad area of a display device according to an embodiment.

Referring to FIG. 29, the depicted arrangement differs from the embodiment of FIGS. 5 to 27 described above in that the third insulating layer PAS3 is further disposed between the first pad electrode upper layer PAU1 and the second pad electrode upper layer PAU2 and between the first pad electrode base layer PAR1 and the second pad electrode base layer PAR2.

The first pad electrode base layer PAR1 and the second pad electrode base layer PAR2 may be spaced apart from each other on the first planarization layer 19, and first insulating layer PAS1 may be disposed on the first pad electrode base layer PAR1 and the second pad electrode base layer PAR2. The second opening OP2 of the first insulating layer PAS1 may expose the first pad electrode base layer PAR1 and the second pad electrode base layer PAR2. The first pad electrode upper layer PAU1 and the second pad electrode upper layer PAU2 may be disposed on the first pad electrode base layer PAR1 and the second pad electrode base layer PAR2. The first pad electrode upper layer PAU1 may overlap the first pad electrode base layer PAR1, and the second pad electrode upper layer PAU2 may overlap the second pad electrode base layer PAR2.

The third insulating layer PAS3 may be disposed on the first pad electrode upper layer PAU1 and the second pad electrode upper layer PAU2. The pad opening PAO exposing the first pad electrode upper layer PAU1 and the second pad electrode upper layer PAU2 may be formed in the third insulating layer PAS3. In an embodiment, the third insulating layer PAS3 may be further disposed between the first pad electrode upper layer PAU1 and the second pad electrode upper layer PAU2 and between the first pad electrode base layer PAR1 and the second pad electrode base layer PAR2. The third insulating layer PAS3 may be disposed directly on the top surface of the first planarization layer 19, and may be directly in contact with side surfaces of the first pad electrode upper layer PAU1 and the second pad electrode upper layer PAU2 facing each other. In addition, the third insulating layer PAS3 may also be directly in contact with side surfaces of the first pad electrode base layer PAR1 and the second pad electrode base layer PAR2 facing each other.

When the third insulating layer PAS3 is further disposed between the first pad electrode upper layer PAU1 and the second pad electrode upper layer PAU2 and between the first pad electrode base layer PAR1 and the second pad electrode base layer PAR2, the third insulating layer PAS3 may contribute to planarization of the pad area PDA with which the conductive ball COB is in contact. For example, since the third insulating layer PAS3 is further disposed between the first pad electrode upper layer PAU1 and the second pad electrode upper layer PAU2 and between the first pad electrode base layer PAR1 and the second pad electrode base layer PAR2, a step due to the stacking of the first and second pad electrode upper layers PAU1 and PAU2 and the first and second pad electrode base layers PAR1 and PAR2 may be planarized.

The conductive ball COB in FIG. 8 disposed on the pad area PDA may be stably directly in contact with the first pad electrode upper layer PAU1 and the second pad electrode upper layer PAU2 at the surfaces thereof. Accordingly, a signal applied from the external device EXD to the conductive ball COB may be stably transmitted to the first pad electrode upper layer PAU1.

FIG. 29 illustrates that the top surface of the third insulating layer PAS3 disposed between the first pad electrode upper layer PAU1 and the second pad electrode upper layer PAU2 coincides with the top surface of each of the first pad electrode upper layer PAU1 and the second pad electrode upper layer PAU2, but the present disclosure is not necessarily limited thereto, so that the top surface of the third insulating layer PAS3 may also be closer to the first substrate 11 than to the top surface of each of the first pad electrode upper layer PAU1 and the second pad electrode upper layer PAU2.

Figure 30:
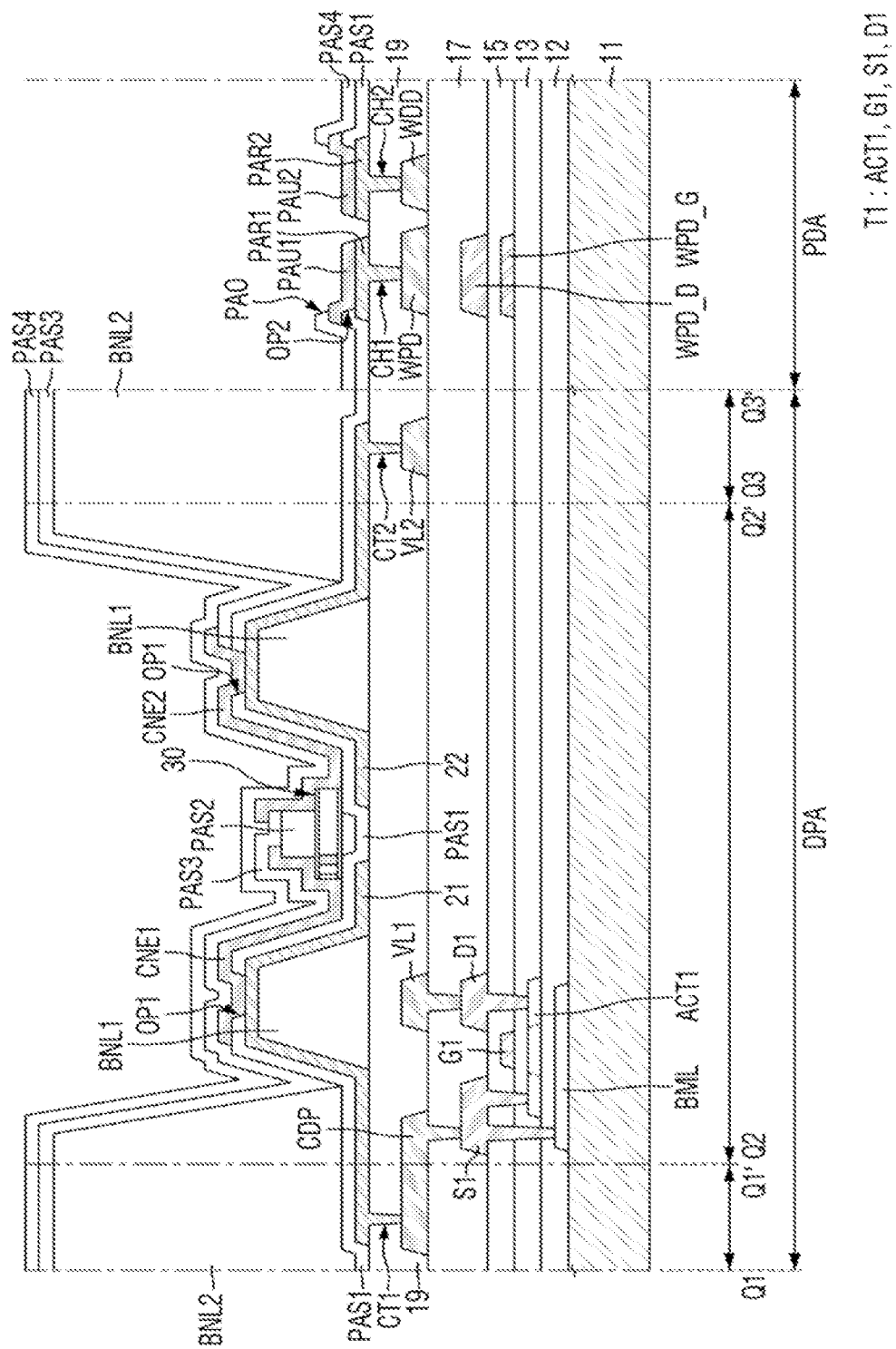
FIG. 30 is a cross-sectional view schematically illustrating a display area and a pad area of a display device according to an embodiment.

FIG. 30 is a cross-sectional view schematically illustrating a display area and a pad area of a display device according to an embodiment.

Referring to FIG. 30, the present embodiment differs from the embodiment of FIGS. 5 to 29 described above in that the third insulating layer PAS3 is disposed on the first connection electrode CNE1, a portion of the second connection electrode CNE2 is disposed on the third insulating layer PAS3, and a fourth insulating layer PAS4 is further disposed on the third insulating layer PAS3 and the second connection electrode CNE2. Hereinafter, descriptions of the same configurations as those of the above-described embodiments will be omitted and differences will be described.

The third insulating layer PAS3 covers the first connection electrode CNE1. The third insulating layer PAS3 may cover one side on which the first connection electrode CNE1 is disposed with respect to the second insulating layer PAS2, including the first connection electrode CNE1. For example, the third insulating layer PAS3 may cover the first connection electrode CNE1 and the first insulating layers PAS1 disposed on the first electrode 21. This disposition may be formed by a process of disposing the insulating material layer constituting the third insulating layer PAS3 entirely in the emission area EMA, and then partially removing the insulating material layer to form the second connection electrode CNE2. In the above process, the insulating material layer constituting the third insulating layer PAS3 may be removed together with the insulating material layer constituting the second insulating layer PAS2, and one side of the third insulating layer PAS3 may be aligned with one side of the second insulating layer PAS2.

The second connection electrode CNE2 may be disposed on the second electrode 22 to contact one end of the light emitting element 30. One side of the second connection electrode CNE2 may be disposed on the third insulating layer PAS3 and may be insulated from the first connection electrode CNE1 with the third insulating layer PAS3 interposed therebetween. The second connection electrode CNE2 may be in contact with the second electrode 22 through the first opening OP1 exposing a portion of the top surface of the second electrode 22.

A fourth insulating layer PAS4 may be entirely disposed in the display area DPA of the substrate 11. The fourth insulating layer PAS4 may protect members disposed on the substrate 11 from an external environment. However, the fourth insulating layer PAS4 may be omitted.

In the pad area PDA, the first pad electrode base layer PAR1 and the second pad electrode base layer PAR2 may be spaced apart from each other on the first planarization layer 19, and the first insulating layer PAS1 may be disposed on the first pad electrode base layer PAR1 and the second pad electrode base layer PAR2. The second opening OP2 of the first insulating layer PAS1 may expose the first pad electrode base layer PAR1 and the second pad electrode base layer PAR2.

The first pad electrode upper layer PAU1 and the second pad electrode upper layer PAU2 may be disposed on the first pad electrode base layer PAR1 and the second pad electrode base layer PAR2. The first pad electrode upper layer PAU1 may overlap the first pad electrode base layer PAR1, and the second pad electrode upper layer PAU2 may overlap the second pad electrode base layer PAR2.

The first pad electrode upper layer PAU1 and the second pad electrode upper layer PAU2 may be simultaneously formed of the same material as the first connection electrode CNE1 or the second connection electrode CNE2 of the display area DPA. For example, the first connection electrode CNE1, the first pad electrode upper layer PAU1, and the second pad electrode upper layer PAU2 may be simultaneously formed by stacking a material layer for a connection electrode and then patterning the material layer. For example, after the first connection electrode CNE1 and the third insulating layer PAS3 are formed in the display area DPA, a material layer for a connection electrode may be stacked and then patterned, and may also simultaneously form the second connection electrode CNE2, the first pad electrode upper layer PAU1, and the second pad electrode upper layer PAU2.

The fourth insulating layer PAS4 may be disposed on the first pad electrode upper layer PAU1 and the second pad electrode upper layer PAU2. The pad opening PAO exposing the first pad electrode upper layer PAU1 and the second pad electrode upper layer PAU2 may be formed in the fourth insulating layer PAS4. When the first pad electrode upper layer PAU1 and the second pad electrode upper layer PAU2 are formed simultaneously with the second connection electrode CNE2, FIG. 30 illustrates that the fourth insulating layer PAS4 is disposed on the first pad electrode upper layer PAU1 and the second pad electrode upper layer PAU2. However, the present disclosure is not necessarily limited thereto, and when the first pad electrode upper layer PAU1 and the second pad electrode upper layer PAU2 are formed simultaneously with the first connection electrode CNE2, the third insulating layer PAS3 may also be disposed on the first pad electrode upper layer PAU1 and the second pad electrode upper layer PAU2. In this case, the fourth insulating layer PAS4 may also be omitted.

Accordingly, those skilled in the art may appreciate that many variations and modifications can be made to the described embodiments without substantially departing from the principles of the present disclosure.

What is claimed is:

1. A display device, comprising:
   a wiring pad disposed on a first substrate;
   a dummy pad disposed on the first substrate and spaced apart from the wiring pad;
   a first planarization layer disposed on both the wiring pad and the dummy pad;
   a first pad electrode base layer disposed on the first planarization layer and connected to the wiring pad;
   a second pad electrode base layer disposed on the first planarization layer and connected to the dummy pad;
   a first insulating layer covering at least a portion of each of the first pad electrode base layer and the second pad electrode base layer;
   a first pad electrode upper layer disposed on the first pad electrode base layer; and
   a second pad electrode upper layer disposed on the second pad electrode base layer,
   wherein the wiring pad, the first pad electrode base layer, and the first pad electrode upper layer are electrically connected to each other, and
   wherein the dummy pad, the second pad electrode base layer, and the second pad electrode upper layer are electrically connected to each other.

2. The display device of claim 1, wherein the first planarization layer comprises a first through hole exposing the wiring pad, and a second through hole exposing the dummy pad,
   wherein the first pad electrode base layer is in contact with the wiring pad through the first through hole, and
   wherein the second pad electrode base layer is in contact with the dummy pad through the second through hole.

3. The display device of claim 1, wherein the first insulating layer comprises a first opening exposing at least a portion of each of the first pad electrode base layer and the second pad electrode base layer,
   wherein the first pad electrode upper layer is in contact with the first pad electrode base layer through the first opening, and
   wherein the second pad electrode upper layer is in contact with the second pad electrode base layer through the first opening.

4. The display device of claim 1, wherein the wiring pad and the dummy pad are spaced apart from each other in a first direction, each extend in a second direction intersecting the first direction, and are both disposed on a same layer.

5. The display device of claim 4, wherein a width of the wiring pad in the first direction is greater than a width of the dummy pad in the first direction.

6. The display device of claim 1, wherein the wiring pad, the first pad electrode base layer, and the first pad electrode upper layer overlap each other and extend in parallel with one another, and
   wherein the dummy pad, the second pad electrode base layer, and the second pad electrode upper layer overlap each other and extend in parallel with one another.

7. The display device of claim 1, further comprising a second insulating layer disposed on both the first pad electrode upper layer and the second pad electrode upper layer, the second insulating layer comprising a pad opening exposing at least a portion of each of the first pad electrode upper layer and the second pad electrode upper layer.

8. The display device of claim 7, wherein at least a portion of the second insulating layer is disposed directly on the first planarization layer, between the first pad electrode upper layer and the second pad electrode upper layer, and between the first pad electrode base layer and the second pad electrode base layer.

9. The display device of claim 1, further comprising:
   an external device disposed on the first substrate and comprising a plurality of circuit wires;
   a non-conductive layer disposed between the external device and the first substrate and bonding the external device to the first substrate; and
   a plurality of conductive balls disposed between the first pad electrode upper layer and the plurality of circuit wires, and between the second pad electrode upper layer and the plurality of circuit wires.

10. The display device of claim 9, wherein the plurality of conductive balls electrically connects the plurality of circuit wires to the first pad electrode upper layer and electrically connects the plurality of circuit wires to the second pad electrode upper layer.

11. A display device, comprising:
    a first substrate comprising a display area and a pad area;
    a wiring pad disposed on the pad area of the first substrate;
    a dummy pad disposed on the pad area of the first substrate and spaced apart from the wiring pad;
    a first planarization layer disposed on the display area and the pad area of the first substrate and additionally disposed on the wiring pad and the dummy pad;
    a first electrode disposed on the display area of the first substrate and the first planarization layer;
    a second electrode disposed on the wiring pad disposed on the display area of the first substrate and the first planarization layer;
    a first pad electrode base layer disposed on the wiring pad;
    a second pad electrode base layer disposed on the dummy pad;
    a first insulating layer covering at least a portion of each of the first electrode, the second electrode, the first pad electrode base layer, and the second pad electrode base layer;
    a plurality of light emitting elements disposed on the first insulating layer in the display area and having a first end and a second end thereof disposed on the first electrode and the second electrode, respectively;
    a second insulating layer disposed on the plurality of light emitting elements in the display area;
    a first connection electrode disposed on the first electrode and being in contact with the first end of each of the plurality of light emitting elements;
    a second connection electrode disposed on the second electrode and being in contact with the second end of each of the plurality of light emitting elements;
    a first pad electrode upper layer disposed on the first pad electrode base layer; and
    a second pad electrode upper layer disposed on the second pad electrode base layer, wherein the wiring pad, the first pad electrode base layer, and the first pad electrode upper layer are electrically connected to one another, and wherein the dummy pad, the second pad electrode base layer, and the second pad electrode upper layer are electrically connected to one another.

12. The display device of claim 11, wherein the first electrode and the second electrode each include a same material as each of the first pad electrode base layer and the second pad electrode base layer, and wherein the first electrode, the second electrode, the first pad electrode base layer, and the second pad electrode base layer each include aluminum.

13. The display device of claim 11, wherein the first connection electrode and the second connection electrode each include a same material as each of the first pad electrode upper layer and the second pad electrode upper layer, and wherein the first connection electrode, the second connection electrode, the first pad electrode upper layer, and the second pad electrode upper layer each include ITO, IZO, and/or ITZO.

14. The display device of claim 11, further comprising:
an external device disposed on the first substrate and comprising a plurality of circuit wires;
a non-conductive layer disposed between the external device and the first substrate and bonding the external device to the first substrate; and
a plurality of conductive balls disposed between the first pad electrode upper layer and the second pad electrode upper layer and the plurality of circuit wires.

15. The display device of claim 14, wherein the plurality of conductive balls electrically connects the plurality of circuit wires to the first pad electrode upper layer and further electrically connects the plurality of circuit wires to the second pad electrode upper layer.

* * * * *